(12) United States Patent
Eldridge et al.

(10) Patent No.: US 8,130,007 B2
(45) Date of Patent: Mar. 6, 2012

(54) PROBE CARD ASSEMBLY WITH CARBON NANOTUBE PROBES HAVING A SPRING MECHANISM THEREIN

(75) Inventors: Benjamin N. Eldridge, Danville, CA (US); John K. Gritters, Livermore, CA (US); Rodney I. Martens, Livermore, CA (US); Alexander H. Slocum, Bow, NH (US); Onnik Yaglioglu, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 153 days.

(21) Appl. No.: 11/872,008

(22) Filed: Oct. 13, 2007

(65) Prior Publication Data

US 2009/0066352 A1    Mar. 12, 2009

Related U.S. Application Data

(60) Provisional application No. 60/829,674, filed on Oct. 16, 2006, provisional application No. 60/938,673, filed on May 17, 2007.

(51) Int. Cl.
*G01R 31/26* (2006.01)

(52) U.S. Cl. .............................. 324/756.03; 324/755.01

(58) Field of Classification Search .................. None
See application file for complete search history.

(56) References Cited

U.S. PATENT DOCUMENTS

| | | | |
|---|---|---|---|
| 5,366,380 A | 11/1994 | Reymond | |
| 5,741,144 A | 4/1998 | Elco et al. | |
| 5,829,128 A | 11/1998 | Eldridge et al. | |
| 5,903,161 A | 5/1999 | Amemiya et al. | |
| 6,020,747 A | 2/2000 | Bahns et al. | |
| 6,031,711 A | 2/2000 | Tennent et al. | |
| 6,184,053 B1 | 2/2001 | Eldridge et al. | |
| 6,232,706 B1 | 5/2001 | Dai et al. | |
| 6,346,189 B1 | 2/2002 | Dai et al. | |
| 6,379,982 B1 | 4/2002 | Ahn et al. | |
| 6,401,526 B1 | 6/2002 | Dai et al. | |
| 6,457,350 B1 | 10/2002 | Mitchell | |
| 6,597,090 B1 | 7/2003 | Mancevski | |
| 6,626,684 B1 | 9/2003 | Stickler et al. | |
| 6,653,208 B2 | 11/2003 | Ahn et al. | |
| 6,709,566 B2 | 3/2004 | Cumings et al. | |
| 6,790,684 B2 | 9/2004 | Ahn et al. | |

(Continued)

FOREIGN PATENT DOCUMENTS

EP    1830367    9/2007

(Continued)

OTHER PUBLICATIONS

U.S. Appl. No. 12/632,428, filed Dec. 7, 2009, Eldridge et al.

(Continued)

*Primary Examiner* — Vinh Nguyen

(74) *Attorney, Agent, or Firm* — Kirton & McConkie

(57) ABSTRACT

Columns comprising a plurality of vertically aligned carbon nanotubes can be configured as electromechanical contact structures or probes. The columns can be grown on a sacrificial substrate and transferred to a product substrate, or the columns can be grown on the product substrate. The columns can be treated to enhance mechanical properties such as stiffness, electrical properties such as electrical conductivity, and/or physical contact characteristics. The columns can be mechanically tuned to have predetermined spring properties. The columns can be used as electromechanical probes, for example, to contact and test electronic devices such as semiconductor dies, and the columns can make unique marks on terminals of the electronic devices.

15 Claims, 44 Drawing Sheets

U.S. PATENT DOCUMENTS

| | | |
|---|---|---|
| 6,791,171 B2 | 9/2004 | Mok et al. |
| 6,800,865 B2 | 10/2004 | Nakayama et al. |
| 6,815,961 B2 | 11/2004 | Mok et al. |
| 6,863,942 B2 | 3/2005 | Ren et al. |
| 6,869,671 B1 | 3/2005 | Crouse et al. |
| 6,870,361 B2 | 3/2005 | Chopra et al. |
| 6,890,506 B1 | 5/2005 | Harutyunyan et al. |
| 6,900,479 B2 | 5/2005 | DeHon et al. |
| 6,933,222 B2 | 8/2005 | Dubin et al. |
| 6,945,827 B2 | 9/2005 | Grube et al. |
| 6,967,013 B2 | 11/2005 | Someya et al. |
| 6,979,244 B2 | 12/2005 | Den et al. |
| 7,012,441 B2 | 3/2006 | Chou et al. |
| 7,057,402 B2 | 6/2006 | Cole et al. |
| 7,082,683 B2 | 8/2006 | Han et al. |
| 7,094,123 B2 | 8/2006 | Oyama et al. |
| 7,132,039 B2 | 11/2006 | Anasawa et al. |
| 7,147,966 B2 | 12/2006 | Ren et al. |
| 7,160,531 B1 | 1/2007 | Jacques et al. |
| 7,189,430 B2 | 3/2007 | Ajayan et al. |
| 7,226,663 B2 | 6/2007 | Jiao et al. |
| 7,242,012 B2 | 7/2007 | Leedy |
| 7,250,188 B2 | 7/2007 | Dodelet et al. |
| 7,251,884 B2 | 8/2007 | Grube et al. |
| 7,258,901 B1 | 8/2007 | Lee et al. |
| 7,349,223 B2 | 3/2008 | Haemer et al. |
| 7,378,328 B2 | 5/2008 | Choi et al. |
| 7,400,159 B2 | 7/2008 | Wang et al. |
| 7,439,731 B2 * | 10/2008 | Crafts et al. ............... 324/158.1 |
| 7,585,548 B2 | 9/2009 | Wang et al. |
| 7,687,981 B2 | 3/2010 | Parsapour |
| 7,710,106 B2 | 5/2010 | Crafts et al. |
| 7,731,503 B2 | 6/2010 | Eldridge |
| 7,777,291 B2 | 8/2010 | Kabir |
| 2003/0010910 A1 | 1/2003 | Colbert et al. |
| 2003/0153965 A1 | 8/2003 | Supronowicz et al. |
| 2003/0165418 A1 | 9/2003 | Ajayan et al. |
| 2003/0179559 A1 | 9/2003 | Engelhardt et al. |
| 2003/0189235 A1 | 10/2003 | Watanabe et al. |
| 2004/0036403 A1 | 2/2004 | Ouo et al. |
| 2004/0106218 A1 * | 6/2004 | Wang et al. ............... 438/15 |
| 2004/0110003 A1 | 6/2004 | Cumings et al. |
| 2004/0113621 A1 | 6/2004 | Naughton |
| 2004/0173506 A1 | 9/2004 | Doktycz et al. |
| 2004/0175850 A1 | 9/2004 | Shimizu et al. |
| 2004/0208788 A1 | 10/2004 | Colton |
| 2004/0211589 A1 | 10/2004 | Chou et al. |
| 2005/0019245 A1 | 1/2005 | Koulikov |
| 2005/0022376 A1 | 2/2005 | Alcoe |
| 2005/0092464 A1 | 5/2005 | Leu et al. |
| 2005/0285116 A1 | 12/2005 | Wang |
| 2006/0028220 A1 | 2/2006 | Malantonio et al. |
| 2006/0071334 A1 | 4/2006 | Kawabata et al. |
| 2006/0073089 A1 | 4/2006 | Ajayan et al. |
| 2006/0103406 A1 | 5/2006 | Kitazawa et al. |
| 2006/0188721 A1 | 8/2006 | Irvin et al. |
| 2006/0197547 A1 | 9/2006 | Chen |
| 2006/0198956 A1 | 9/2006 | Eres |
| 2006/0252853 A1 | 11/2006 | Ajayan et al. |
| 2006/0290343 A1 * | 12/2006 | Crafts et al. ............... 324/158.1 |
| 2007/0004191 A1 | 1/2007 | Gu et al. |
| 2007/0018098 A1 | 1/2007 | Nakayama et al. |
| 2007/0051887 A1 | 3/2007 | Hidaka et al. |
| 2007/0155158 A1 | 7/2007 | Gstrein et al. |
| 2007/0158584 A1 | 7/2007 | Lin |
| 2007/0158768 A1 | 7/2007 | Pilchowski et al. |
| 2007/0164214 A1 | 7/2007 | Choi et al. |
| 2007/0186665 A1 | 8/2007 | Hierold et al. |
| 2007/0213419 A1 | 9/2007 | Cao et al. |
| 2007/0218202 A1 | 9/2007 | Ajayan et al. |
| 2007/0235713 A1 | 10/2007 | Swirbel |
| 2007/0237990 A1 | 10/2007 | Kim |
| 2008/0067494 A1 | 3/2008 | Mammana et al. |
| 2009/0091343 A1 | 4/2009 | Wu et al. |
| 2009/0197484 A1 | 8/2009 | Chen et al. |
| 2011/0018566 A1 | 1/2011 | Crafts et al. |

FOREIGN PATENT DOCUMENTS

| | | |
|---|---|---|
| EP | 1845124 | 10/2007 |
| JP | 2004286570 | 10/2004 |
| WO | WO 00/73204 | 12/2000 |
| WO | WO 2003/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |
| WO | WO 2008/024726 | 2/2008 |

OTHER PUBLICATIONS

Yaglioglu et al., "Conductive Carbon Nanotube Composite Micro-Probes," Advanced Materials (2008), 20, pp. 357-362.

U.S. Appl. No. 11/466,039, filed Aug. 21, 2006, Eldridge et al.

Greene, "Researchers Make Carbon Nanotubes Without Metal Catalyst," MIT News (Aug. 10, 2009) (2 pages).

International Preliminary Report on Patentability PCT/US/07/081423 (Apr. 30, 2009).

U.S. Appl. No. 12/418,438, filed Apr. 3, 2009, Fang et al.

U.S. Appl. No. 12/418,368, filed Apr. 3, 2009, Gritters et al.

U.S. Appl. No. 12/421,805, filed Apr. 10, 2009, Chen et al.

PCT/US/07/81423: International Search Report and Written Opinion of the International Searching Authority.

U.S. Appl. No. 11/466,039, filed Aug. 21, 2006, Eldridge.

Moloni et al., "Sharpened Carbon Nanotube Probes" (University of Wisconsin-Madison) (no date but downloaded from Internet on Sep. 6, 2007).

Pushparaj et al., "Effects of compressive strains on electrical conductivities of a macroscale carbon nanotube block," Applied Physics Letters 91, 153116 (2007).

Yaglioglu et al., "Conductive Carbon Nanotube Composite Micro-Probes," Nanoletters.

Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006).

Andrews et al., "Continuous production of aligned carbon nanotubes: a step closer to commercial realization," Chemical Physics Letters 303 (Apr. 16, 1999), pp. 467-474.

Chen et al., "Nanoscale Molecular-Switch Devices Fabricated by Imprint Lithography", Applied Physics Letters, Mar. 10, 2003, pp. 1610-1612, vol. 82.

Lau et al., "Superhydrophobic Carbon Nanotube Forrests", Nano Letters, Dept. of Chemical Engineering, pp. 1-21, Massachusetts Institute of Technology, Cambridge, MA.

Wei et al., "Growing Pillars of Densely Packed Carbon Nanotubes on Ni-coated Silica", Carbon, 2002, Oct. 23, 2000, pp. 47-51, vol. 40.

Yaglioglu, "Carbon Nanotube Based Electromechanical Probes," Thesis (Massachusetts Institute of Technology Jun. 2007).

* cited by examiner

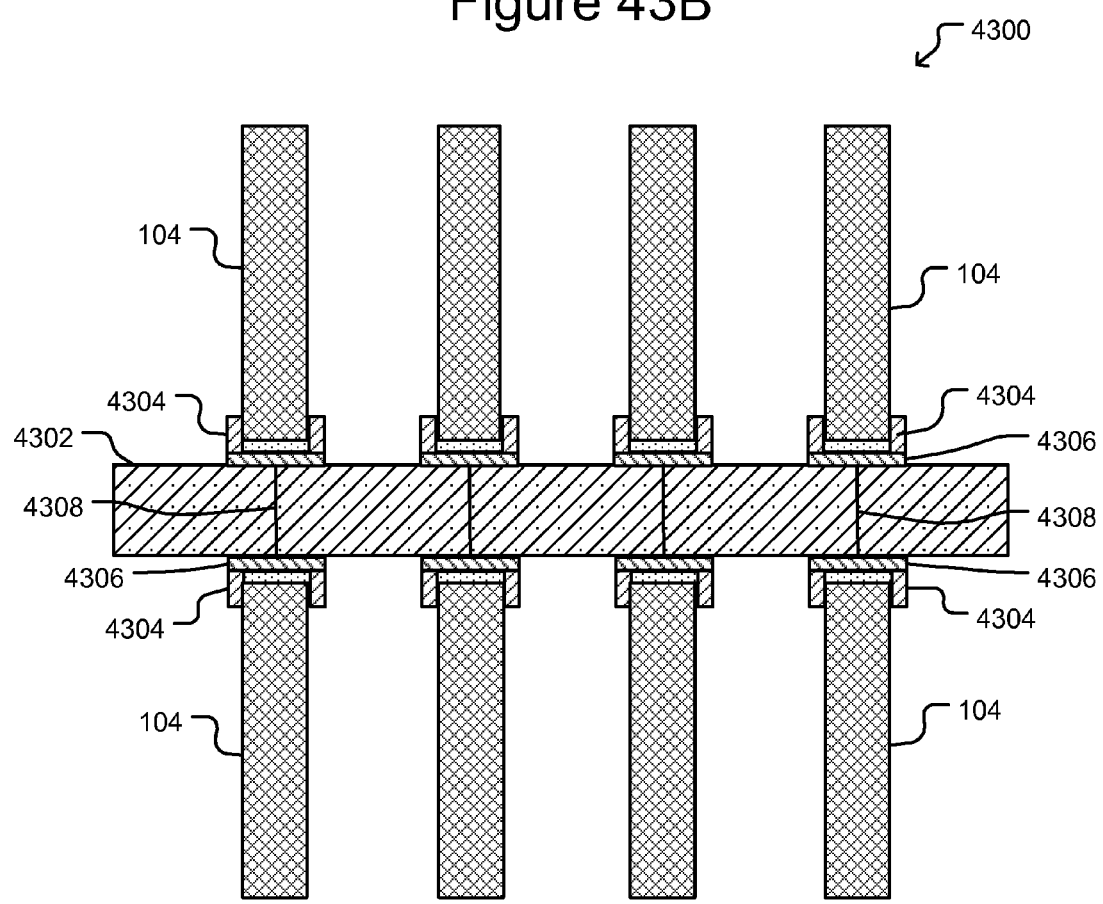

PROBE CARD ASSEMBLY WITH CARBON NANOTUBE PROBES HAVING A SPRING MECHANISM THEREIN

CROSS REFERENCE TO RELATED APPLICATIONS

This application claims priority to U.S. Provisional Patent Application No. 60/829,674 (filed Oct. 16, 2006), and this application also claims priority to U.S. Provisional Patent Application No. 60/938,673 (filed (May 17, 2007).

BACKGROUND

Carbon nanotubes—a material discovered in the early 1990s—have many desirable properties. For example, carbon nanotubes can have desirable mechanical properties such as high stiffness, toughness, and resilience. As another example, carbon nanotubes can have desirable electrical properties such as electrical conductivity. Because of these and/or other properties, carbon nanotubes may be a promising material from which to construct probes for use in such applications as atomic force microscopes (see United States patent application US 2007/0051887). However, such probes are inherently weak in a vertical direction and can be easily deformed past the point of effective use when the probe comes into pressure contact with a surface which causes buckling or deformation the carbon nanotube.

Resilient, compliant, deformable, or elastic probes (whether mechanical or electromechanical) are typically made of materials other than carbon nanotubes have been used in various applications. For example, a group (e.g., an array) of probes can be placed in a pattern that corresponds to a pattern of objects to be probed (e.g., physically contacted) by the probes. Such probes can be electrically conductive and can contact input and/or output terminals of an electronic device (e.g., a semiconductor die or dies) to establish temporary pressure based electrical connections with the electronic device through which test signals can be provided to the electronic device and response signals generated by the electronic device can be sensed. Through such testing, electronic devices can be evaluated to determine whether the devices function properly and/or rate operation of the devices.

Depending on the specific probing application, it can be desirable for such probes to have one or more particular mechanical properties. For example, in some applications, it can be desirable for the probes to be compliant and resilient in response to a force applied to the probes. For example, such a probe can be compliant by compressing, deforming, bending, or otherwise moving in response to a force applied to a contact portion of the probe, and the probe can be resilient by generating a counter force in response to the force applied to the contact portion of the probe and then substantially returning to the original shape, position, or orientation of the probe after the applied force is removed from the contact portion of the probe. It can be desirable in some applications to tune the probes to have particular mechanical properties. Other mechanical properties such as toughness, durability, and consistency through repeated use over an extended period of time can also be desirable. For example, it can be desirable for such probes to withstand repeated compressions over extended periods of time without undergoing substantial changes in mechanical properties.

In addition, if the probing application is electrical, it can be desirable for such probes to have one or more particular electrical properties. For example, in some applications, it may be desirable that electrical probes have a low electrical resistance and/or a high current carrying capacity.

Regardless of whether the probing application is electrical, it can be desirable for the probes to have other desirable properties such as manufacturability. For example, in some applications, there may be a need to form the probes in a pattern (e.g., an array) in which the probes are spaced close to one another (e.g., the pitch or spacing between probes is small). In such applications, it may be desirable for the probes, although spaced close to one another, to be able to compress, deform, bend, or otherwise move in response to forces (e.g., exhibit compliance) applied to the probes without the probes contacting or otherwise interfering with each other. In some applications, it can be desirable to planarize contact portions (e.g., contact tips) of the probes so that the contact portions of all of the probes in the group are located within a specified distance of a special plane. In some applications, it can be desirable for the probes to be able to withstand repeated use at extreme temperatures (e.g., high temperatures or low temperatures). Of course, it can be desirable to be able to efficiently and economically make such probes and/or incorporate such probes into a probing apparatus.

Some embodiments of the invention described below can, in some instances, aid in the production and/or use of probes comprising carbon nanotubes that have one or more of the foregoing desirable mechanical, electrical, manufacturability, or other properties.

SUMMARY

In some embodiments, columns comprising a plurality of vertically aligned carbon nanotubes can be configured as an electromechanical contact structures or probes. In some embodiments, the columns can be grown on a sacrificial substrate and transferred to a product substrate, or the columns can be grown on the product substrate. In some embodiments, the columns can be treated to enhance mechanical properties such as stiffness, electrical properties such as electrical conductivity, and/or physical contact characteristics. In some embodiments, the columns can be mechanically tuned to have predetermined spring properties. In some embodiments, the columns can be used as electromechanical probes, for example, to contact and test electronic devices such as semiconductor dies, and the columns can make unique marks on terminals of the electronic devices.

BRIEF DESCRIPTION OF THE DRAWINGS

FIGS. 43A and 43B illustrates an exemplary interposer that includes spring contact structures that can comprise columns of carbon nanotubes according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1A:
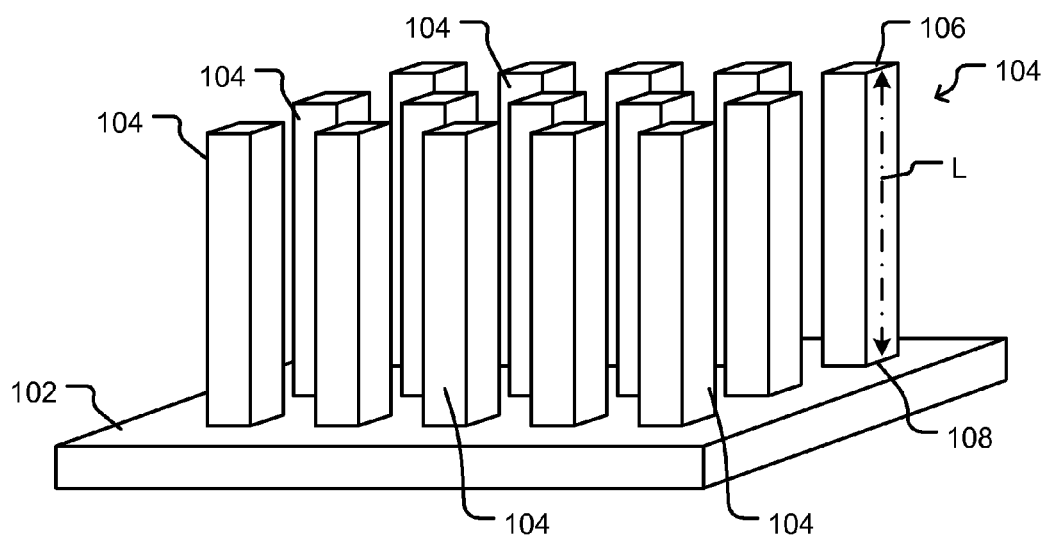
FIG. 1A illustrates exemplary columns of carbon nanotubes on a substrate according to some embodiments of the invention.

FIG. 1A illustrate an exemplary group of columns 104 comprising carbon nanotubes on a substrate 102 according to some embodiments of the invention. (Substrate 102 can be a growth substrate, an intermediate substrate, or a product substrate, and substrate 102 can be a non-limiting example of a wiring substrate or a product substrate.) Fifteen columns 104 are shown on substrate 102, but more or fewer columns 104 can be on substrate 102. Indeed, hundreds or thousands of columns 104 can be on substrate 102. As is known, carbon nanotubes can be fiber-like structures, which can be intertwined in a mass, and columns 104 can comprise an intertwined mass of a plurality of carbon nanotubes. Columns 104 can thus be referred to as carbon nanotube columns.

As is known, an individual carbon nanotube can have a number of attributes including without limitation the following: the number of walls and the thickness of the wall(s) of the carbon nanotube, the diameter of the carbon nanotube, and the chirality (rolling angle) of the carbon nanotube. In addition, a group of carbon nanotubes intertwined to form a structure like columns 104 can have a number of attributes including without limitation the following: the average spacing between individual carbon nanotubes in the group, the average length of the carbon nanotubes in the group, and the alignment or orientation of the carbon nanotubes in the group.

The carbon nanotubes in each of columns 104 are not limited to having any particular number of walls, thickness of the walls, diameter, or chirality, nor are the carbon nanotubes that form a column 104 limited to a particular average spacing between carbon nanotubes, average length, or alignment. Nevertheless, in some embodiments, each column 104 can comprise vertically aligned carbon nanotubes. A column comprising vertically aligned carbon nanotubes can be termed a "vertically aligned" carbon nanotube column. Any of the columns of carbon nanotubes describe herein, including without limitation columns 104, can be vertically aligned carbon nanotube columns.

Figure 1B:
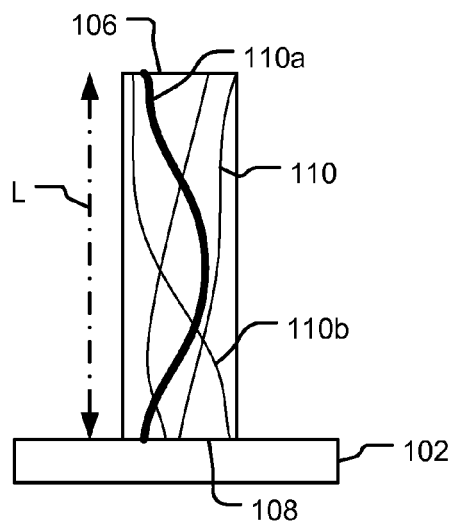
FIGS. 1B and 1C show one of the columns of carbon nanotubes in FIG. 1A.
Figure 1C:
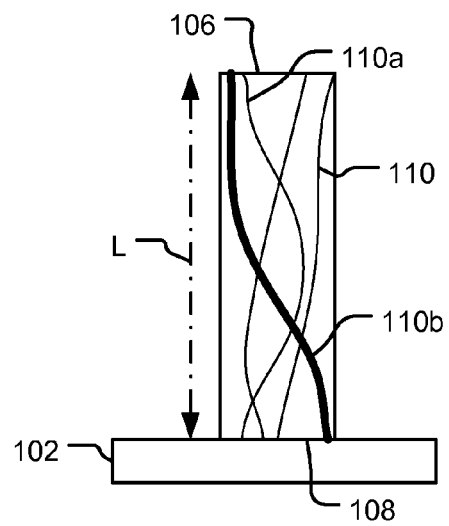

As used herein, a column (e.g., column 104) of carbon nanotubes is "vertically aligned" if most (i.e., 50% or more) of the carbon nanotubes that compose the column form a continuous path along a length of the column that start at one end (e.g., end 108) of the column and end at an opposite end (e.g., end 106). FIGS. 1B and 1C, which illustrate side views of one of columns 104, illustrate examples. In FIGS. 1B and 1C, a few carbon nanotubes 110 that compose a column 104 are illustrated. Column 104 can, however, comprise thousands or hundreds of thousands of such carbon nanotubes 110. As can be seen, the carbon nanotubes 110 that compose a column 104 can bend and/or twist and thus be intertwined one with another. In FIG. 1B, one of the carbon nanotubes 110a is highlighted, and as can be seen, carbon nanotube 110a begins and terminates at the ends 106, 108 of the column 104, and carbon nanotube 110a is continuous between ends 106, 108 (i.e., along a length L of column 104). (End 106 can be a non-limiting example of a base end, a contact end, a first end, or a second end; end 108 can likewise be a non-limiting example of a base end, a contact end, a first end, or a second end.) In FIG. 1C, another of the carbon nanotubes 110b is highlighted, and as can be seen, carbon nanotube 110b also begins and terminates at the ends 106, 108 of the column 104, and carbon nanotube 110b is continuous between ends 106, 108 (i.e., along a length L of column 104). Both carbon nanotubes 110a and 110b are thus "vertically aligned" according to the above definition, and as long as a majority (i.e., at least 50%) of the carbon nanotubes in a column 104 in FIG. 1A are also "vertically aligned," the column 104 can be termed a "vertically aligned carbon nanotube column." In some embodiments, a greater percentage than 50% of the carbon nanotubes in a column 104 can be vertically aligned. For example, in some embodiments, 60%, 70%, 75%, 80%, 90%, 95%, 98%, 99%, or a greater percentage of the carbon nanotubes that compose a column 104 can be vertically aligned. In some embodiments, a single carbon nanotube can comprise a plurality of tubes that are grown directly one atop the other resulting in a continuous path. For example, such tubes can be grown using a fixed catalyst growth method like the exemplary fixed catalyst methods discussed below.

There are a number of processes for growing columns 104, which as mentioned above, can be vertically aligned carbon nanotube columns 104, and any known or future developed process can be used to grow columns 104. A floating catalyst process and a fixed catalyst process are two exemplary, non-limiting processes for growing columns 104. Generally speaking, in the floating catalyst process and the fixed catalyst process, columns 104 can grow on a growth surface in the presence of a source of carbon and a catalyst. Moreover, as mentioned, the columns 104 can be grown as vertically aligned carbon nanotube columns.

Figure 2:
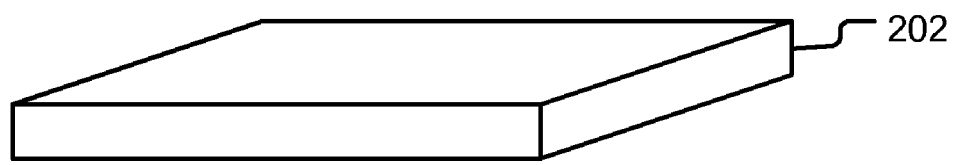
FIGS. 2-5B illustrate an exemplary floating catalyst process of making columns of carbon nanotubes according to some embodiments of the invention.
Figure 3:
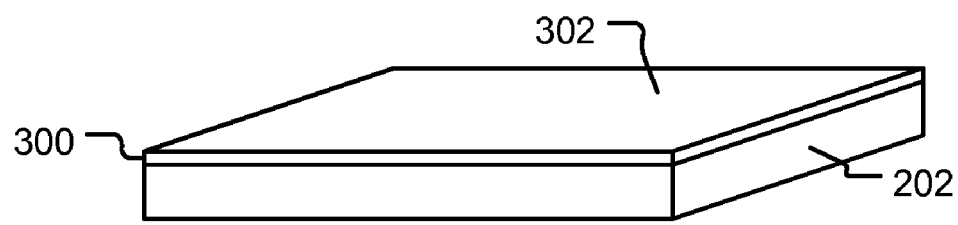

FIGS. 2-5 illustrate a non-limiting example of a floating catalyst process of growing columns like columns 104 according to some embodiments of the invention. As shown in FIG. 2, a substrate 202 can be provided. The substrate 202 can be any structure suitable for supporting the columns. Non-limiting examples of suitable substrates 202 include a semiconductor wafer, a ceramic substrate, a substrate comprising an organic material, a substrate comprising an inorganic material, or any combinations thereof. As shown in FIG. 3, a growth material 300 can be deposited on the substrate 202, or alternatively, the substrate 202 can be provided with growth material 300. As will be seen, a surface 302 of growth material 300 can be a growth surface 302 on which carbon nanotube columns can be grown. Growth material 300 can be any material suitable for growing carbon nanotube columns. For example, material 300 can be any material with an oxide film or on which an oxide film can be formed so that growth surface 302 comprises an oxide. For example, growth material 300 can be a silicon material, and growth surface 302 can comprise an oxide film on the silicon material. Elements 300 and 302 in FIG. 3 can thus be distinct layers. Moreover, substrate 202 can be a silicon substrate (e.g., a blank silicon wafer), in which case, substrate 202 and growth material 300 can be the same layer (i.e., the silicon substrate). Growth material 300 is not limited to materials with an oxide film. For example, growth material 300 can be quartz.

Figure 4A:
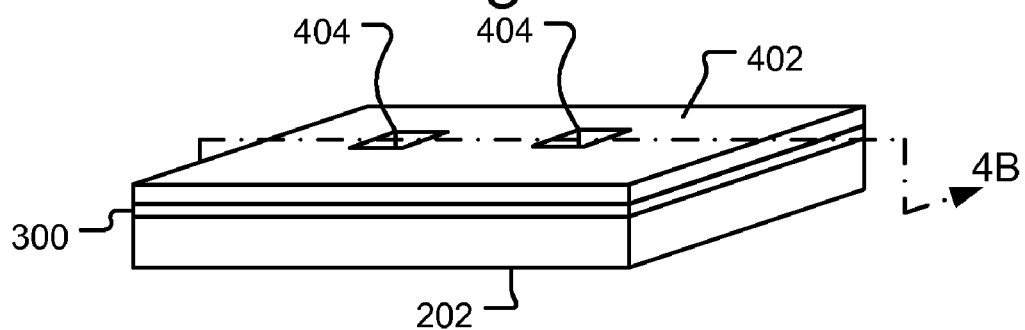
Figure 4B:
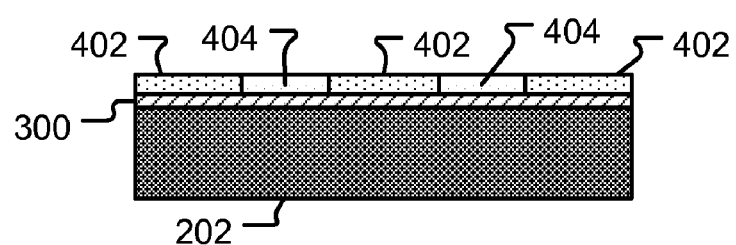

As shown in FIGS. 4A and 4B (which show respectively a perspective view and a cross-sectional side view), a masking layer 402 can be deposited onto the growth surface 302, and openings 404 can be formed in the masking layer 402 exposing selected areas of the growth surface 302. As will be seen, carbon nanotube columns (502 in FIG. 5) can be grown on the areas of the growth surface 302 exposed through openings 404. Openings 404 can thus be in locations and patterns that correspond to desired locations and cross-sectional shapes of the carbon nanotube columns to be grown. The masking layer 402 can comprise any material or materials that can be deposited over growth surface 302 and have openings 404. For example, masking layer 402 can comprise a photo reactive material (e.g., a photo resist material) that can be deposited in a blanket layer onto growth surface 302, after which selected portions of the photo reactive material can be cured by exposed to light and the uncured portions of the material removed to form openings 404. Other non-limiting examples of suitable materials for masking layer 402 include any material that can be deposited in a pattern that includes openings 404 or deposited and then patterned to have openings 404. Gold is a non-limiting example of such a material.

Although FIG. 4A and its accompanying text and other Figures and their accompany text elsewhere in this description illustrate a square type cross-section, the square type cross section is used simply for ease of description. Other cross sections are equally possible and specifically contemplated. For example, circular, ring (or doughnut), triangular, as well as other cross sectional shapes can also be used.

Figure 5A:
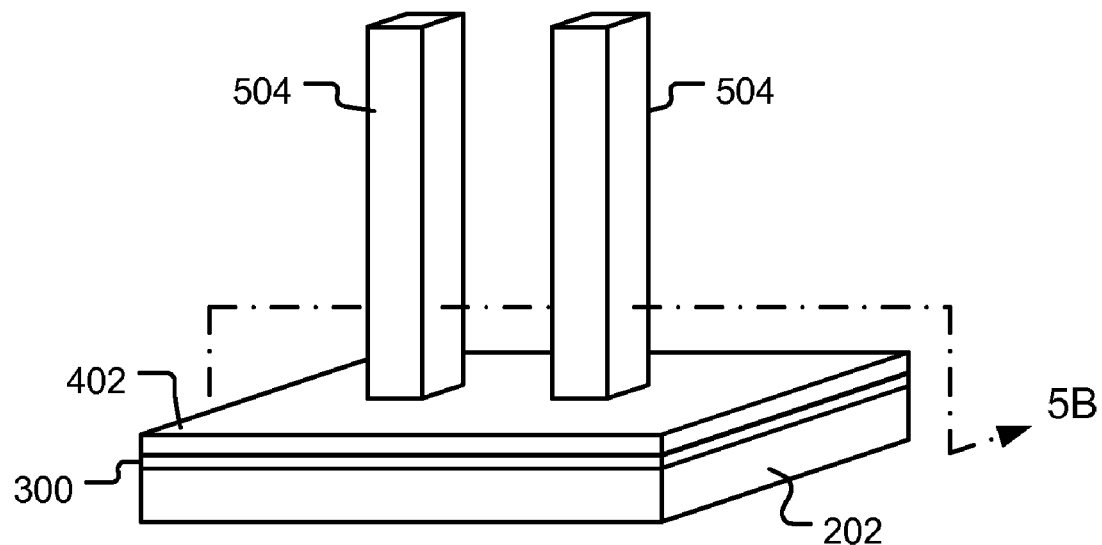
Figure 5B:
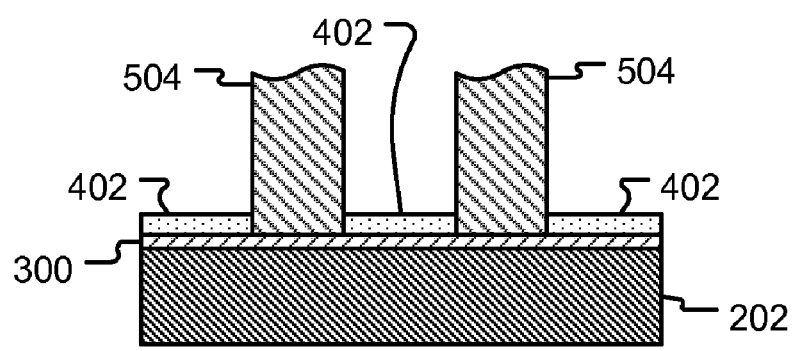

As shown in FIGS. 5A and 5B (which show respectively a perspective view and a cross-sectional side view), carbon nanotube columns 504 can be grown on areas of the growth surface 302 exposed through openings 404. The columns 504 can be grown by providing materials (e.g., a gas) comprising a catalyst and a source of carbon in the presence of proper ambient conditions. For example, substrate 202 with growth surface 302 and masking layer 402 can be placed in an interior of an enclosure such as a furnace (not shown), and the interior of the enclosure can be heated and a gas comprising a catalyst and a source of carbon can be introduced (e.g., pumped) into the interior of the enclosure. The specific catalyst material, carbon source material, and any other materials and the concentrations and mixtures of those materials as well as the specific ambient conditions (e.g., temperature) can be referred to as a "recipe," and any recipe suitable for growing carbon nanotubes on growth surface 302.

The following is a non-limiting, exemplary recipe that can be used to grow columns 504. Substrate 202 can be placed in a furnace (not shown), which can be heated to about 750° Celsius. A gas comprising xylene ($C_8H_{10}$) as a carbon source and ferrocene ($Fe(C_5H_5)_2$) as a catalyst can be mixed with a carrier gas (e.g., argon or another generally inert gas) and introduced (e.g., pumped) into the furnace (not shown). In some embodiments, the ratio of ferrocene to xylene mixed with the carrier gas can be about one gram of ferrocene per one hundred milliliters of xylene, and the ferrocene/xylene mixture can be mixed with the carrier gas at a temperature of about 150° Celsius at a rate of about 6 milliliters per hour. The foregoing recipe can produce columns 504 that are vertically aligned columns. As mentioned, the foregoing recipe is exemplary only, and other materials comprising a catalyst and a source of carbon can be utilized. Moreover, the growth surface 302 can be exposed to the foregoing catalyst and source of carbon at temperatures other than 750° Celsius.

Regardless of the specific recipe used, the exposure of the growth surface 302 to materials comprising a catalyst and a source of carbon at a particular temperature can cause columns 504 to grow from the areas of the growth surface 302 exposed through openings 404 in masking layer 402 as generally shown in FIGS. 5A and 5B. (Although two columns 504 are shown growing from substrate 202, more or fewer columns 504 can be grown from substrate 202.) As mentioned, columns 504 can be vertically aligned carbon nanotube columns. Columns 504 can be an example of columns 104 in FIG. 1A, and substrate 202 can be an example of substrate 102. Thus, any reference herein to columns 104 can include columns 504 as examples of columns 104, and any reference herein to substrate 102 can include substrate 202 as an example of substrate 102. The process illustrated in FIGS. 2-5B is thus one exemplary way in which columns 104 can be grown.

Figure 6:
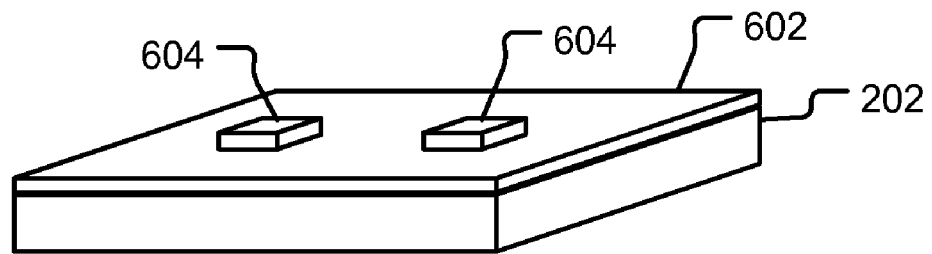
FIGS. 6 and 7 illustrate an exemplary fixed catalyst process of making columns of carbon nanotubes according to some embodiments of the invention.
Figure 7:
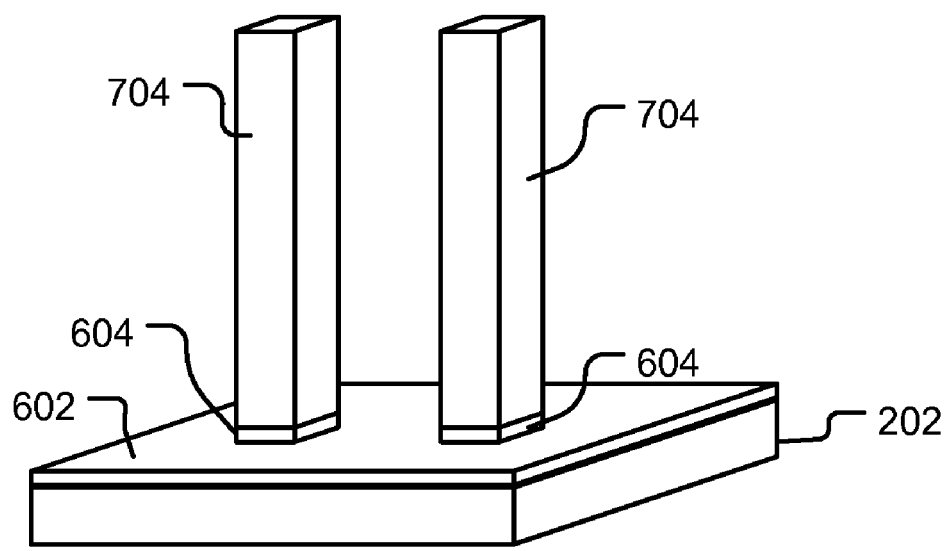

FIGS. 6 and 7 illustrate a non-limiting example of a fixed catalyst process of growing columns like columns 104 according to some embodiments of the invention. Initially, a substrate 202 can be provided as in FIG. 2 above. As shown in FIG. 6, a buffer layer 602 can be deposited on substrate 202, and a patterned catalyst layer 604 can be formed on the buffer layer 602. Although not shown in FIGS. 6 and 7, buffer layer 602 can also be patterned. For example, buffer layer 602 can be patterned to have generally the same or similar pattern as catalyst layer 604. The catalyst layer 604 can comprise catalyst material that, as generally discussed above, can cause growth of carbon nanotubes (which can be vertically aligned) in the presence of a source of carbon. The buffer layer 602 can provide a buffer between the substrate 202 and the catalyst layer 604. The buffer layer 602 can be any material that does not appreciably react with the catalyst material and/or the material that is the source of carbon. Aluminum oxide ($Al_2O_3$) is a non-limiting example of a suitable buffer layer 602. Catalyst layer 604 can comprise a material that, in the presence of a source of carbon, causes growth of carbon nanotubes. Catalyst layer 604 can be formed by depositing catalyst material only on selected areas of buffer layer 602. Alternatively, catalyst layer 604 can formed by depositing catalyst material as a blanket layer of material on buffer layer 602 and then removing selected portions of the deposited catalyst material, leaving the catalyst material in a pattern and shapes that correspond to desired locations and cross-sectional shapes of the carbon nanotube columns to be grown on the catalyst layer 604 (e.g., as shown in FIG. 6).

As shown in FIG. 7, carbon nanotube columns 704 can be grown on the patterned catalyst layer 604. Columns 704 can be grown by providing a material (e.g., a gas) comprising a source of carbon in the presence of proper ambient conditions. For example, substrate 202 with buffer layer 602 and catalyst layer 604 (as shown in FIG. 6) can be placed in an interior of an enclosure such as a furnace (not shown), and the interior of the enclosure can be heated and a gas comprising a source of carbon can be introduced (e.g., pumped) into the interior of the enclosure. The specific material that composes the catalyst layer 604, the specific material that composes the source of carbon, and any other materials and the concentrations and mixtures of those materials as well as the specific ambient conditions (e.g., temperature) can be referred to as a "recipe," and any recipe suitable for growing carbon nanotubes on catalyst layer 604 can be used to grow columns 704.

The following is an exemplary, non-limiting recipe that can be used to grow columns 704. The catalyst layer 604 can comprise any transition metal. For example, the catalyst layer 604 can comprise iron (Fe). For example, the catalyst layer can comprise a layer of iron (Fe), and buffer layer 602 can comprise aluminum oxide ($Al_2O_3$). In some embodiments, the thickness of an iron (Fe) film to a an aluminum oxide ($Al_2O_3$) film can be about 1.2 parts of iron (Fe) to 10 parts of aluminum oxide ($Al_2O_3$). Substrate 202 can be placed in a furnace (not shown), which can be heated to about 750° Celsius, and a hydrocarbon gas can be introduced into the furnace. Under such conditions, the catalyst layer 604 can catalyze the growth of carbon nanotubes on the patterned catalyst layer 604 from carbon in the hydrocarbon gas. In some embodiments, after the substrate 202 is placed in the furnace (not shown), the furnace can be operated as follows. For about 10 minutes, while the furnace is at a temperature of about 0° Celsius, an inert gas (e.g., argon) can be pumped through the furnace at a flow rate of about 400 standard cubic centimeters per minute (sccm). Then, for about 15 minutes, while the temperature in the furnace (not shown) is changed from 0° Celsius to 750° Celsius, and thereafter for about 10 minutes while the temperature is maintained at 750° Celsius, the inert gas can continue to be pumped through the furnace at a flow rate of about 400 sccm. Thereafter, for about 5 minutes, while the temperature is maintained at about 750° Celsius, a gas containing hydrogen $H_2$ can be mixed with the inert gas flowing through the furnace (not shown) at about 400 sccm. For example, the gas containing hydrogen can be $H_2$/Ar in a ratio of about 40 parts of $H_2$ to about 15 parts of Ar. Thereafter, a source of carbon can be added to the inert gas flowing through the furnace while maintaining the furnace at 750° Celsius. For example, the source of carbon can be a gas comprising $C_2H_4/H_2$/Ar in a ratio of about 10 parts of $C_2H_4$, 40 parts of $H_2$, and 10 parts of Ar, which can result in the growth of carbon nanotubes, as shown in FIG. 7, on catalyst layer 604 from carbon in the gas. The columns 704 can grow from catalyst layer 604 as vertically aligned carbon nanotube columns. As mentioned, the foregoing recipe is exemplary only, and other materials can comprise the catalyst layer 604, and a different source of carbon can be utilized. Moreover, the catalyst layer 604 can be exposed to the foregoing source of carbon at temperatures other than 750° Celsius. Moreover, different gas mixtures, flow rates, and time periods can be used.

Regardless of the specific recipe used, the exposure of the catalyst layer 604 to a source of carbon at a particular temperature can cause columns 704 to grow from the catalyst layer 604 as generally shown in FIG. 7. (Although two columns 704 are shown growing from substrate 202, more or fewer columns 704 can be grown from substrate 202.) The columns 704 can be vertically aligned carbon nanotube columns. Columns 704 can be an example of columns 104 in FIG. 1, and substrate 202 can be an example of substrate 102. Thus, any reference herein to columns 104 can include columns 704 as examples of columns 104, and any reference herein to substrate 102 can include substrate 202 as an example of substrate 102. The process illustrated in FIGS. 6 and 7 is thus another exemplary way in which columns 104 can be grown.

Figure 8:
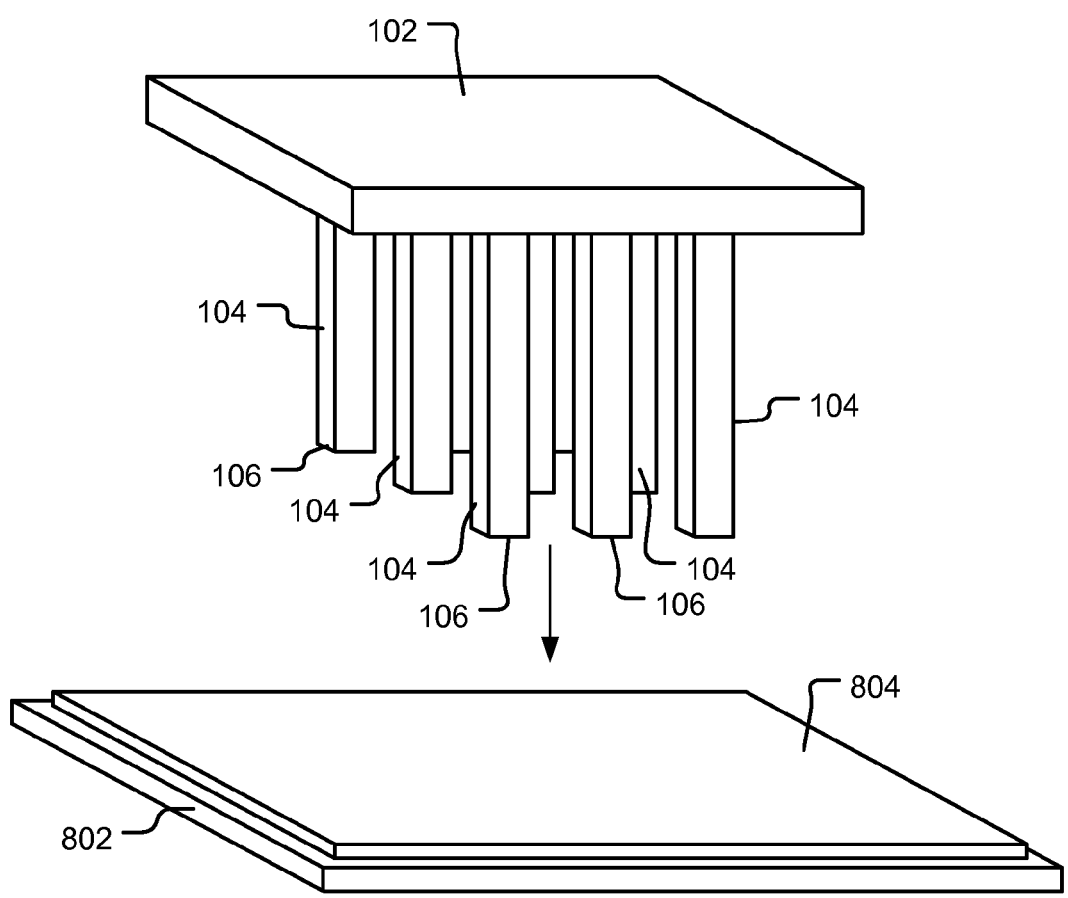
FIGS. 8 and 9 illustrate an exemplary process of transferring columns of carbon nanotubes from a sacrificial substrate to another substrate according to some embodiments of the invention.
Figure 9:
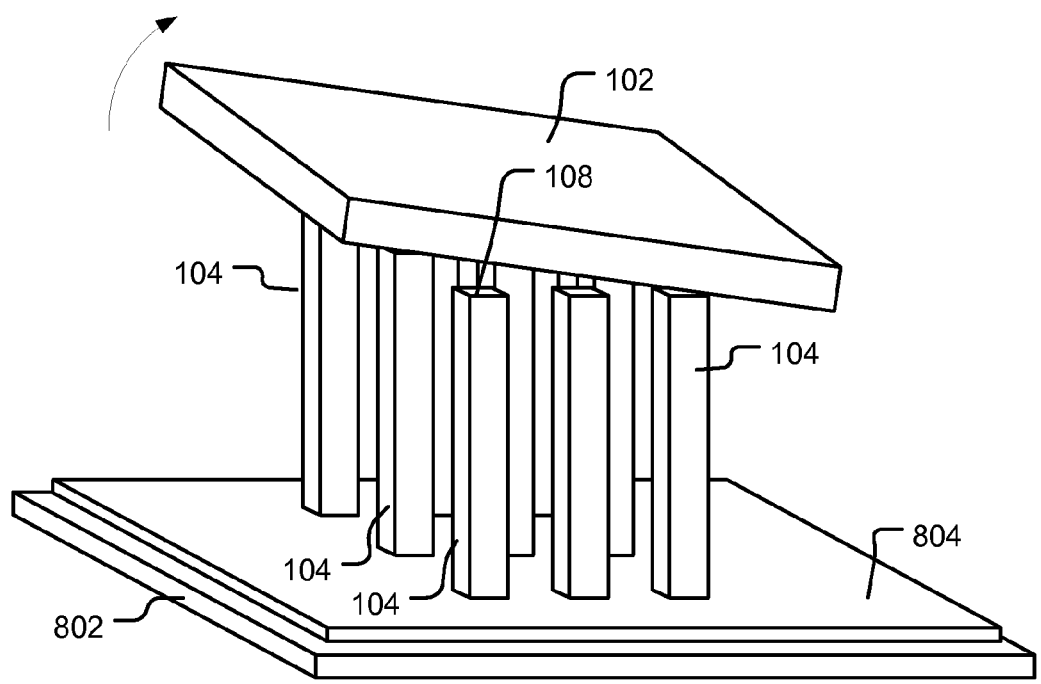

Regardless of the process—whether floating catalyst, fixed catalyst, or another process by which columns 104 are grown—used to grow columns 104, the substrate on which the columns 104 are grown can be all or a portion of the product substrate on which the columns 104 are to be used in a final application. Alternatively, the substrate on which the columns 104 are grown can be a sacrificial substrate from which the columns can be transferred to an intermediate substrate or a product substrate. The "growth substrate" (i.e., the substrate on which the columns are grown) can thus be all or a portion of a product substrate or a sacrificial substrate. If the columns 104 are grown on a sacrificial substrate, the columns can be transferred to an intermediate substrate or product substrate in any suitable manner. FIGS. 8 and 9 illustrate a non-limiting exemplary process of transferring columns 104 to another substrate.

FIG. 8 illustrates substrate 102 with columns 104 grown on substrate 102, for example, in accordance with one of the processes shown in FIGS. 2-5B or FIGS. 6 and 7. As shown in FIGS. 8 and 9, ends 106 of columns 104 can be brought into contact with an adhesive 804 (e.g., an adhesive material or a material comprising an adhesive) deposited on a substrate 802 to which the columns 104 are being transferred. Adhesive 804 can be, for example, an epoxy, which can be a curable epoxy. As mentioned, substrate 802 can be a product substrate on which the columns 104 will be used in their final application, or substrate 802 can be an intermediate substrate from which the columns 104 will later be transferred. (Substrate 802 can be a non-limiting example of a wiring substrate.) As shown in FIG. 9, once ends 106 (see FIG. 8) of columns 104 are adhered to substrate 802 by adhesive 804, the substrate 102 can be peeled away or otherwise removed from columns 104.

Adhesive 804 can be any material that adheres ends 106 of columns 104. In some embodiments, adhesive 804 can be a material that bonds ends 106 of columns 104 to substrate 802 with a greater adhesive strength than columns 104 are attached to substrate 102. In some embodiments, adhesive 804 can be a curable material that, while in an uncured state, can be in a generally liquid or semi-liquid or otherwise flowable or semi-flowable state. Ends 106 of columns 104 can be held in contact with adhesive 804 while the adhesive is cured. Alternatively or in addition, adhesive 804 can be electrically conductive. For example, adhesive 804 can include electrically conductive materials. Non-limiting examples of suitable adhesives 804 include epoxies such as electrically conductive epoxies.

Figure 10:
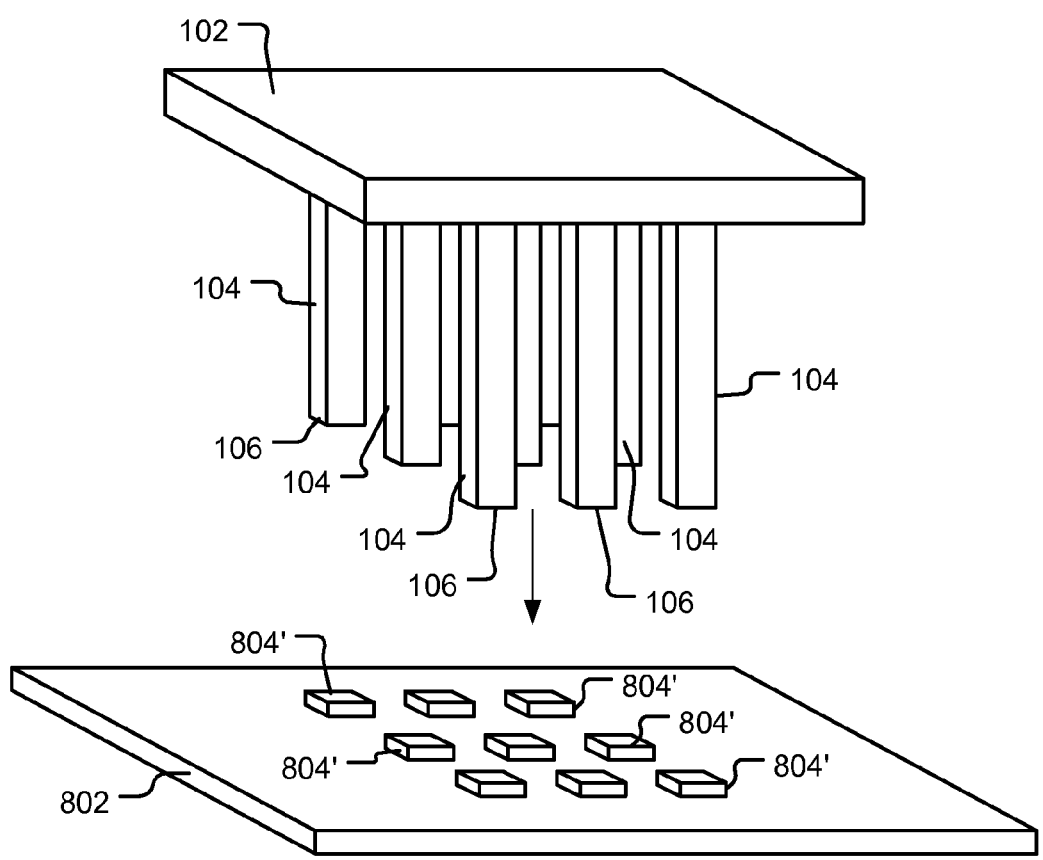
FIG. 10 illustrates another exemplary process of transferring columns of carbon nanotubes from a sacrificial substrate to another substrate according to some embodiments of the invention.

The transfer process shown in FIGS. 8 and 9 is exemplary only, and many variations are possible. FIG. 10 illustrates a non-limiting variation. As shown in FIG. 10, adhesive 804 (see FIG. 8) can be patterned into deposits 804' of the adhesive 804. For example, adhesive 804 can be selectively deposited only in the pattern of deposits 804' shown in FIG. 10. Alternatively, adhesive 804 can be deposited in a blanket layer as shown in FIG. 8, and selected portions of the adhesive 804 can be removed, leaving the deposits 804' of adhesive 804 shown in FIG. 10. As shown in FIG. 10, the deposits 804' of adhesive 804 can be in a pattern that corresponds to the pattern of ends 106 of columns 104, and ends 106 of columns 104 can be brought into contact with the deposits 804' of adhesive 804. Otherwise, the transfer of columns 104 to substrate 802 in FIG. 10 can be like the transfer of columns 104 to substrate 802 as shown in FIGS. 8-9 and discussed above. Although shown as square-like, the pattern of deposits 804' can be patterns other than squares (e.g., circles).

Still further variations of the exemplary transfer process illustrated in FIGS. 8 and 9 are possible. For example, after ends 106 of columns 104 are adhered to adhesive 804 as shown in FIG. 9 and, if needed, adhesive 804 is cured, portions of adhesive 804 can be removed from substrate 802. For example, substantially all of the adhesive 804 except for the adhesive between an end 106 of a column 104 and substrate 802 can be removed.

Figure 11A:
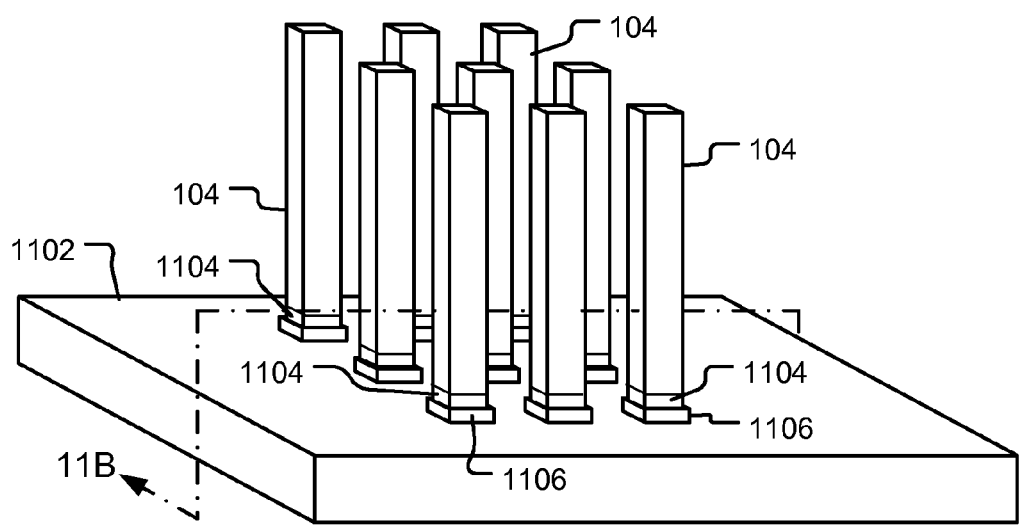
FIGS. 11A and 11B illustrate columns of carbon nanotubes on a wiring substrate according to some embodiments of the invention.
Figure 11B:
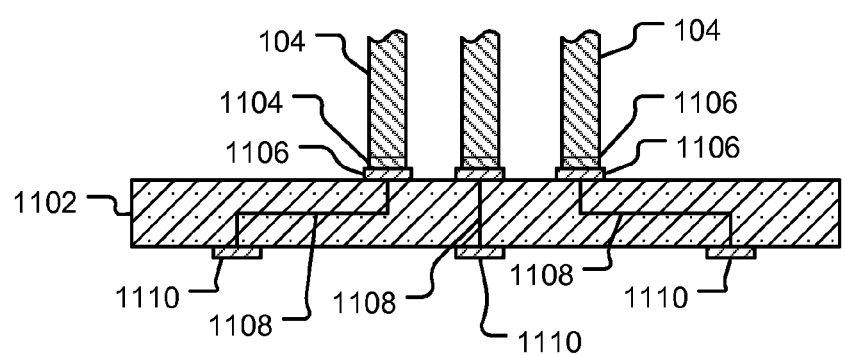

A process of transferring columns 104 can include transferring the columns 104 to an electronic device in which the columns 104 can be electrically conductive interconnection structures (e.g., spring probes or other types of spring contact structures) that are attached and electrically connected to an electrical terminal, trace, or other conductive element on the electronic device. FIGS. 11A and 11B (which show respectively a perspective view and a cross-sectional side view) illustrate a non-limiting example.

As shown in FIGS. 11A and 11B, columns 104 can be attached, for example, a conductive adhesive 1104, to terminals 1106 (or other electrical elements) of a wiring substrate 1102 (which can be a product substrate), which can include internal wiring 1108 (e.g., electrically conductive traces and/or vias) to other terminals 1110 and/or electrical elements (not shown) such as circuit elements (e.g., integrated circuits, resistors, capacitors, transistors, etc.) (not shown). (Wiring 1108 can be non-limiting examples of electrical connections.) Wiring substrate 1102 can be or can be part of an electronic device (not shown) in which the columns 104 are to be used as resilient interconnection structures such as spring probes or other types of spring contact structures. Wiring substrate 1102 can be, for example, a wiring substrate such as a printed circuit board or a multiplayer ceramic wiring substrate. Additionally, wiring substrate 1102 can be a semiconductor die into which an electric circuit is integrated. Additionally, wiring substrate 1102 can be other types of substrates to which the columns can be attached (e.g., a semiconductor wafer). Moreover multiple wiring substrates 1102 can be combined in various ways with other wiring substrates 1102 (such as mounted or adhered to a holding or support structure) to form a composite wiring or product substrate (not shown).

There are many ways in which columns 104 can be attached to terminals 1104. For example, substrate 802 in FIGS. 8-10 can be a sheet of conductive material (e.g., a conductive metal such as copper). Prior to attachment of columns 104 to substrate 802, for example as shown in FIGS. 8 and 9 or FIG. 10, substrate 802 could have been attached to wiring substrate 1102. For example, substrate 802 can initially have been an outer, conductive layer of wiring substrate 1102. After columns 104 are attached to substrate 802 as shown in FIG. 9 or FIG. 10, portions of the substrate 802 can be removed (e.g., by etching), leaving terminals 1106, which can thus be remnants (or unremoved portions) of substrate 802. In such a case, adhesive 1104 can be remnants of adhesive 804 in FIGS. 8 and 9 or deposits 804' of adhesive 804 in FIG. 10. Alternatively, substrate 802 can be attached to wiring substrate 1102 after columns 104 are attached to substrate 802 as shown in FIGS. 8 and 9 or FIG. 10, and then selective portions of substrate 802 can be removed to form terminals 1106 as discussed above.

As yet another alternative, columns 104 can be transferred to terminals 1104 of wiring substrate 1102 generally as shown in FIG. 10. For example, substrate 802 in FIG. 10 can be replaced with wiring substrate 1102, and the deposits 804' of adhesive 804 can be on terminals 1106 of wiring substrate 1102. (Nine terminals 1106 are shown but there can be more or fewer.) Ends 106 of columns 104 can then be brought into contact with the deposits 804' of adhesive 804 and substrate 102 peeled away from columns 104 as discussed above. If adhesive 804 is a curable material, deposits 804' can be cured before substrate 102 is peeled away from columns 104.

Figure 12:
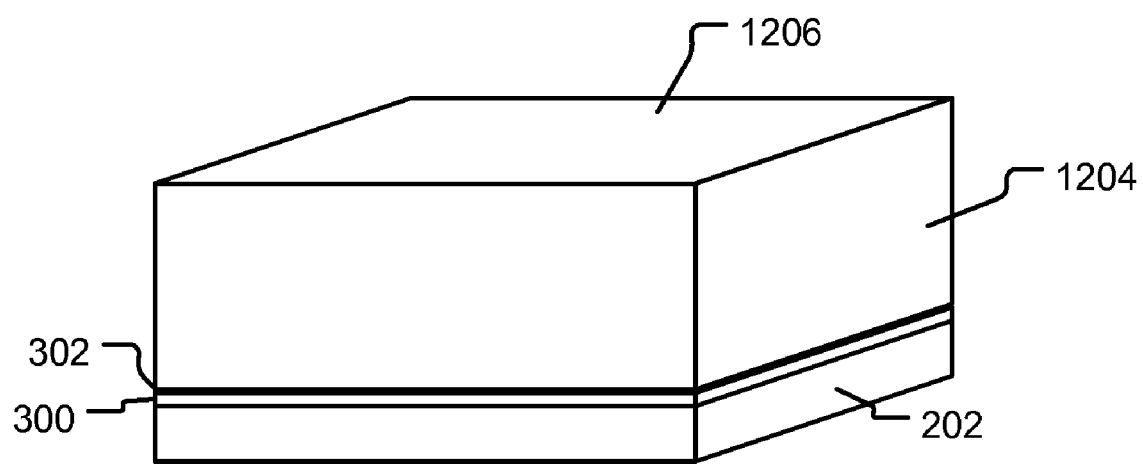
FIGS. 12-14 illustrate an exemplary process of making columns of carbon nanotubes in which the process includes transferring the columns to a substrate according to some embodiments of the invention.
Figure 13:
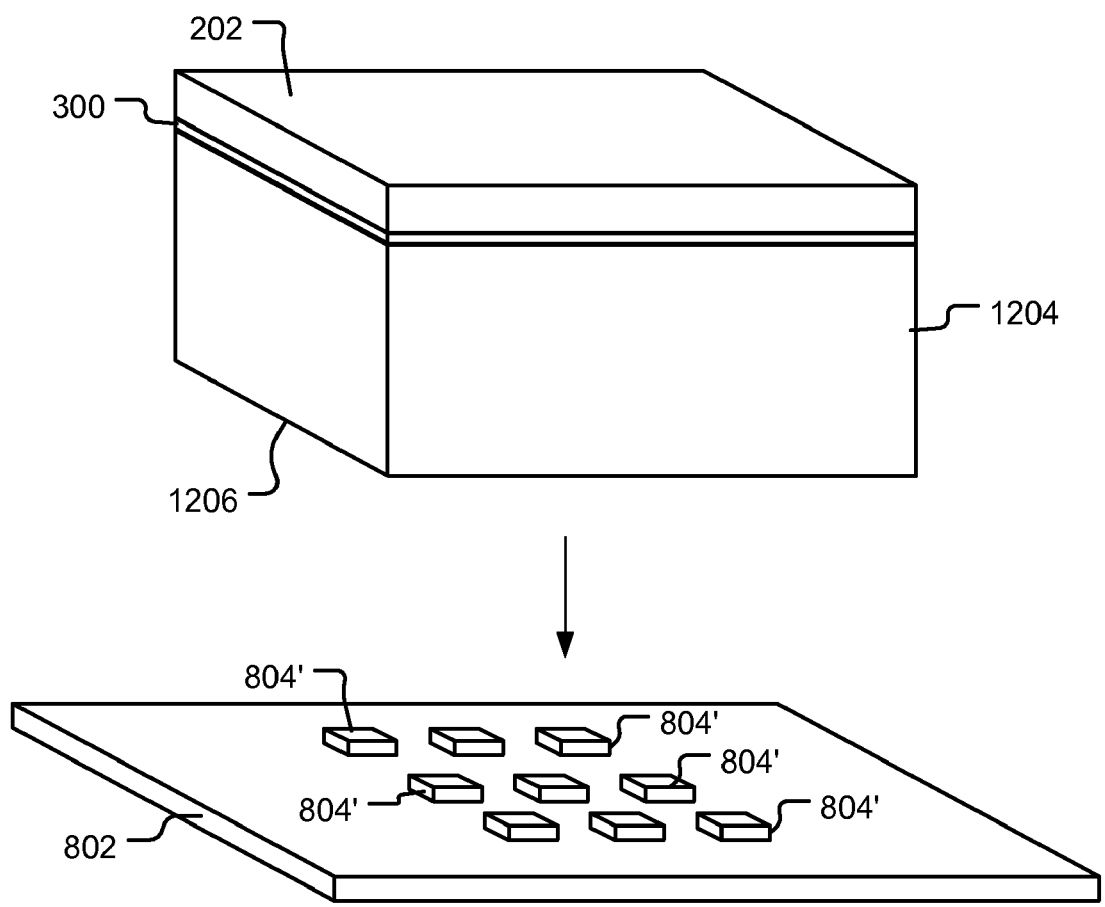
Figure 14:
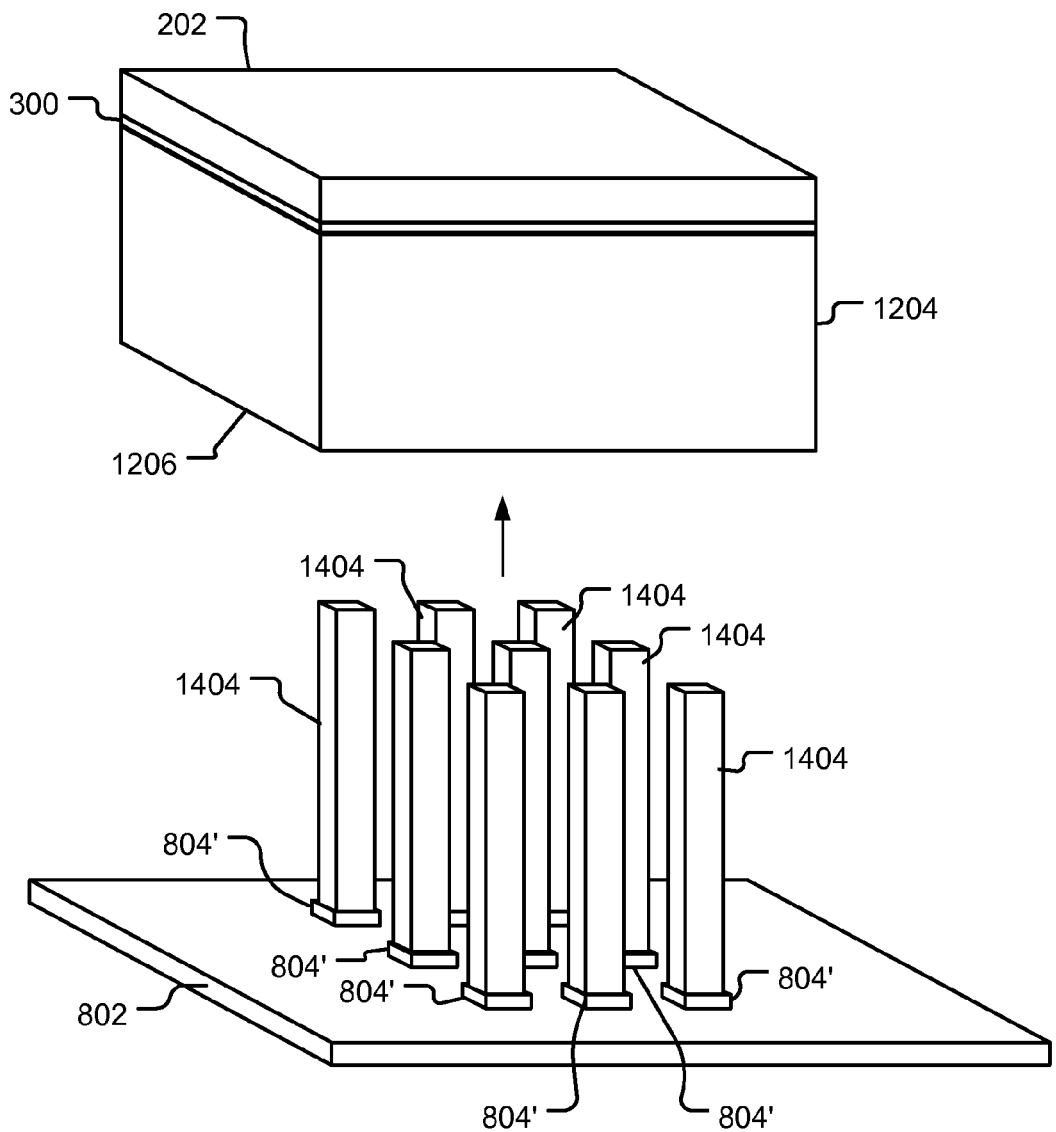

Referring again to FIGS. 1-10, the processes of making columns 104 illustrated in FIGS. 2-7 and the processes of transferring columns 104 to another substrate illustrated in FIGS. 8-11B are exemplary only, and many variations are possible. FIGS. 12-14 illustrate some exemplary variations.

FIG. 12 illustrates substrate 202 with growth material 300 having a growth surface 302 as generally shown in FIG. 3. As shown in FIG. 12, a mass (e.g., a continuous film or a continuous forest) of carbon nanotubes 1204 can be grown on the growth surface 302. For example, carbon nanotubes can be grown in the same way that columns 504 are grown in FIGS. 5A and 5B as discussed above except masking layer 402 is not included, and the exposed area of growth surface 302 is not limited to openings 404 in masking layer 402. Rather, carbon nanotubes can grow from substantially all of the growth surface 302, producing the mass of carbon nanotubes 1204 shown in FIG. 12. The carbon nanotubes that form mass 1204 can be vertically aligned, and mass 1204 can thus be a vertically aligned carbon nanotube mass.

Mass of carbon nanotubes 1204 can, alternatively, be grown using other methods, which can include, for example, a fixed catalyst method such as the exemplary fixed catalyst method illustrated in FIGS. 6 and 7. In such a case, growth material 300 in FIGS. 12-14 can be replaced with a buffer layer like buffer layer 602 and a catalyst layer like catalyst layer 604 shown in FIG. 6 except that the catalyst layer can 604 can be a continuous blanket layer. Carbon nanotubes can then be grown from the catalyst layer as generally discussed above with respect to FIG. 7, which can produce the mass of carbon nanotubes 1204.

As shown in FIG. 13, an end 1206 of the mass of carbon nanotubes 1204 can be brought into contact with deposits 804' of adhesive 804 on substrate 802 of FIG. 10. Portions of the end 1206 of the mass of carbon nanotubes 1204 can thus be adhered to substrate 802 by the deposits 804' of adhesive on substrate 802. The deposits 804' of adhesive 804 can adhere to the mass of carbon nanotubes 1204 with greater adhesive strength than the mass of carbon nanotubes 1204 is adhered to substrate 202. As shown in FIG. 14, as the mass of carbon nanotubes 1204 is moved away from the substrate 802, columns 1404 of carbon nanotubes can be pulled out of and thus break away from the mass of carbon nanotubes 1204. The columns 1404 can correspond to the portions of the mass of nanotubes 1204 adhered to the substrate 802 by the deposits 804' of adhesive 804. Although nine columns 1404 are shown in FIG. 14, more or fewer columns 1404 can be pulled from mass 1204.

The process illustrated in FIGS. 12-14 is thus another exemplary process of making columns 104 in FIG. 1, and columns 1404 can thus be an example of columns 104. Substrate 802 can be an example of substrate 102. Thus, any reference herein to columns 104 can include columns 1404 as examples of columns 104, and any reference herein to substrate 102 can include substrate 802 as an example of substrate 102. Columns 1404 can be attached to terminals 1106 in FIGS. 11A and 11B in any manner discussed above with respect to FIGS. 11A and 11B.

Although the examples illustrated in FIGS. 2-10 and 12-14 illustrate growth of columns 504 or 704 or 1404 (which are grown as part of mass 1204) on a sacrificial substrate 202, carbon nanotube columns like columns 104 can alternatively be grown on a product substrate (e.g., the substrate on which the columns will be used in their final application.) FIGS. 15A-16B illustrate an example in which columns 1604 of carbon nanotubes (which can be vertically aligned carbon nanotube columns) can be grown on a wiring substrate 1502 (which can be a product substrate).

Figure 15A:
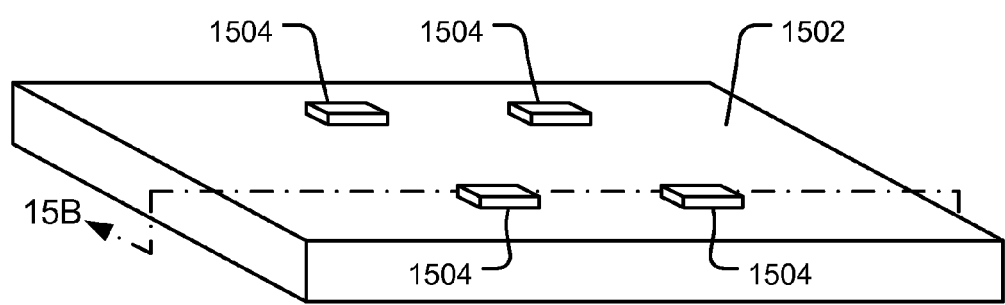
FIGS. 15A-16 illustrate an exemplary process of growing columns of carbon nanotubes on a wiring substrate, anchoring the columns to the wiring substrate, and/or electrically connecting the columns to the wiring substrate according to some embodiments of the invention.
Figure 15B:
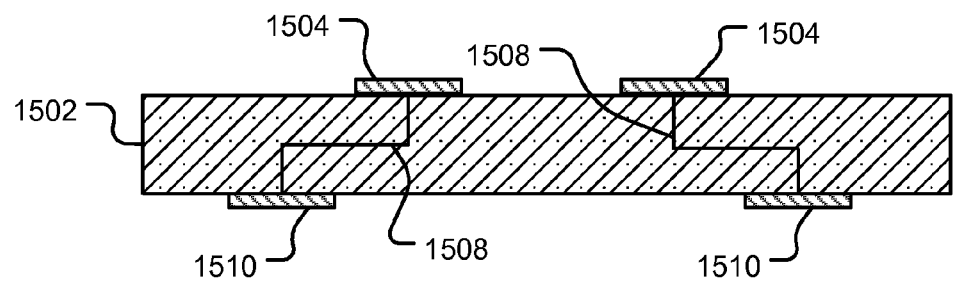
Figure 16A:
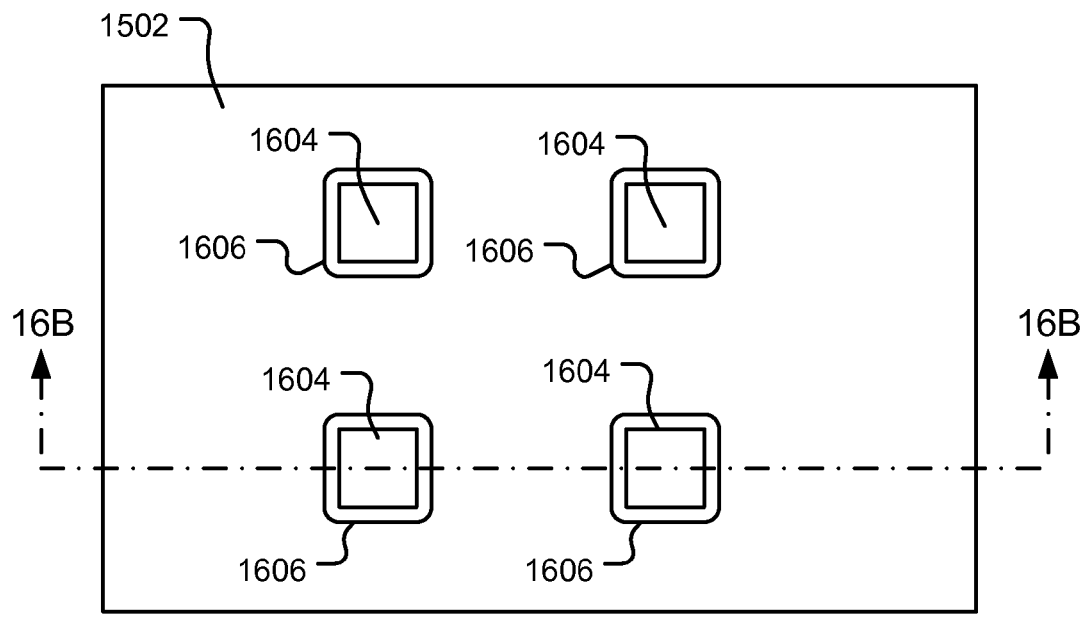
Figure 16B:
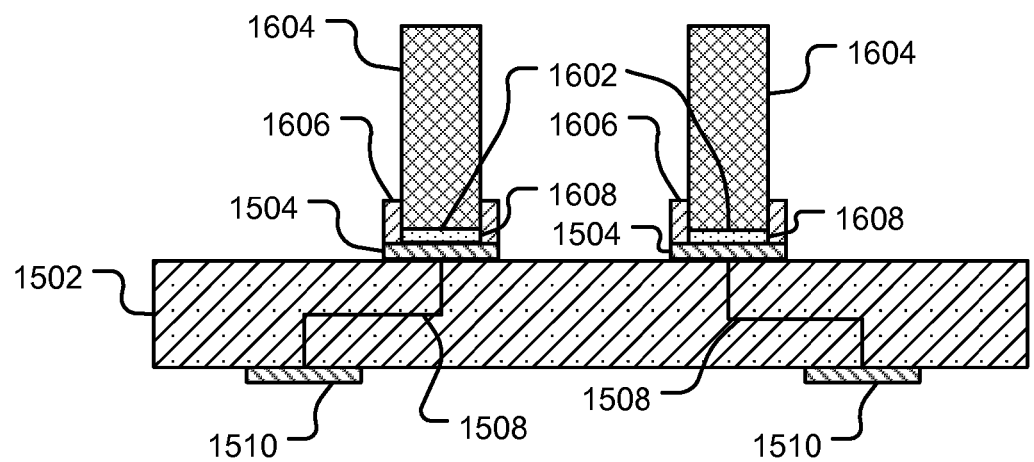

As shown in FIGS. 15A and 15B (which show respectively a top view and a side cross-sectional view), wiring substrate 1502, which can be the same as or similar to wiring substrate 1102, can comprises electrical terminals 1504 (four are shown but there can be more or fewer) that are electrically connected by internal wiring 1508 (e.g., electrically conductive traces and/or vias) to other terminals 1510 or to electrical elements (not shown) such as circuit elements (e.g., integrated circuits, resistors, capacitors, transistors, etc.) (not shown). (Wiring 1508 can be non-limiting examples of electrical connections.) Referring to FIGS. 16A and 16B, columns 1604 can be grown on terminals 1504 using any of the processes or techniques described or mentioned herein for growing columns of carbon nanotubes.

For example, columns 1604 can be grown using the floating catalyst process illustrated in and described above with respect to FIGS. 2-5B. As shown in FIGS. 16A and 16B (which show respectively a top view and a side cross-sectional view), a material 1608 with a growth surface 1602 can be deposited onto terminals 1504. For example, material 1608 can be the same as or similar to material 300 in FIGS. 3-5B, and growth surface 1602 can be the same as or similar to growth surface 302. Material 1608 can be deposited as a blanket material like material 300 in FIGS. 2-5B and masked with a masking layer like masking layer 402 with openings like openings 404 defining locations (e.g., over terminals 1504) where columns 1604 are to be grown. Alternatively, material 1608 can be patterned such that material 1608 is located only where (e.g., on terminals 1504) columns 1604 are to be grown. Columns 1604 can then be grown from the growth surface 1602 using a floating catalyst process such as the process described above with respect to FIGS. 5A and 5B. Columns 1604 can be vertically aligned carbon nanotube columns.

The fixed catalyst process illustrated in FIGS. 6 and 7 is another example of a process that can be used to grow columns 1604 on terminals 1504. If a fixed catalyst process is used, material 1608 can be a catalyst layer comprising a catalyst material. For example, material 1608 can be the same as or similar to the material that composes catalyst layer 604 in FIGS. 6 and 7. A buffer layer (not shown in FIGS. 16A and 16B), which can be the same as or similar to buffer layer 602 in FIGS. 6 and 7, can be deposited between terminals 1504 and material 1608. Columns 1604 can then be grown from material 1608 (which in this example can be a catalyst layer) using a fixed catalyst process such as the process described above with respect to FIG. 7. Columns 1604 can be vertically aligned carbon nanotube columns.

Regardless of the process used to grow columns 1604 on terminals 1504, anchoring structures 1606 can be provided around portions of columns 1604 as shown in FIGS. 16A and 16B. Anchoring structures 1606 can anchor columns 1604 to terminals 1504 and/or wiring substrate 1502 and can thus strengthen the attachment of columns 1604 to terminals 1504 and/or wiring substrate 1502. (Because terminals 1504 can be part of wiring substrate 1502, anchoring columns 1604 to terminals 1504 can be considered anchoring columns 1604 to wiring substrate 1502.) Anchoring structures 1606 can comprise any material suitable for deposit around end portions of columns 1604, and the material forming anchoring structures 1606 can be deposited in any suitable manner. For example, anchoring structures 1606 can comprise an electrically conductive material that is electroplated onto terminals 1504 and a portion of columns 1604. As another example, anchoring structures 1606 can comprise a photo reactive material that is deposited as a blanket layer onto wiring 1502. The photo reactive material can be selectively hardened only around a portion of columns 1604, and the unhardened portions of the photo reactive material can be removed. As yet another example, if the floating catalyst process is used to grow columns 1604 and material 1608 is initially deposited as a blanket layer over wiring substrate 1502 and a masking layer (e.g., like masking layer 402) is deposited over material 1608 with openings (e.g., like openings 404 in masking layer 402) exposing material 1608 on terminals 1504, anchoring structures 1606 can be the masking layer, in which case anchoring structures 1606 can be located over substantially all of wiring substrate 1502. Alternatively, such a masking layer (not shown) can be selectively removed, leaving remnants of the masking layer that form anchoring structures 1606 as shown in FIGS. 16A and 16B. Anchoring structures 1606 can comprise other materials. For example, anchoring structures 1606 can comprise a curable material that is deposited in a flowable or semiflowable state around columns 1604 and then hardened.

In some embodiments, the anchoring structures 1606 can be electrically conductive and can thus, in addition to anchoring columns 1604 to terminals 1504 and/or wiring substrate 1502, also electrically connect columns 1604 to terminals 1504. In some embodiments, anchoring structures 1606 need not function to increase appreciably the strength of the attachment of columns 1604 to terminals 1504 and/or wiring substrate 1502 and thus need not be anchoring structures. In such a case, structures 1606 can serve solely or primarily to electrically connect columns 1604 to terminals 1504.

If anchoring structures 1606 function to increase the strength of the attachment of columns 1604 to terminals 1504 and/or wiring substrate 1502, to enhance the strength with which anchoring structures 1608 anchor columns 1604 to terminals 1504 and/or wiring substrate 1502, anchoring structures 1606 can be selected to have a different coefficient of thermal expansion than columns 1604. For example, anchoring structures 1606 can be selected to expand more per unit change in temperature than columns 1604. Anchoring structures 1606 can be deposited around end portions of columns 1604 at a temperature that is below ambient temperature so that as anchoring structures 1606 warm to ambient temperature, anchoring structures 1606 expand and thus "squeeze" columns 1604.

FIGS. 17A-18B illustrate another exemplary process of growing carbon nanotube columns on a product substrate and anchoring the columns to the product substrate according to some embodiments of the invention. FIGS. 17A-18B also illustrate another exemplary process of electrically connecting carbon nanotube columns to other electrical elements on the product substrate according to some embodiments of the invention.

Figure 17A:
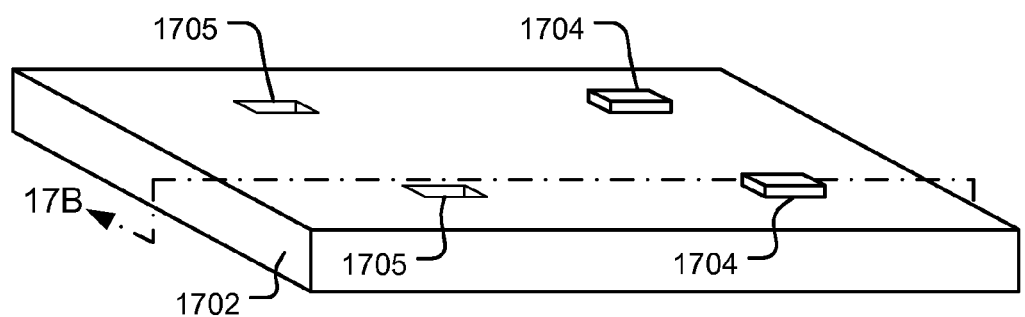
FIGS. 17A-18B illustrate another exemplary process of growing columns of carbon nanotubes on a wiring substrate, anchoring the columns to the wiring substrate, and/or electrically connecting the columns to the wiring substrate according to some embodiments of the invention.
Figure 17B:
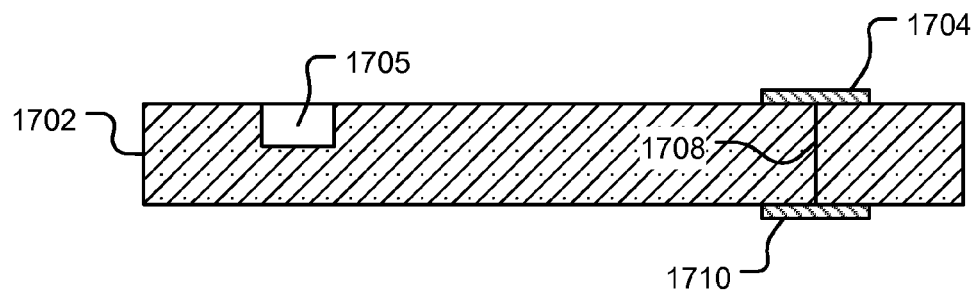
Figure 18A:
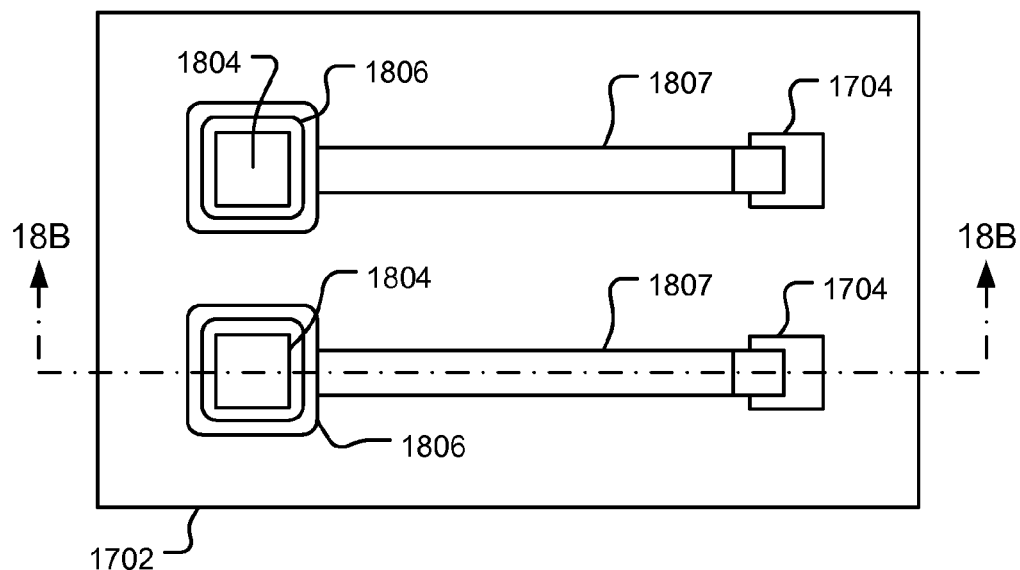
Figure 18B:
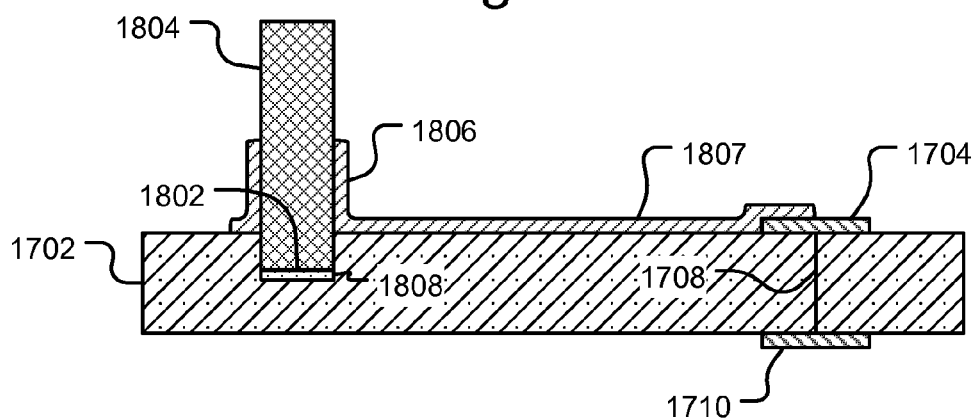

FIGS. 17A and 17B (which show respectively a perspective view and a side cross-sectional view), illustrate an exemplary wiring substrate 1702 (which can be a product substrate and can be similar to wiring substrates 1102 and/or 1502). As shown, wiring substrate 1702 can comprise a plurality of electrical terminals 1704 (two are shown but there can be more or fewer), which can be electrically connected by internal wiring 1708 (e.g., conductive traces and/or vias) to other terminals 1710 and/or to electrical elements (not shown) such as circuit elements (e.g., integrated circuits, resistors, capacitors, transistors, etc.) (not shown). (Wiring 1708 can be nonlimiting examples of electrical connections.) As also shown in FIGS. 17A and 17B, pits 1705 can be formed (e.g., etched, cut, etc.) into wiring substrate 1702. As shown in FIGS. 18A and 18B (which show respectively a top view and side cross-sectional view), columns 1804 of carbon nanotubes (which can be vertically aligned carbon nanotube columns) can be grown in pits 1705. Consequently, pits 1705 can be formed in locations where columns 1804 are to be grown.

Columns 1804 can be grown in pits 1705 using any of the processes or techniques described or mentioned herein for growing columns of carbon nanotubes. For example, columns 1804 can be grown using the floating catalyst process illustrated in FIGS. 2-5B and described above with respect to FIGS. 2-5B. As shown in FIGS. 18A and 18B, growth material 1808 with a growth surface 1802 can be deposited in pits 1705. For example, material 1808 can be the same as or similar to material 300 in FIGS. 3-5B, and growth surface 1802 can be the same as or similar to growth surface 302. Columns 1804 can then be grown from the growth surface 1802 using a floating catalyst process such as the process described above with respect to FIGS. 5A and 5B.

The fixed catalyst process illustrated in FIGS. 6 and 7 is another example of a process that can be used to grow columns 1804 in pits 1705. If a fixed catalyst process is used, material 1808 can be a catalyst layer comprising a catalyst material. For example, material 1808 can be the same as or similar to the material that composes catalyst layer 604 in FIGS. 6 and 7. A buffer layer (not shown in FIGS. 18A and 18B), which can be the same as or similar to buffer layer 602 in FIGS. 6 and 7, can be deposited between the bottom of pits 1705 and the material 1808 in the pits 1705. Columns 1804 can then be grown from the material 1808 (which in this example is a catalyst layer) using a fixed catalyst process such as the process described above with respect to FIG. 7.

Regardless of the process used to grow columns 1804 in pits 1705, the pits 1705 can anchor the columns 1804 to the wiring substrate 1702. That is, the fact that the columns 1804 are in pits 1705 in wiring substrate 1702 can aid in anchoring columns 1804 to wiring substrate 1702. Optionally, in some embodiments, anchoring structures 1806 can be formed on wiring substrate 1702 and around columns 1804 as shown in FIGS. 18A and 18B. Anchoring structures 1806 can further anchor columns 1804 to wiring substrate 1702 and can thus further strengthen the attachment of columns 1804 to wiring substrate 1702.

Anchoring structures 1806 can comprise any material suitable for deposit onto wiring substrate 1702 and around columns 1804, and the material can be deposited in any suitable manner. In some embodiments, anchoring structures 1806 can be like and can be formed or deposited like anchoring structures 1606 in FIGS. 16A and 16B. As mentioned, anchoring structures 1806 can be electrically conductive, and as shown in FIGS. 18A and 18B, anchoring structures 1806 can be electrically connected to electrically conductive traces 1807, which can electrically connect anchoring structures 1806—and thus columns 1804—to electrical elements on or in wiring substrate 1702. For example, as shown in FIGS. 18A and 18B, traces 1807 can connect anchoring structures 1806—and thus columns 1804—to terminals 1704. Alternatively or in addition, one or more of traces 1807 can connect an anchoring structure 1806 (and thus a column 1804) to an electric component such as a resistor, capacitor, or transistor on or in wiring substrate 1702. In some embodiments, anchoring structures 1806 need not function to increase the strength of the attachment of columns 1804 to wiring substrate 1702 but can merely or primarily electrically connect columns 1804 to traces 1807.

Referring to FIGS. 15A-18B, columns 1604 and 1804 can be examples of the columns 104 in FIG. 1, and wiring substrates 1102, 1502 and 1702 can be examples of substrate 102 of FIG. 1. Thus, any reference herein to columns 104 can include columns 1604 and/or columns 1804 as examples of columns 104, and any reference herein to substrate 102 can include wiring substrate 1102, wiring substrate 1502, and/or wiring substrate 1702 as examples of substrate 102.

The processes shown in FIGS. 15A-18B are exemplary only, and many variations are possible. For example, rather than growing columns 1604 on wiring substrate 1502, columns 1604 can be grown on a sacrificial substrate (e.g., as shown in FIGS. 2-5B or FIGS. 6 and 7) and transferred to wiring substrate 1502 (e.g., using any of the techniques shown or discussed above with respect to any of FIGS. 8-11B). For example, columns 1604 can be adhered to terminals 1504 using an adhesive like adhesive 804 deposited on terminals 1504. As another example, rather than growing columns 1804 on wiring substrate 1702, columns 1804 can be grown on a sacrificial substrate (e.g., as shown in FIGS. 2-5B or FIGS. 6 and 7) and transferred to wiring substrate 1702 (e.g., using any of the techniques shown or discussed above with respect to any of FIGS. 8-11B). For example, columns 1804 can be adhered in pits 1705 using an adhesive like adhesive 804 deposited in pits 1705.

Regardless of how or on what type of substrate columns 104 are made, in some embodiments, columns 104 can be treated to enhance one or more properties of the columns 104. Although columns 1604 and/or 1804 can be similarly treated as described below, the following discussion uses columns 104 for sake of simplicity. For example, columns 104 can be treated to enhance the mechanical stiffness of the columns 104. As another example, columns 104 can be treated to enhance the electrical conductivity of the columns. As still another example, contact portions of columns 104 can be treated to enhance contact properties of the columns 104.

Figure 19A:
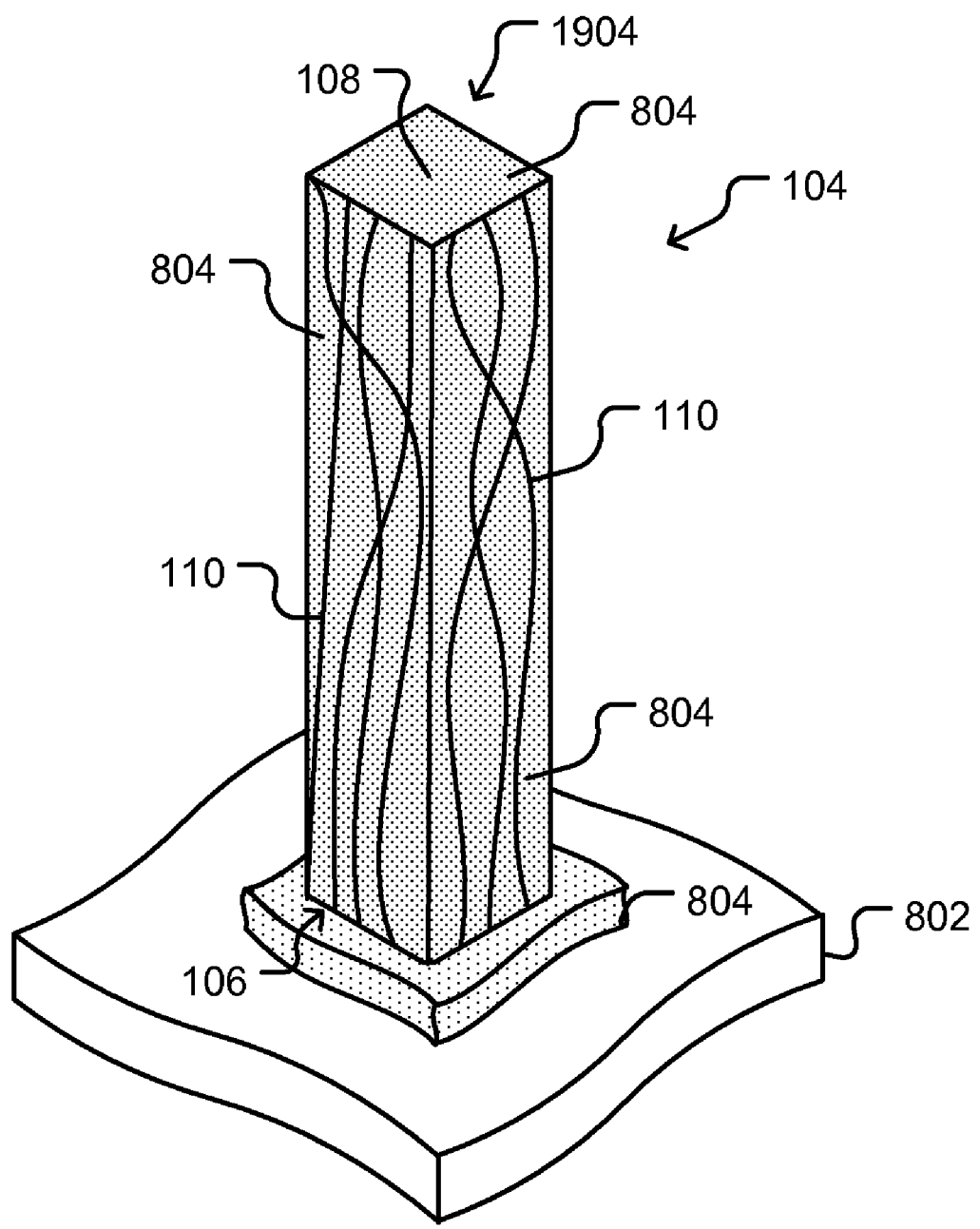
FIG. 19A illustrates an exemplary column of carbon nanotubes with an adhesive wicked throughout the column including into the contact end of the column according to some embodiments of the invention.

FIG. 19A shows a detailed view of a column 104 after the column 104 has been adhered to transfer substrate 802 in accordance, for example, with one of the transfer processes discussed above and illustrated in FIGS. 8-10. For example, as generally discussed above, end 106 of column 104 may have been placed in adhesive 804 (which is shown in partial view in FIG. 19A) on substrate 802 (which is also shown in partial view in FIG. 19A), adhesive 804 may have been cured, and substrate 102 may have been peeled away from column 104 as in FIGS. 8 and 9 or FIG. 10. Alternatively, column 104 may have been transferred to a substrate or object other than substrate 802. For example, as shown in FIGS. 11A and 11B, column 104 may have been attached to terminals 1106 on wiring substrate 1102 by adhesive 1104 in which case adhesive 1104 can replace adhesive 804 in FIG. 19A, and a terminal 1106 can replace substrate 802 in FIG. 19A. As yet other alternatives, column 104 can be attached by an adhesive like adhesive 804 to other substrates like substrate 802 or terminals or other elements or objects.

Referring again to the example shown in FIG. 19A, as discussed above, column 104 can be comprise a plurality of carbon nanotubes a few of which are illustrated in FIG. 19A as carbon nanotubes 110. As adhesive 804 is cured, the adhesive 804 can be drawn by capillary action between individual carbon nanotubes 110 of column 104. In other words, adhesive 804 can "wick" between carbon nanotubes 110 and thus into column 104. Typically, the adhesive 804 can wick into column 104 starting at end 106 that is disposed in the adhesive 804, and the adhesive can then continue to wick up the column 104 towards an opposite end 108, which, in this example, can be a contact end 1904 (e.g., an end configured to make contact with an object such as a terminal of an electrical device). (Contact end 1904 can be a non-limiting example of a first end or a second end.) The distance up column 104 from end 106 that adhesive 804 wicks can depend on a number of factors including, without limitation, the amount of time adhesive 804 is cured, the viscosity of adhesive 804, ambient conditions such as temperature, air pressure, and/or other factors. Optionally, a material that inhibits the spread of adhesive 804 through column 104 can be applied to all or part of column 104. For example, parylene (not shown) can be applied (e.g., by chemical vapor deposition) to portions of column 104 to prevent adhesive 804 from spreading into those portions of column 104 or at least to impede or significantly slow the spread of adhesive 804 into those portions of column 104 where the parylene is applied.

FIG. 19A illustrates a non-limiting example according to some embodiments of the invention in which adhesive 804 can wick through all or substantially all of column 104. For example, adhesive 804 can be considered to have wicked through substantially all of column 104 if adhesive 804 has wicked through 90% of the length of the column 104. The presence of cured adhesive 804 throughout or substantially throughout column 104 can significantly increase the mechanical stiffness of the column 104. For example, in some embodiments, the mechanical stiffness of column 104 can be 100, 200, 300, 400, 500, or more times greater than the mechanical stiffness of the column 104 without adhesive 804 wicked into the column 104. In some embodiments, the increase in mechanical stiffness of column 104 can be less than 100 times.

Figure 19B:
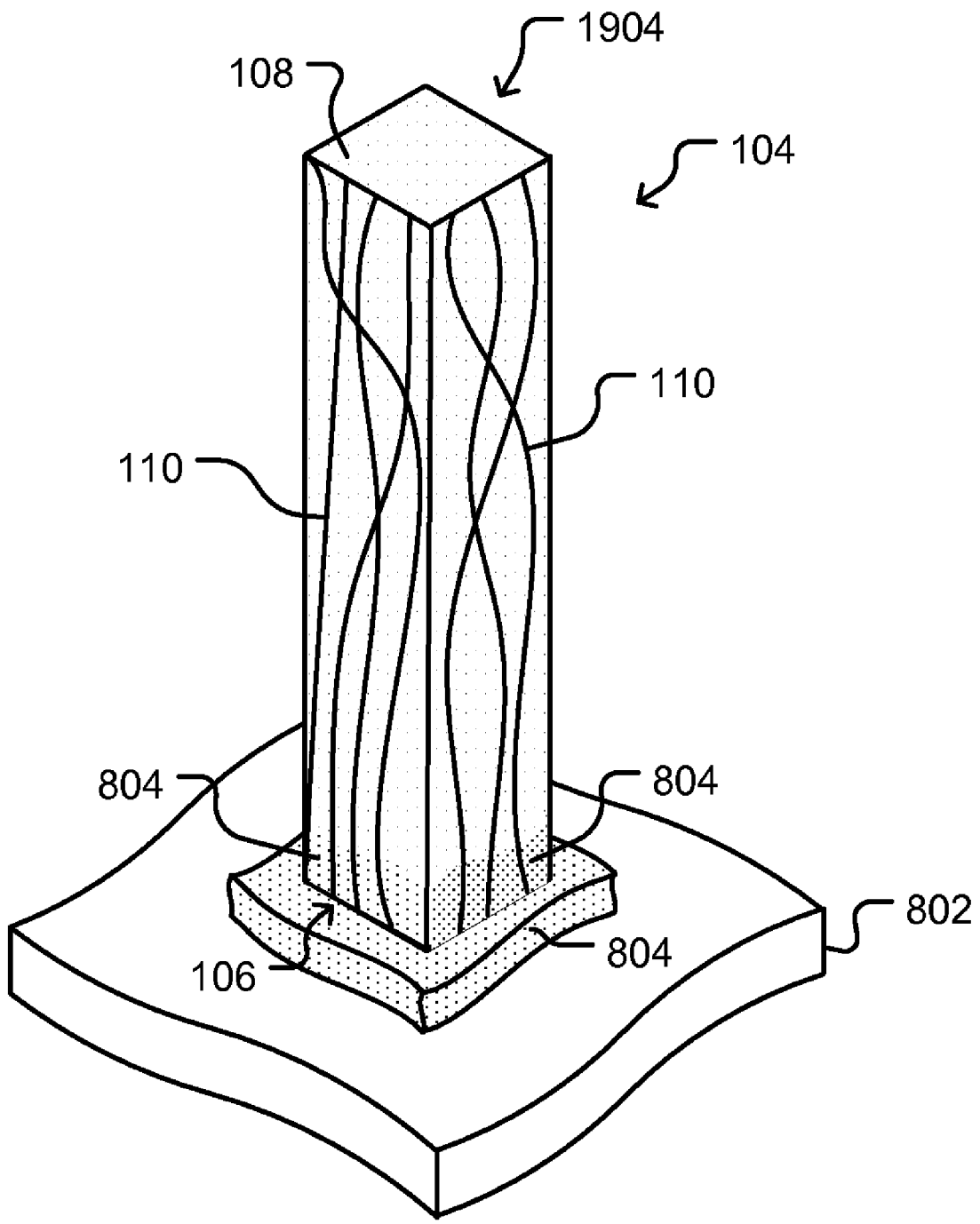
FIG. 19B illustrates an exemplary column of carbon nanotubes with an adhesive wicked into a base portion of the column; the contact end of the column has protruding structures according to some embodiments of the invention.

FIG. 19B illustrates a non-limiting example in which adhesive 804 can have wicked only into the portion of column 104 that is near end 106. Thus, in the example shown in FIG. 19B, most of the column 104 is substantially free of adhesive 804, and the adhesive 804 is wicked only into a base portion of column 104 near end 106. In the example shown in FIG. 19B, the adhesive 804 can have little to no effect on the stiffness of column 104.

The examples shown in FIGS. 19A and 19B are exemplary only, and many variations are possible. For example, adhesive 804 can spread from end 106 any distance up column 104 to end 108. For example, adhesive 804 can spread into column 104 from end 106 toward opposite end 108 2%, 5%, 10%, 20%, 40%, 60%, 80%, 90%, or 100% of the total length of column 104. Alternatively, adhesive 804 can spread into column 104 from end 106 less than 2% of the length of the column 104 or any percentage between the percentages give above. Typically, the farther adhesive 804 wicks up from end 106 into column 104, the greater the stiffness of column 104.

Figure 20:
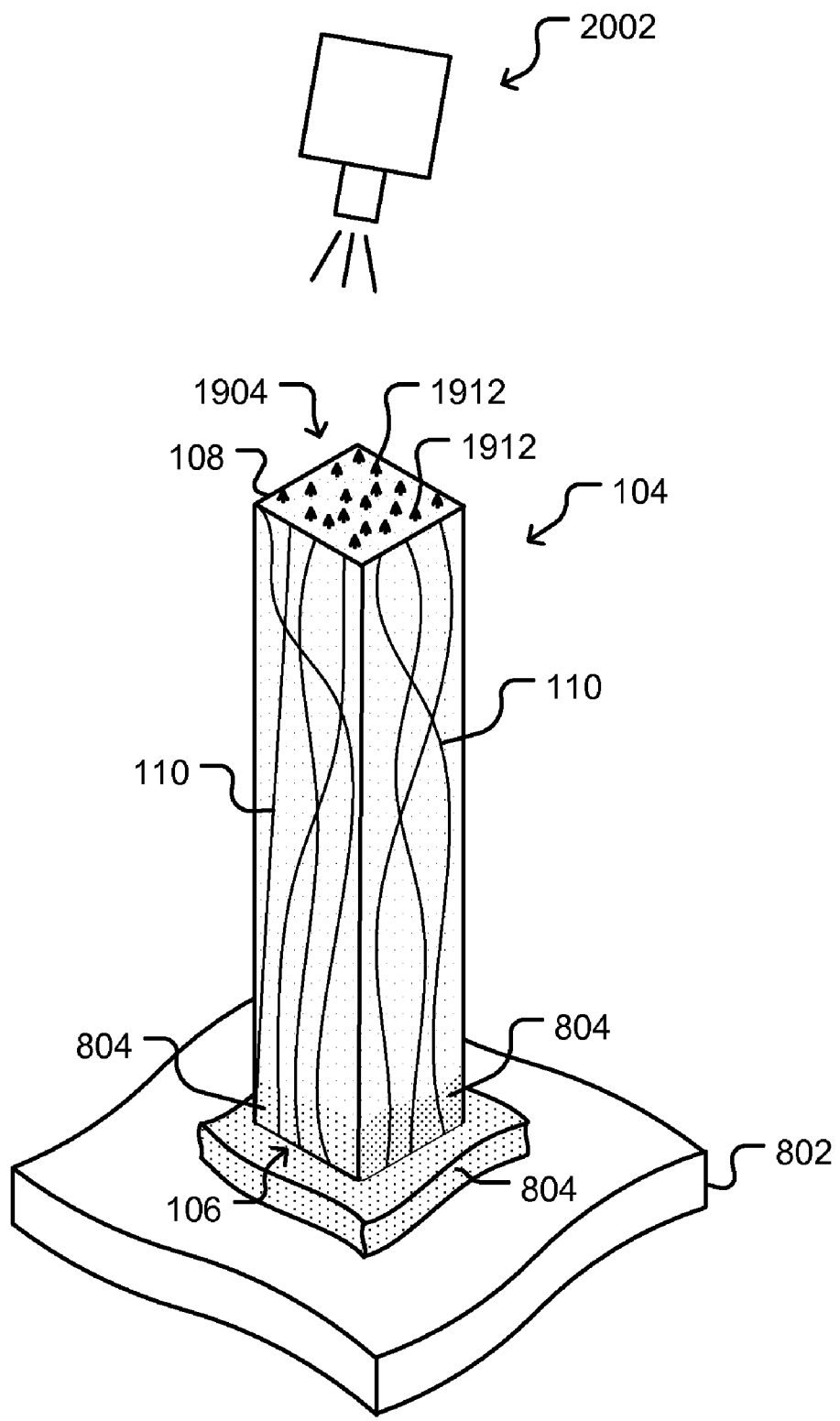
FIG. 20 illustrates treatment of the column of carbon nanotubes of FIG. 19B to increase the number of protruding structures protruding from the contact end according to some embodiments of the invention.

As shown in FIG. 20, column 104 can be treated to create protruding structures 1912 (which can be non-limiting examples of points, features, or structures) at contact end 1904 of column 104, which as discussed above, can be one of the ends 106, 108 (in this example end 108) of column 104 configured to make contact with an electrical device (not shown). Structures 1912 can comprise ends or end portions of ones (e.g., a cluster) of carbon nanotubes 110

In some embodiments, contact end 1904 can be etched to create protruding structures 1912. FIG. 20 illustrates a non-limiting example in which an etching mechanism 2002 can sputter etch contact end 1904 to produce protruding structures 1912 on contact end 1904. In such a case, etching mechanism 2002 can be a sputter etching machine. Alternatively, other etching techniques can be used. For example, contact end 1904 can be subjected to reactive ion etching to produce protruding structures 1912. In such a case, etching mechanism 2002 can be a reactive ion etching machine. Other etching techniques can be used on contact end 1904 to produce structures 1912 or similar structures. Such other etching techniques can include without limitation wet etching techniques. Moreover, techniques other than etching can be used to produce structures 1912. For example, a mechanical grinding mechanism can be used to roughen the surface of contact end 1904, which can produce protruding-like structures 1912. As another example, mechanical imprinting techniques can be applied to contact end 1904 to create structures 1912.

Although the foregoing treatment is illustrated in FIG. 20 as performed on column 104 into which adhesive 804 has wicked into column 104 as shown in FIG. 19B (that is, adhesive 804 has wicked only partially into column 104), the treatment by which structures 1912 are created on contact end 1904 can be applied to column 104 into which adhesive 804 has wicked into all of column 104 and contact end 1904 as shown in FIG. 19A. In fact, the treatment by which structures 1912 are created on contact end 1904 can be applied to any column 104 regardless of how far from end 106 into column 104 adhesive 804 has wicked, and the treatment can also be applied to a column 104 into which no adhesive 804 has wicked.

As mentioned, column 104 can also or alternatively be treated to enhance electrical conductivity. For example, electrically conductive material can be applied to columns 104 in a number of ways. In some embodiments the electrically conductive material can be applied to the outer surface of the column 104, in still other embodiments the electronically conductive material can be applied to individual carbon nanotubes in a column 104, in still other embodiments the electrically conductive material can be dispersed throughout the column 104 (e.g., between individual carbon nanotubes), in still other embodiments, any combinations of the foregoing can be used.

In some embodiments, an electrically conductive material can be deposited generally on the outside of columns 104. For example, electrically conductive material can be electroplated or otherwise deposited (e.g., sputtered) onto generally the outside of columns 104. In other embodiments, electrically conductive material can be applied to individual carbon nanotubes, using for example, atomic layer deposition (ALD) or chemical vapor deposition (CVD) or in the spaces between the individual carbon nanotubes.

Figure 21:
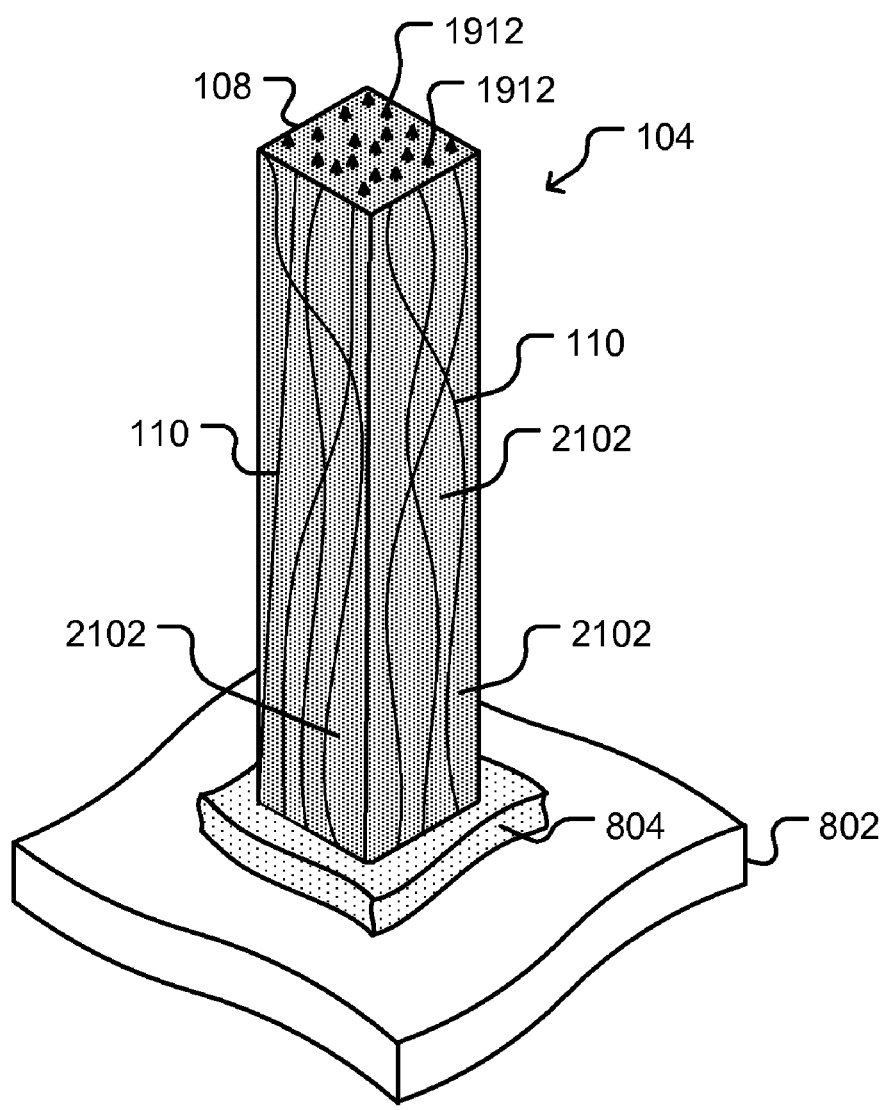
FIG. 21 illustrates addition of a conductive material to the column of carbon nanotubes of FIG. 20 according to some embodiments of the invention.

FIG. 21 illustrates a column 104 after conductive material 2102 has been added to column 104. Using techniques such as atomic layer deposition (ALD) or chemical vapor deposition (CVD), conductive material 2102 can be deposited on the individual carbon nanotubes or implanted between the individual carbon nanotubes within the column 104 in addition to or alternative to depositing conductive material 2102 generally on the outside of column 104. For example, deposited by ALD or CVD, conductive material 2102 can penetrate column 104 and be implanted on and/or around individual carbon nanotubes 110 and/or between individual carbon nanotubes 110 of column 104. In some embodiments, a thickness of the material 2102 on individual carbon nanotubes 110 can be half or less than half of an average spacing between individual carbon nanotubes 110 that compose the column 104. Such treatment of individual carbon nanotubes can enhance the electrical and/or mechanical properties of the individual tubes while permitting the tubes to retain independent motion. For example, as mentioned, such treatment can increase electrical conductivity of column 104 and/or a stiffness of column 104. Moreover, such treatment (e.g., the presence of conductive material 2102 on, around, and/or between individual carbon nanotubes that compose column 104) can substantially not interfere with individual movement of ones of the carbon nanotubes with respect to others of the carbon nanotubes that compose column 104. For example, as mentioned, a thickness of the material 2102 on individual carbon nanotubes 110 can be half or less than an average spacing between individual carbon nanotubes 110 that compose the column 104 can be half or less than half of the average spacing between carbon nanotubes 110 that compose the column 104, which can leave space between carbon nanotubes 110 that allows individual carbon nanotubes 110 to move with respect to each other.

If column 104 has been treated as shown in FIG. 19A and thus comprises adhesive 804 wicked into the column between carbon nanotubes 110, ALD or CVD can implant conductive material within the adhesive 804. Conductive material 2102 can comprise any electrically conductive material and can have a greater electrical conductivity than the carbon nanotubes that compose column 104. Non-limiting examples of suitable materials include gold, copper, and other electrically conductive metals as well as electrically conductive non-metals.

Conductive material 2102 can, in addition to enhancing electrical conductivity of column 104, also enhance a stiffness of column 104. As another alternative, non-conductive material (not shown) can be deposited within column 104 (e.g., on and/or around individual carbon nanotubes 110 and/or between carbon nanotubes 110 of column 104) in the same manner as described above with respect to depositing conductive material 2102. For example, such non-conductive material (not shown) can be deposited to enhance a mechanical characteristics (e.g., stiffness) of a column 104. Such non-conductive material (not shown) can be deposited in place of or in addition to conductive material 2102.

Wicking conductive particles into column 104 can be another non-limiting example of a treatment for enhancing electrical conductivity of a column 104. For example, a solution containing conductive particles can be wicked into a column 104. In some embodiments, such a solution can be wicked into a column 104 using techniques and principles such as those discussed above with respect to wicking adhesive 804 into a column. In some embodiments, such a solution can contain nano-size particles of a conductive material. For example, such a solution can contain silver nanoparticles. The nano-sized conductive particles—e.g., silver nanoparticles—can wick into a column 104 and lodge on and/or around and/or between ones of the carbon nanotubes 110 that compose the column 104. Those particles can thus enhance the electrical conductivity of the column 104.

Any one or more of the treatments discussed above for enhancing electrical conductivity of a column 104, including without limitation the treatment illustrated in FIG. 21 by which conductive material 2102 is added to column 104, can be applied to any column 104 regardless of how far from end 106 into column 104 adhesive 804 has wicked, and the treatment can also be applied to a column 104 into which no adhesive 804 has wicked. Moreover, the treatment illustrated in FIG. 21 by which conductive material 2102 is added to column 104 to enhance the electrical conductivity of column 104 can be applied to a column 104 regardless of whether the column 104 has been treated as shown in FIG. 20 to create structures 1912. Thus, the structures 1912 shown in FIG. 21 need not be present.

As mentioned or as will be mentioned, columns 504, 704, 1404, 1604, 1804, 2204, 2304, and 2304' herein are examples of columns 104. Therefore, any one or more of the treatments illustrated in FIGS. 19A-21 can be applied to any of columns 504, 704, 1404, 1604, 1804, 2204, 2304, and 2304'.

Figure 22A:
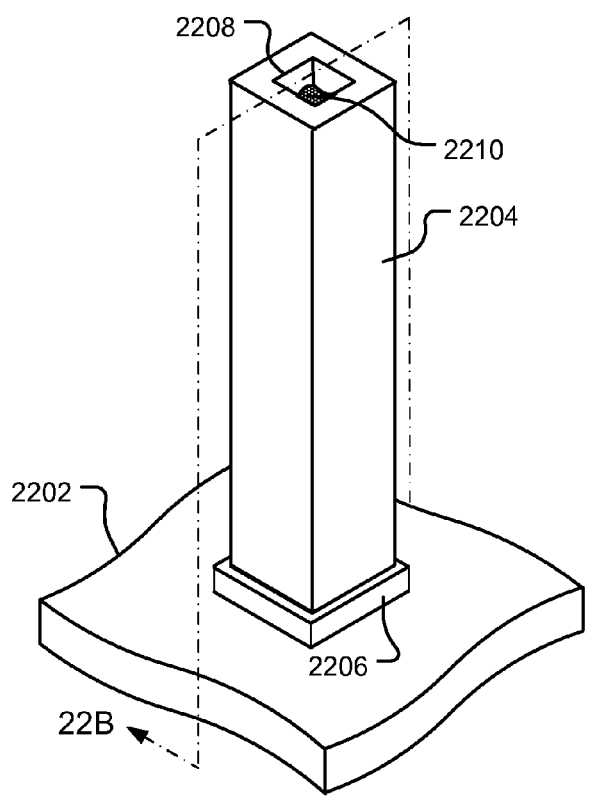
FIGS. 22A and 22B illustrates an exemplary column of carbon nanotubes with a hollow space that can be filled with an electrically conductive material according to some embodiments of the invention.
Figure 22B:
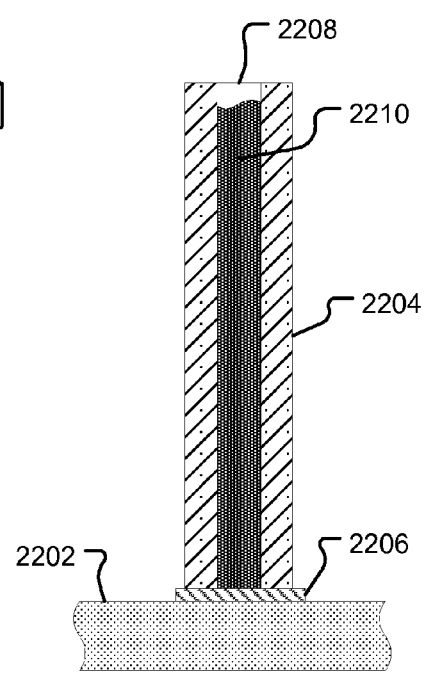

FIGS. 22A and 22B illustrates another exemplary process of enhancing the electrical conductivity of a column of carbon nanotubes. FIGS. 22A and 22B shows a perspective view of a single column 2204, which is attached to a terminal 2206 of a substrate 2202. As shown, column 2204 can include a hollow portion 2208 (which can be a non-limiting example of an interior cavity), which as shown can extend the length of column 2204 from end 2220 to terminal 2206. Generally speaking, column 2204 can be grown using any of the techniques described herein for growing columns of vertically aligned carbon nanotubes. Hollow portion 2208 can be formed in any suitable manner. For example, column 2204 can be grown around a sacrificial plug structure (not shown). For example, the process of making columns 504 shown in FIGS. 2-5B can be modified by placing a sacrificial plug structure in the shape and size of the hollow portion 2208 on part of the area of growth surface 302 exposed by an opening 404 in masking layer 402. Columns like columns 504 can then be grown from the area of growth surface 302 exposed by opening 404 and not covered by the sacrificial plug structure. Those columns can be like columns 504 except the center of those columns can comprise the sacrificial plug structure (not shown), which can be removed resulting in column 2204 with hollow portion 2208. The sacrificial plug structure (not shown) can be removed in any suitable manner including physically pulling the plug structure out of the column 2204 or etching or otherwise dissolving the sacrificial plug structure. In fact, any of the processes for growing columns of carbon nanotubes illustrated herein can be modified to grow a column of nanotubes around a sacrificial plug structure generally as described above to produce a column like column 2204 with a hollow portion 2208. Rather than grow a column of carbon nanotubes around a sacrificial plug structure, column 2204 can be grown without hollow portion 2208 using any of the growth techniques described herein. Thereafter, hollow portion 2208 can be created by etching or cutting away part of the column. Carbon nanotubes (not shown) that compose column 2204 can be vertically aligned, and column 2204 can therefore be a vertically aligned carbon nanotube column. Although the hollow portion 2208 is shown with a square-type cross-section, other types of cross sections are equally contemplated.

Regardless of how column 2204 is made, as shown in FIGS. 22A and 22B, the hollow portion 2208 can be filled with an electrically conductive material 2210, which can be any electrically conductive material 2210 that can be deposited into hollow portion 2208. (To ease illustration, hollow portion 2208 is shown in FIGS. 22A and 22B partially filed with conductive material 2210, but hollow portion 2208 can be fully filed with conductive material 2210.) In some embodiments, conductive material 2210 can have a greater electrical conductivity than the carbon nanotubes 110 that compose column 104. In some embodiments, conductive material 2210 can comprise a conductive material with a relatively low melting point that can be deposited into hollow portion 2208 while melted and then allowed to cool. For example, conductive material 2210 can be solder. As another example, conductive material 2210 can be a curable material that is deposited into hollow portion 2208 in a flowable or semi-flowable state and then cured, causing the conductive material 2210 to harden inside hollow portion 2208. For example, conductive material 2210 can be a curable conductive epoxy.

Column 2204 can be an example of the columns 104 in FIG. 1, and substrate 2202 can be an example of substrate 102. Thus, any reference herein to columns 104 can include column 2204 as an example of columns 104, and any reference herein to substrate 102 can include substrate 2202 as an example of substrate 102. For example, any of columns 504, 704, 1404, 1604, 1804, 2204, 2304, and 2304' can be configured like column 2204 with a hollow portion 2208 that can be filled with a conductive material like 2210.

The stiffness of column 2204 can be a function of cross-sectional area and length, whereas electrical conductivity imparted by treating the surface of a column of nanotubes can be a function of surface area. Making a center of column 2204 hollow and then treating an inner and outer surface to be more conductive by one of the above mentioned methods, can allow the conductivity to be increased while minimally affecting the stiffness.

Although FIGS. 19-22B show one column 104 (or column 2204, which can be an example of column 104), the techniques illustrated in FIGS. 19-22B for enhancing mechanical stiffness, contact, and/or electrical conductivity properties of columns 104 can be applied to many columns 104. Moreover, the techniques illustrated in FIGS. 19-22B are exemplary only, and many variations and alternatives are possible.

Figure 23A:
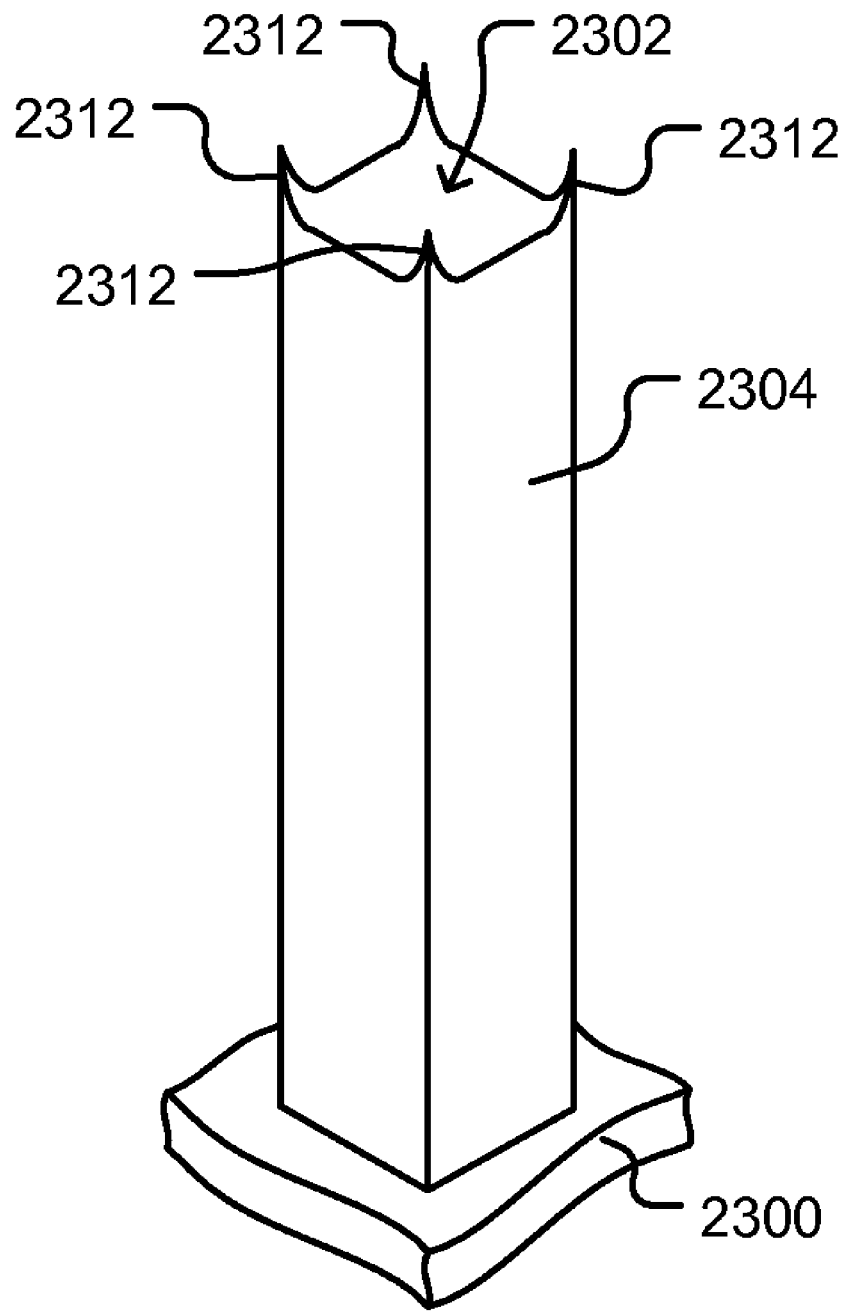
FIG. 23A illustrates an exemplary column of carbon nanotubes with protruding structures formed at corners or other points generally along a perimeter of a contact end according to some embodiments of the invention.

FIG. 23A illustrates an exemplary alternative enhancement of the contact properties of a column of carbon nanotubes according to some embodiments of the invention. FIG. 23A illustrates a column 2304 of carbon nanotubes on a substrate 2300 (shown in partial view), which can be a sacrificial substrate, an intermediate substrate, or a product substrate. As shown, column 2304 can include peak structures 2312 (which can be non-limiting examples of protruding structures or points, features, or structures) at a contact end 2302 of the column 2304. For example, peak structures 2312 can be at corners of contact end 2302 as shown in FIG. 23A. Alternatively, peak structures 2312 can be in other locations of contact end 2302. Such other locations can be along or in proximity to an outer perimeter or periphery of contact end 2302. Moreover, although four peak structures 2312 are shown in FIG. 23A, contact end 2302 can have more or fewer peak structures 2312. Peak structures 2312 can comprise ends of ones (or clusters) of the carbon nanotubes that compose column 2304.

Peak structures 2312 can enhance contact properties of contact end 2302. For example, in use, contact end 2302 of column 2304 can be pressed against a terminal of an electronic device (not shown) and thereby make a temporary, pressure-based electrical connection with the electronic device. The peak structures 2312 can penetrate the terminal including any debris or layer (e.g., an oxide layer) on the terminal and thus enhance the ability of the contact end 2302 to contact the terminal. For example, the presence of peak structures 2312 can effectively provide greater pressure against a terminal than a column that lacks peak structures for the same contact force between the column and the terminal, assuming that the columns have generally the same or similar cross-sectional areas.

Any method that produces structures like peak structures 2312 can be used to make column 2304. For example, without limitation, the floating catalyst method illustrated in FIGS. 2-5B or the fixed catalyst method illustrated in FIGS. 6 and 7 can be used to grow column 2304. During the process of growing column 2304, once column 2304 has grown to a desired length, the flow of gas (containing a catalyst material and a source of carbon if the floating catalyst method is being used or a source of carbon if the fixed catalyst method is being used), can be altered such that the flow of the gas directed at locations at the end of the column 2304 where peak structures 2312 are desired is increased without increasing the flow of gas to other portions of the end of the column 2304. Alternatively, rather than increase the flow of gas directed at locations at the end of the column 2304 where peak structures 2312 are desired, the gas flow directed at other locations at the end of the column 2304 can be substantially decreased or stopped. One method for achieving this can be to move a template into position at the desired time where the gas can only flow through desired regions of the template to form the peak structures 2312. As yet another alternative to increasing the flow of gas directed to locations at the end of the column 2304 where peak structures 2312 are desired, the concentrations of active ingredients (catalyst material and the material that is a source of carbon if the floating catalyst method is being used or the material that is a source of carbon if the fixed catalyst method is being used) in the gas directed at locations at the end of the column 2304 where peak structures 2312 are desired can be increased without increasing the concentration of the active ingredients in the flow of gas to other portions of the end of the column 2304. The foregoing can result in an increased growth rate of carbon nanotubes at the locations at the end of column 2304 where peak structures 2312 are desired.

As another example of a non-limiting method of forming peak structures 2312, it has been found that most recipes can grow a carbon nanotube column generally uniformly to a particular length, after which the column continues to grow but not uniformly. In some instances, the non-uniform continued growth of the column results in anomalies like peak structures 2312.

FIGS. 23B-23E illustrate additional non-limiting examples of techniques for creating a column like column 2304 with peak structures like peak structures 2312 according to some embodiments of the invention.

Figure 23B:
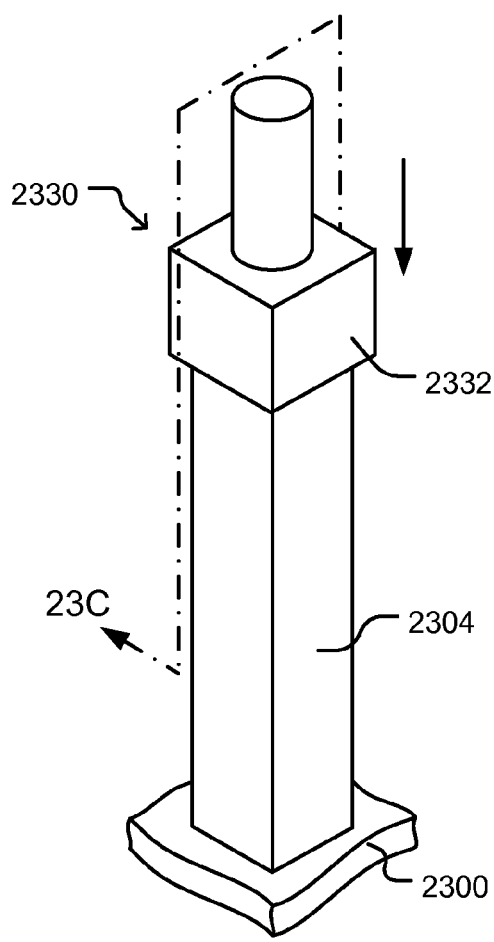
FIGS. 23B, 23C, 23D, and 23E illustrates exemplary methods for making the column of FIG. 23A according to some embodiments of the invention.
Figure 23C:
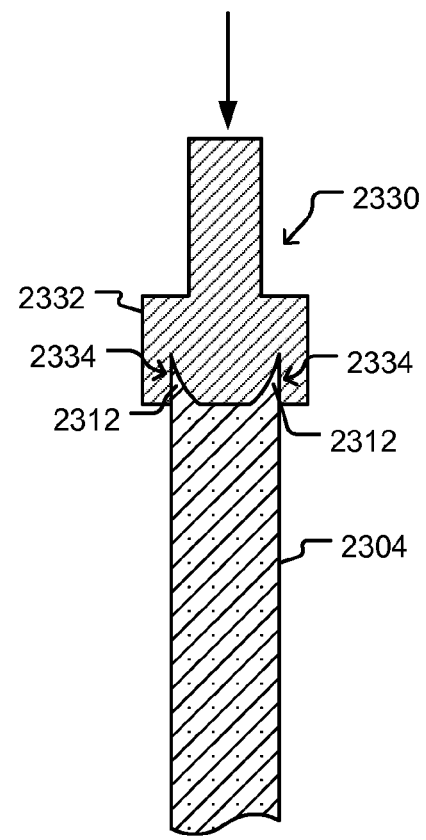

FIGS. 23B and 23C illustrate use of a mechanical imprinting stamp 2330 (which can be a non-limiting example of a molding tool) that can be used to form peak structures 2312. As shown, a stamp 2330 comprising a mold head 2332 (which can be a non-limiting example of a mold) with the inverse (or negative) shape of the desired peak structures 2312 can be placed over column 2304 and pressed against the end 2302 of column 2304, which as best seen in FIG. 23C (which shows a side, cross-sectional view of column 2304 and stamp 2330), can imprint peak structures 2312 into end 2302 of column 2304.

Figure 23D:
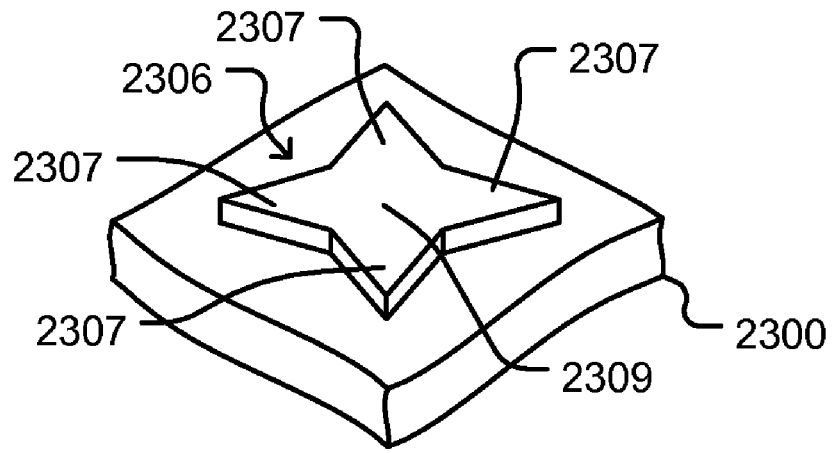
Figure 23E:
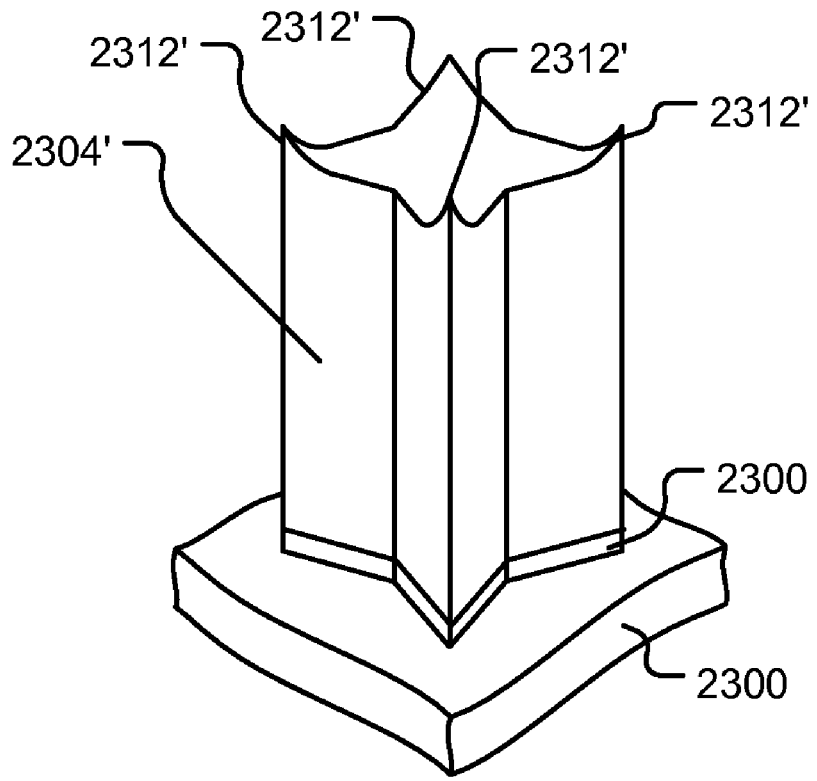

FIGS. 23D and 23E illustrate a technique in which a column 2304' like column 2304 can be grown from a growth material 2306 that can be patterned to have a central portion 2309 and one or more extensions 2307 extending from the central portion 2309. (Four extensions 2307 are shown but more or fewer can be used.) Column 2304' can be grown on growth material 2306 (which can be like growth material 300 in FIG. 3 or catalyst layer 604 in FIG. 6) using any of the processes for growing columns of carbon nanotubes disclosed herein including without limitation the processes shown in FIGS. 2-7. It has been found that the column 2304' can grow generally uniformly from the central portion 2309 of growth material 2306 but can grow at a faster rate on extensions 2307 and in particular near tips of extensions 2307. Thus, as shown in FIG. 23E, peak structures 2312' can tend to form at corners of column 2304', the corners of column 2304' corresponding to tips of extensions 2307. The faster growth at the corners of column 2304' can result in peak structures 2312' as shown in FIG. 23E, which can be generally similar to peak structures 2312.

Regardless of how column 2304 is formed, column 2304 can be an example of the columns 104 in FIG. 1, and substrate 2300 can be an example of substrate 102. Thus, any reference herein to columns 104 can include column 2204 as an example of columns 104, and any reference herein to substrate 102 can include substrate 2300 as an example of substrate 102.

Columns of carbon nanotubes like columns 104, and in particular vertically aligned carbon nanotube columns (e.g., columns 104, which as discussed above, can be—but need not be—vertically aligned carbon nanotube columns), can have spring properties. For example, upon application of a force (an applied force) to a free end of a column 104, the column 104 can compress, bend, deform, or move and also generate an opposing force that opposes the applied force. Upon removal of the applied force, the column 104 can substantially recover its original shape and/or position or at least recover a portion of its original shape and/or position (e.g., column 104 can be elastically deformable). Columns of carbon nanotubes like columns 104 (which as stated can be vertically aligned carbon nanotube columns) can be tuned to have one or more particular spring properties. A column can be tuned by applying a tuning force of a particular level to the column, and the tuning force can impart one or more spring properties that have a value or values that correspond to the level of the tuning force. Typically, thereafter, the column will substantially maintain the tuned properties in response to application of forces to the column that are less than the tuning force. If a force that is greater than the original tuning force is applied to the column, the greater force can retune the column, changing the spring properties to correspond to the greater force.

Figure 24:
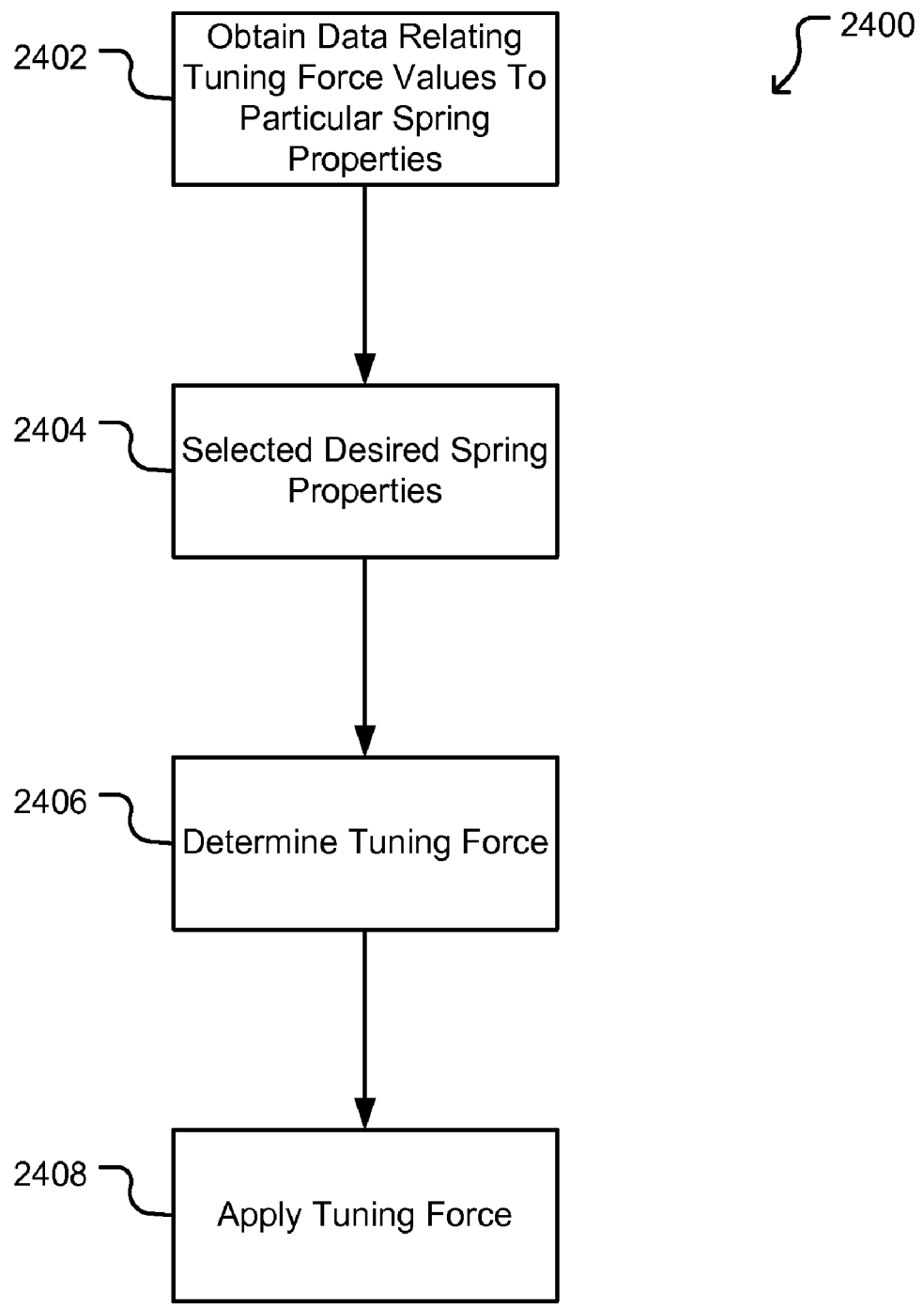
FIG. 24 illustrates an exemplary process of tuning a column of carbon nanotubes to have a particular spring property or properties according to some embodiments of the invention.

FIG. 24 illustrates an exemplary process 2400 for tuning one or more columns of carbon nanotubes according to some embodiments of the invention. For ease of discussion and purposes of illustration, the process 2400 of FIG. 24 is illustrated and discussed below as tuning a spring constant (also known as k-value or stiffness) of columns 104. As is known, the spring constant of a spring structure can be the level of a force divided by the distance the force displaces the spring (within the elastic range of the spring). That is, $k=F/d$, where "k" is the spring constant, "F" is a force applied to the spring, and "d" is the distance the force F displaces the spring. The process 2400 is not, however, limited to tuning the spring constant of columns 104, nor is the process 2400 limited to tuning spring properties of columns 104. Rather, process 2400 can be used to tune other spring properties of columns 104 or other types of carbon nanotube structures.

At 2402, data relating several levels of tuning forces to values or ranges of values for one or more spring properties can be obtained. For example, such data can be obtained experimentally. A column (e.g., column 104) of a particular type (e.g., made using a particular growth recipe, having a particular size and shape, etc.) can be used to experimentally obtain data relating particular tuning force levels to particular values or ranges of values for one or more spring properties of that column type. For example, a first tuning force can be applied to an experimental column (not shown), which can be like column 104, in a direction that is generally parallel with a length of the column 104. After the first tuning force is applied to the experimental column, tests can be performed on the experimental column to determine values of one or more spring properties. For example, tests can be performed on the experimental column to measure its spring constant and the elastic range in which the spring constant is valid. The level of the first tuning force can then be noted and associated with the measured spring constant and elastic range. Then, a second tuning force that is greater than the first tuning force can be applied to the experimental column, and the resulting spring constant and elastic range of the column can again be measured. The level of the second tuning force can then be noted and associated with the measured spring constant and elastic range. This process of applying an increasingly larger tuning force to the column and noting the resulting spring constant and elastic range of the column can be repeated until resulting spring constants and elastic ranges have been noted for several tuning forces.

Table 1 illustrates experimental spring constant and elastic range data for a column 104 made using the exemplary recipe described above in which a substrate 202 can be placed in a furnace (not shown) heated to about 750° Celsius; a gas comprising xylene ($C_8H_{10}$) as a carbon source and ferrocene ($Fe(C_5H_5)_2$) as a catalyst can be mixed with a carrier gas (e.g., argon or another generally inert gas) and introduced (e.g., pumped) into the furnace (not shown); the ratio of ferrocene to xylene mixed with the carrier gas can be about one gram of ferrocene per one hundred milliliters of xylene; and the ferrocene/xylene mixture can be mixed with the carrier gas at a temperature of about 150° Celsius at a rate of about 6 milliliters per hour. For example, a column 104 can be selected as an "experimental" column to which successive tuning forces will be applied to determine the resulting spring constant and elastic range each tuning force imparts to the column 104. This selected column 104 can be termed "experimental" because this particular column 104 will be used to obtain the foregoing data rather than as a final working column 104 that will be integrated into a product (e.g., like contactor 2606, which will be discussed with respect to FIG. 26 or probe card assembly 3400, which will be discussed with respect to FIG. 34). After applying an initial tuning force of 0.6 grams to a free end (e.g., an end of the column that is configured to move or displace in response to an applied force) of the column 104 selected to be an experimental column, the experimental column 104 was found to have a spring constant of approximately 0.17 grams/micron within an elastic range of 0-5 microns of displacement of the free end. Similarly, after applying another tuning force of 0.7 grams to the free end of the experimental column 104, the experimental column 104 was found to have a spring constant of approximately 0.12 grams/micron within an elastic range of 0-10 microns of displacement of the free end. This process was then repeated with tuning forces of 0.8 grams, 0.9 grams, 1.0 grams, and 1.1 grams of force and the resulting spring contact and elastic range data in Table 1 below was obtained.

TABLE 1

| Tuning Force | Spring Constant | Elastic Range |
| --- | --- | --- |
| 0.6 grams | 0.17 grams/micron | 0-5 microns displacement |
| 0.7 grams | 0.12 grams/micron | 0-10 microns displacement |
| 0.8 grams | 0.10 grams/micron | 0-15 microns displacement |

TABLE 1-continued

| Tuning Force | Spring Constant | Elastic Range |
| --- | --- | --- |
| 0.9 grams | 0.09 grams/micron | 0-20 microns displacement |
| 1.0 grams | 0.08 grams/micron | 0-25 microns displacement |
| 1.1 grams | 0.07 grams/micron | 0-30 microns displacement |

The data in Table 1 is exemplary only and provided solely for purpose of discussion and illustration. Such data can vary for different types of columns. For example, the data can vary based on the recipe used to make the columns the size of the columns, the shape of the columns, etc.

Referring again to FIG. 24, once data relating levels of tuning force to values of particular spring properties is obtained at 2402, working columns of the same general type as the experimental column can be tuned to have particular values of the spring properties. These columns can be termed "working" because these columns will be used in products (e.g., like contactor 2606, which will be discussed with respect to FIG. 26 or probe card assembly 3400, which will be discussed with respect to FIG. 34). The working columns of carbon nanotubes should be generally similar to and of the same general type as the experimental column used at 2402. For example, the working columns can be made using the same or a similar recipe, generally the same or similar size, and/or generally the same or similar shape as the experimental column used to obtain the data at 2402.

Depending on the particular use or uses to which the working columns are to be put, a particular value or range of values of spring constant can be selected at 2404. Then, at 2406, the experimental data obtained at 2402 can be consulted to determine a tuning force level that is most closely associated with the values or ranges of values of spring constant selected at 2404. At 2408, the tuning force selected at 2406 can be applied to the working columns, which can impart to the working columns a spring constant that is approximately equal to the desired value of spring constant selected at 2404.

Figure 25:
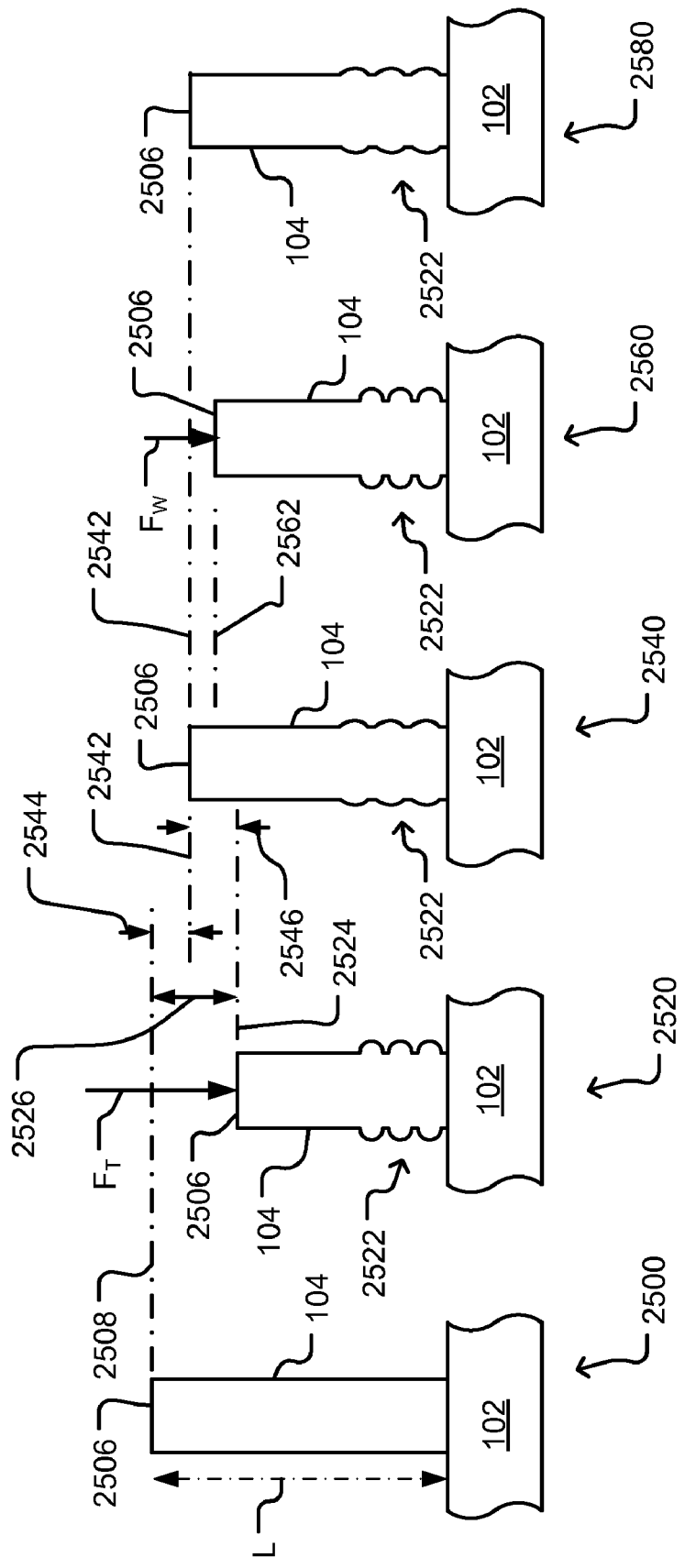
FIG. 25 illustrates an exemplary example of tuning a column of carbon nanotubes in accordance with the process of FIG. 24 according to some embodiments of the invention.

FIG. 25 illustrates a non-limiting example of 2404, 2406, and 2408 in process 2400 of FIG. 24 in which a column 104 on substrate 102 (see FIG. 1) can be tuned using the data in Table 1 above. FIG. 25 also illustrates exemplary behavior of the column 104 after the column 104 is tuned.

Column 104 in FIG. 25 can be any of the columns discussed herein and identified as an example of column 104, or any other column mentioned herein, such as columns 504, 704, 1404, 1604, 1804, 1904, 2204, 2304, and/or 2304'. Substrate 102 (and/or respective substrates for columns 504, 704, 1404, 1604, 1804, 1904, 2204, and/or 2304) can be a sacrificial substrate, an intermediate substrate, or a product substrate and can be the growth substrate on which column 104 was grown or can be a substrate to which column 104 was transferred from a growth substrate. Substrate 102 can thus be any of the substrates identified herein as an example of substrate 102. Moreover, if substrate 102 is wiring substrate 1502 or wiring substrate 1702, the tuning process illustrated in FIG. 25 can be performed on column 104 before or after any anchoring structure 1606 and/or 1806 is formed around column 104 and before or after any treatment of column 104 illustrated in FIGS. 19B-22. FIG. 25 includes partial views of substrate 102 showing one column 104. As can be seen in FIG. 1, however, a plurality (from two to hundreds, thousands, or hundreds of thousands or more) of columns 104 can be on substrate 102, and each column can be tuned (simultaneously, sequentially, or in groups).

Numerals 2500, 2520, and 2540 in FIG. 25 illustrate column 104 in various states during a tuning process in which a tuning force $F_T$ is applied (e.g., in a direction that is generally parallel to a length of the column) to a free end 2506 (which can be a non-limiting example of a contact end) of column 104, and numerals 2560 and 2580 in FIG. 25 illustrate tuned column 104 responding to a working force $F_W$ applied to the free end 2506 generally in a direction that is parallel to a length of the column 104. Free end 2506 can be an end of column 104 that can move in response to an applied force, and free end can thus be end 104 or 106 depending on the specific configuration of column 104 and can correspond to a contact end (e.g., like contact end 1904). Numeral 2500 illustrates column 104 in an initial state 2500 before a force has been applied to free end 2506. In initial state 2500, however, column 104 may have already undergone any one or more of the treatment processes illustrated, discussed, or mentioned herein including without limitation the treatment processes illustrated in FIGS. 19B-22B. Alternatively, in initial state 2500, column 104 may have undergone none of the treatment processes illustrated, discussed, or mentioned herein including without limitation the treatment processes illustrated in FIGS. 19B-22B.

Referring to process 2400 of FIG. 24, at 2404, a desired spring constant can be selected for column 104. The desired spring constant can be selected based on the end or product uses of the columns. For example, it may be determined that, given the particular end or product use of the columns 104, a spring constant of 0.10 grams/micron is desired. At 2406 in process 2400 of FIG. 24, a tuning force $F_T$ that will impart to column 104 a spring constant that is or is approximately 0.10 grams/micron can be determined. In this example, this can be accomplished by consulting Table 1 above, which shows that applying a tuning force $F_T$ of approximately 0.8 grams to free end 2506 of column 104 can tune column 104 to have a spring constant of 0.10 grams/micron within an elastic range of 0-15 microns of displacement of the free end 2506. Then at 2408 of process 2400, the tuning force $F_T$ can be applied to free end 2506 of column 104.

Referring to FIG. 25, state 2520 shows column 104 with tuning force $F_T$ applied to free end 2506. As depicted by state 2520 in FIG. 25, application of the tuning force $F_T$ can compress column 104 and cause reversibly deformable regions 2522 to form along a length of column 104, which can be generally perpendicular to the length of the column 104. Although three regions 2522 are shown on a column 104 in FIG. 25, there can be more than three such regions 2522 on a column 104 or less than three regions 2522 on a column 104. In some embodiments, there can be one reversibly deformable region 2522 on a column 104. Buckles or buckling regions in column 104 can be non-limiting examples of reversibly deformable regions 2522. As shown, the tuning force $F_T$ can be applied to free end 2506 in a direction that is generally parallel to a length of column 104, which in some embodiments can be generally perpendicular to a surface of substrate 102 to which column 104 is attached. In response, column 104 can compress in a direction that is generally parallel to the direction of the tuning force $F_T$, which can be generally parallel to the length L of the column 104 and generally perpendicular to the surface of substrate 102 to which column 104 is attached. As can be seen in FIG. 25, the reversibly deformable regions 2522 can be generally perpendicular to the length L of column 104. Typically, the greater the tuning force $F_T$ the greater the number of reversibly deformable regions 2522 that form. Each reversibly deformable region 2522 can have spring properties and can function as an individual spring. A plurality of such reversibly deformable regions 2522 along the length of column 104 can function like a plurality of springs in series, and the spring properties of the column 104 can comprise a series sum of the spring properties of the deformable regions 2522. For example, a spring constant of column 104 can comprise a series sum of the spring constants of each of the deformable regions 2522. (As is known, a series sum of spring constants (or other spring properties) for "n" springs in series can be obtained in accordance with following equation: $1/k_{sum} = (1/k_a) + (1/k_b) + (1/k_c) \ldots + (1/k_n)$, where $k_{sum}$ is the series sum of the spring constants of a first spring with a spring constant $k_a$, a second spring with a spring constant $k_b$, a third spring with a spring constant $k_c$, and an "nth" spring with a spring constant $k_n$. Thus, for example, the series sum of five springs in series each with a spring constant of one (1) can be as follows: $k_{sum} = k/5$, where $k_{sum}$ is the series sum of the spring constants k of each of the five springs in series.) Reversibly deformable regions 2522 along with inherent spring properties of column 104 can be non-limiting examples of a spring mechanism or mechanisms in the column between free end 2506 and the end (which can be a non-limiting example of a base end) of column that is attached to substrate 102. Although shown grouped together, the reversibly deformable regions 2522 need not be adjacent to each other. As mentioned, buckles and/or buckling regions can be non-limiting examples of reversibly deformable regions.

As depicted by state 2520 in FIG. 25, the tuning force $F_T$ can compress column 104 and displace free end 2506 an initial compression distance 2526, which can be a difference between an initial position 2508 of free end 2506 prior to application of the tuning force $F_T$ and a position 2524 of free end 2506 upon application of the tuning force $F_T$. State 2540 shows column 104 after removal of the tuning force $F_T$. As depicted by state 2540 in FIG. 25, free end 2506 can move to a recovery position 2542, due at least in part to the spring action of reversibly deformable regions 2522. The distance 2546 free end 2506 moves to the recovery position 2542 can represent the elastic recovery of column 104, and the distance between recovery position 2542 and the initial position 2508 can represent plastic deformation 2544 of column 104 in response to the tuning force $F_T$.

Column 104 is now tuned to have a particular spring constant. In the non-limiting example being discussed, column 104 is assumed to have the properties illustrated in Table 1 above, and as discussed above, the tuning force $F_T$ applied to the column was 0.8 grams. Per Table 1 above, column 104 can now have a spring constant of 0.10 grams/micron within an elastic range of 0-15 microns of displacement. Thereafter, column 104 can function as a spring with a spring constant of 0.10 grams/micron within an elastic range of 0-15 microns of displacement of free end 2506. As long as forces less than the tuning force $F_T$ (e.g., in this example, less than 0.8 grams) are applied to free end 2506, column 104 can maintain a generally constant spring constant of 0.10 grams/micron.

States 2560 and 2580 in FIG. 25 illustrate an example in which a working force $F_W$ that is less than the tuning force $F_T$ is applied to free end 2506. As illustrated by column 104 in state 2560, the working force $F_W$ can cause column 104 to compress generally in a direction that is parallel to the length L of the column 104 (e.g., reversibly deformable regions 2522 compress), which can move free end 2506 from position 2542 to position 2562. As illustrated by column 104 in state 2580, upon removal of working force $F_W$, free end 2506 of column 104 can move substantially back to position 2542 and thus undergo substantial elastic recovery. Column 104 can continue to undergo substantial elastic recovery (e.g., move substantially back to position 2542) in response to repeated applications and then removals of a working force $F_W$ that is less than the tuning force $F_T$. As mentioned, a force greater than the tuning force $F_T$ applied to free end 2506 can function as a new tuning force, which can create an additional reversibly deformable region or reversibly deformable regions 2522 along the length of column 104, which can change the spring constant. For example, continuing with the non-limiting example utilizing Table 1, application of a new tuning force to free end 2506 of 1.0 grams or approximately 1.0 grams can cause column 104 to have a spring constant of 0.08 grams/micron or approximately 0.08 grams/micron within an elastic range of 0-25 microns displacement or approximately 0-25 microns displacement. Thereafter, column 104 can react to application of working forces that are less than the new tuning force generally as shown in states 2560 and 2580 in FIG. 25.

Figure 26:
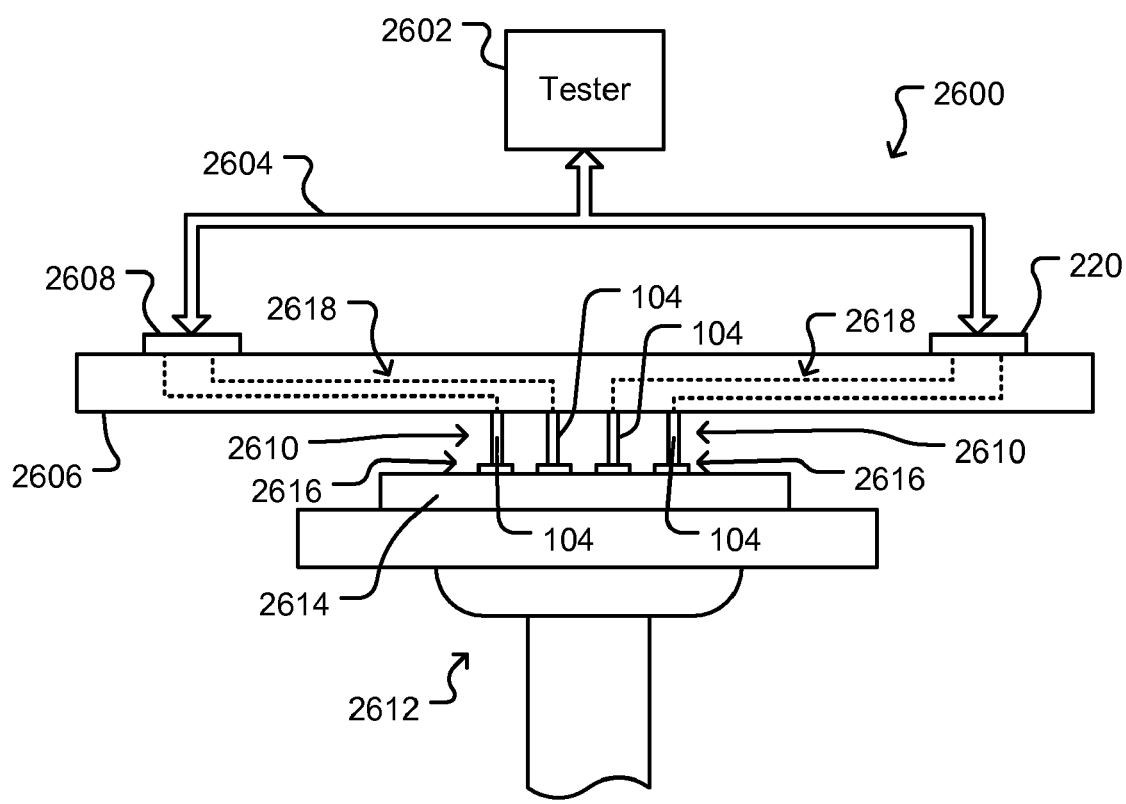
FIG. 26 illustrates an exemplary test system that includes a contactor with probes comprising columns of carbon nanotubes according to some embodiments of the invention.

Columns of carbon nanotubes like columns 104, which as discussed above, can be vertically aligned carbon nanotube columns, can be used in many applications. For example, columns 104 can be electromechanical spring probes in a test system for testing devices, such as electronic devices. FIG. 26 illustrates an exemplary test system 2600 according to some embodiments of the invention in which electromechanical probes 2610 comprise columns of carbon nanotubes like columns 104. As shown, test system 2600 can include a tester 2602 configured to control testing of one or more electronic devices under test (DUTs) 2614. A DUT can thus be an electronic device. A plurality of communications channels 2604 and a contactor 2606 can provide a plurality of electrical paths for power and ground and test, response, and other signals between the tester 2602 and DUT 2614. Tester 2602 can test DUT 2614 by generating test signals that are provided through communications channels 2604 and contactor 2606 to ones of terminals 2616 of DUT 2614. The tester 2602 can then evaluate response signals generated by DUT 2614 in response to the test signals. The response signals can be sensed at ones of terminals 2616 of DUT 2614 and provided to the tester 2602 through contactor 2606 and communications channels 2604.

Tester 2602 can comprise electronic control equipment such as one or more computers or computer systems. Contactor 2606 can comprise an electrical interface 2608, electrically conductive spring probes 2610, and electrical connections 2618 (e.g., electrically conductive traces and/or vias on or in contactor 2606) through contactor 2606 between the electrical interface 2608 and the probes 2610. A layout and number of the probes 2610 can correspond generally to a layout and number of terminals 2616 of DUT 2614 so that ones of probes 2610 can contact ones of terminals 2616 and thereby make pressure-based electrical connections with the ones of the terminals 2616. DUT 2614 can be disposed on a moveable chuck 2612, which can move DUT 2614 to align ones of terminals 2616 with ones of probes 2610 and then move DUT 2614 such that the aligned terminals 2616 and probes 2610 are brought into contact with enough force to establish electrical connections between the aligned probes 2610 and terminals 2616. Alternatively or in addition, contactor 2606 can be moved. Electrical interface 2608—which can comprise an electrical interface to channels 2604—can be connected to communications channels 2604, which can comprise electrical paths to and from tester 2602. While electrical interface 2608 is connected to communications channels 2604 and probes 2610 are in contact with terminals 2616, the communications channels, contactor 2606 (including electrical interface 2608 and probes 2610) can provide a plurality of electrical paths between the tester 2602 and terminals 2616 of DUT 2614. Additionally, one or more intermediary substrates (not shown) can be disposed between probes 2610 and contactor 2606.

DUT 2614 can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and any other type of electronic device or devices. DUT 2614 in FIG. 26 can thus be one or more of any of the foregoing devices or similar devices. As is known, a semiconductor die can comprise a semiconductor material into which an electric circuit is integrated, and terminals 2616 can be bond pads that provide electrical connections to and from the electric circuit.

As mentioned, probes 2610 can comprise columns of carbon nanotubes, which can be vertically aligned nanotube columns. For example, probes 2610 can comprise columns 104, which can be columns 104 made using any process described herein (e.g., columns 504, 704, 1404, 1604, 1804, 2204, 2304, and 2304') and can also include columns 104 after any one or more of the treatments described herein (e.g., as shown in any of FIGS. 19A-22B). Moreover, columns 104 that compose probes 2610 can be anchored to contactor 2606 and/or electrically connected to a terminal or other electrical element of contactor 2606 in any manner described herein including any one or more of the examples shown in FIGS. 11A, 11B, and 15A-18B.

Figure 27:
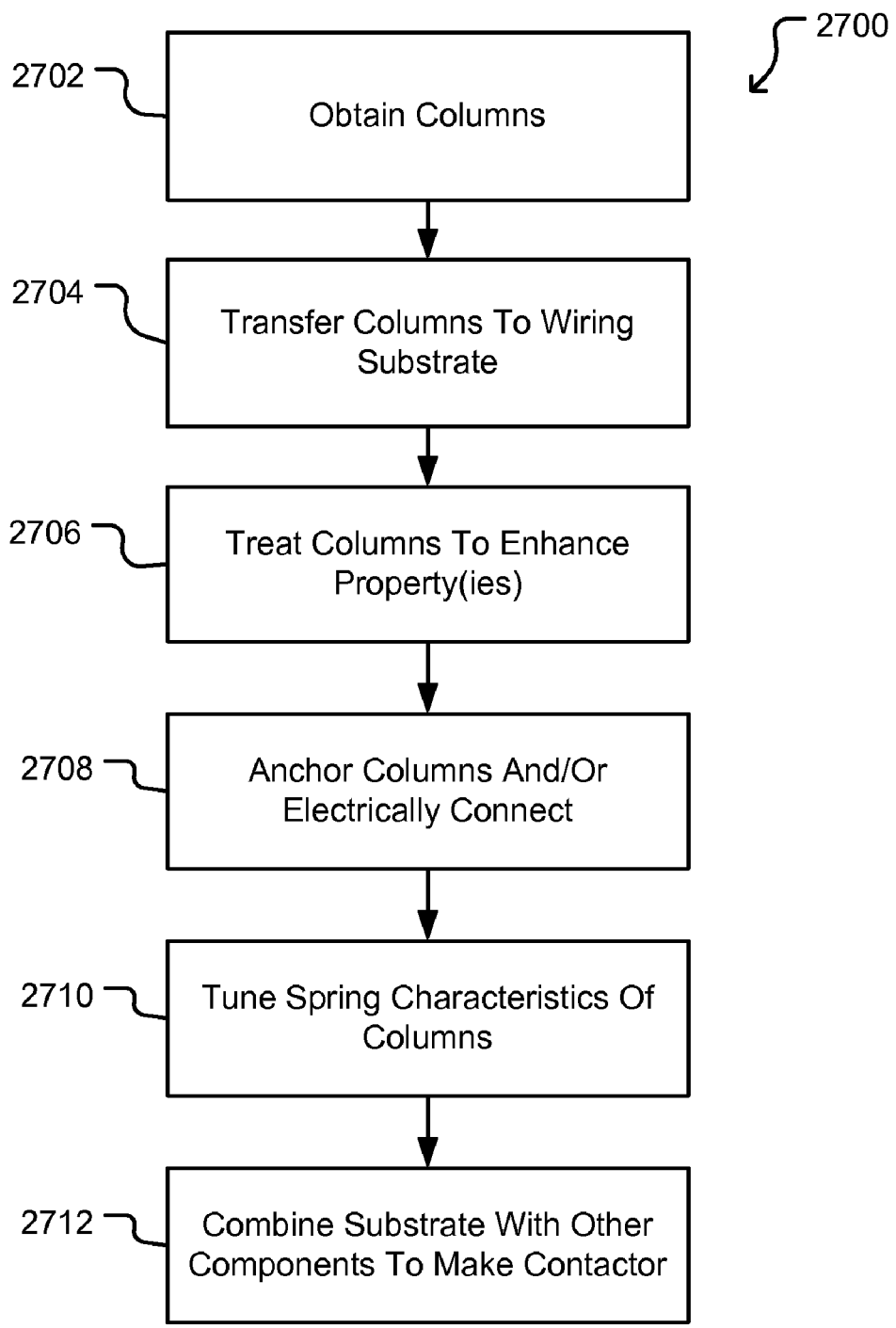
FIG. 27 illustrates an exemplary process for making a contactor in the form of a probe card assembly according to some embodiments of the invention.

FIG. 27 illustrates an exemplary process 2700 of making contactor 2606 with probes 2610 comprising columns of carbon nanotubes according to some embodiments of the invention, and FIGS. 28-34 illustrate an exemplary implementation of process 2700 in which an exemplary contactor 2606 in the form of a probe card assembly 3400 with probes that comprise columns 104 can be made. Nevertheless, process 2700 is not limited to making a contactor 2606 in the form of a probe card assembly 3400 or a contactor 2606 with probes 2610 that comprise columns 104. For example, process 2700 can be used to make a contactor 2606 with probes 2610 comprising other types of columns of carbon nanotubes.

Figure 28:
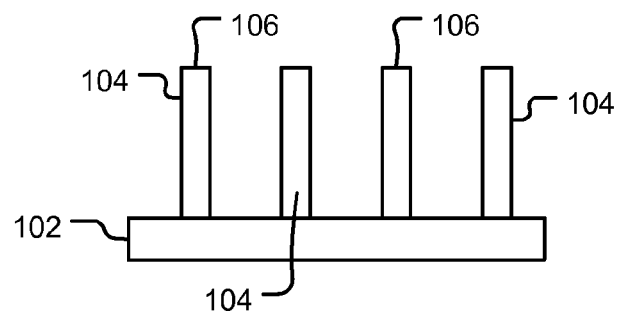
FIGS. 28-34 illustrate an example of the process of FIG. 27 in which a probe card assembly shown in FIG. 34 is made according to some embodiments of the invention.

As shown in FIG. 27, columns of carbon nanotubes can be obtained at 2702. Obtaining columns at 2702 can comprise obtaining previously grown columns, or obtaining the columns at 2702 can comprise growing the columns. FIG. 28 illustrates a non-limiting example of 2702 of FIG. 27. As shown in FIG. 28, obtaining columns 2702 can comprise obtaining columns 104 on substrate 102, which can be the growth substrate on which columns 104 were grown or can be an intermediate substrate to which columns 104 were transferred and on which columns 104 are transported or shipped.

Figure 29:
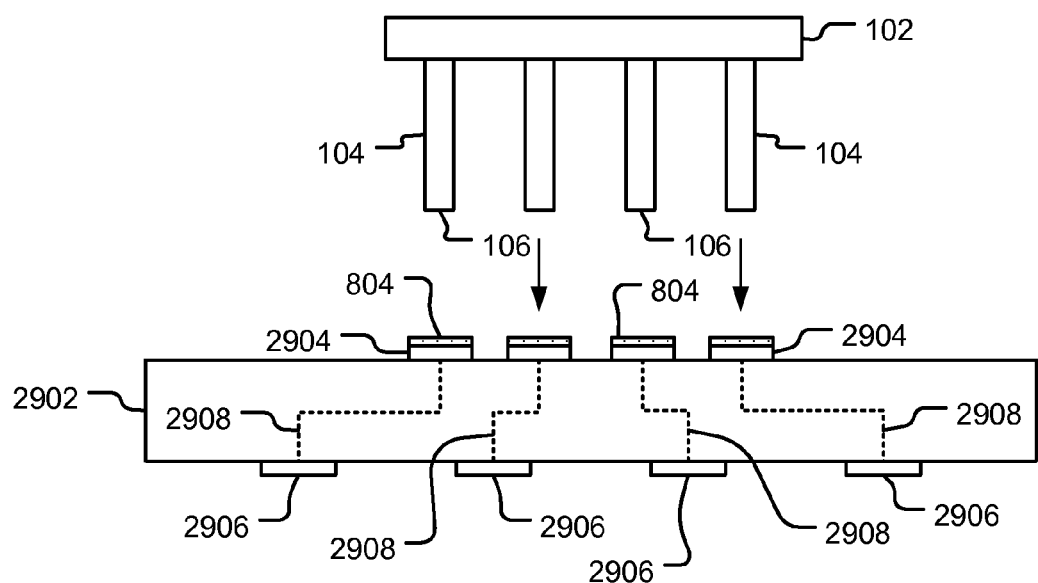
Figure 30:
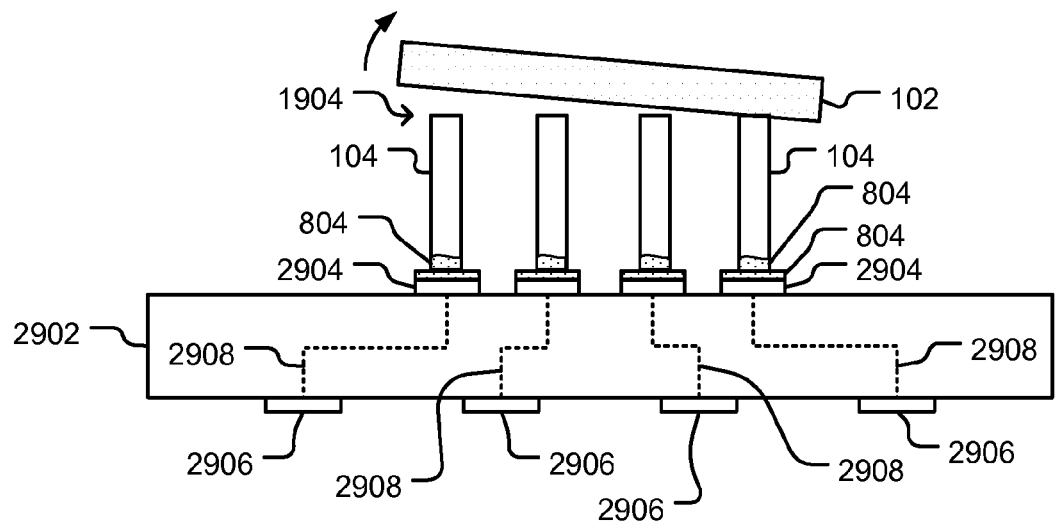

Referring again to FIG. 27, the columns obtained at 2702 can be transferred to a wiring substrate at 2704 (which can be a non-limiting example of arranging the columns on a first wiring substrate). The transferring at 2704 can be accomplished using any of the transfer processes described herein including the transfer processes illustrated in FIGS. 2-5B and FIGS. 6 and 7. FIGS. 29 and 30 illustrate a non-limiting example in which columns 104 are transferred from substrate 102 to a wiring substrate 2902, which can comprise electrically conductive terminals 2904 on one surface, electrically conductive terminals 2906 on an opposite surface, and electrical paths 2908 (e.g., traces and/or vias) on and/or through wiring substrate 2902. (Electrical paths 2908 can be non-limiting examples of electrical connections.) As shown in FIG. 29, adhesive 804 can be deposited on terminals 2904, and ends 106 of columns 104 can be brought into contact with the adhesive 804 generally as shown, for example, in FIG. 10. As discussed above, adhesive 804 can be a curable, electrically conductive adhesive. After ends 106 of columns 104 are brought into contact with adhesive 804, adhesive 804 can be cured. For example, adhesive 804 can be cured by heating the adhesive 804, by allowing the adhesive 804 to be exposed to ambient air for a particular period of time, or any other suitable manner. As shown in FIG. 30, substrate 102 can be peeled away from columns 104, which can be accomplished generally in the same manner as discussed above with respect to FIG. 9. The peeling away of substrate 102 shown in FIG. 30 can occur after adhesive 804 is cured.

As discussed above with respect to FIGS. 19A and 19B, adhesive 804 can wick into columns 104. Thus, transferring columns 104 from substrate 102 to wiring substrate 2902 at 2704 in FIG. 27 can result not only in columns 104 being attached at ends 106 to terminals 2904 of wiring substrate 2902 but can also result in each column 104 comprising adhesive 804 wicked into the column 104. As discussed above with respect to FIGS. 19A and 19B, adhesive 804 can wick only a short distance into column 104 along the length of column 104, adhesive 804 can wick into column 104 along all or substantially all of the length of column 104, or adhesive can wick a distance into column 104 that is between the foregoing extremes. In FIG. 30, adhesive 804 is shown wicked only a short distance into columns 104 generally as shown in FIG. 19B.

Rather than adhere columns 104 to terminals 2904 as shown in FIG. 29, pits (e.g., like pits 1705 in FIGS. 17A and 17B) can be formed or provided in wiring substrate 2902, and columns 104 can be adhered to wiring substrate 2902 in the pits (not shown). For example, adhesive 804 can be deposited in the pits (not shown), and ends 106 of columns 104 can be inserted into the pits (not shown). The adhesive 804 can then be cured and substrate 102 can be peeled away from columns 104 as discussed above.

As an exemplary alternative to the example shown in FIGS. 29-31, 2704 of FIG. 27 can alternatively can accomplished by transferring columns 104 to wiring substrate 2902 using any of the examples discussed above respect to FIGS. 11A and 11B. For example, wiring substrate 2902 in FIGS. 28-34 can thus effectively be replaced with wiring substrate 1102 of FIGS. 11A and 11B.

Figure 31:
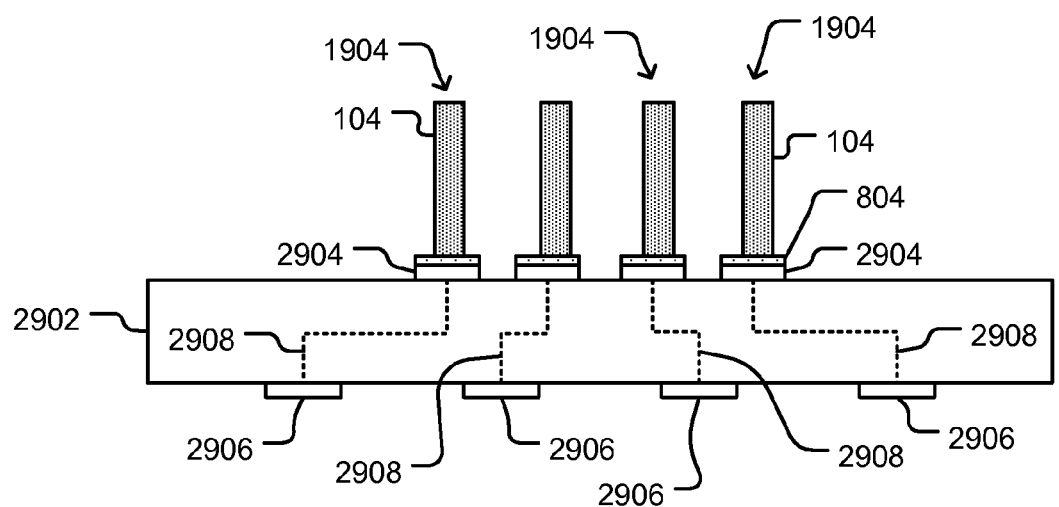

As exemplary alternative, 2702 and 2704 of FIG. 27 can be replaced by actions in which columns 104 are grown on wiring substrate 2902. For example, columns 104 can be grown on wiring substrate 2902 in the same or similar way as columns 1604 are grown on wiring substrate 1502 in FIGS. 15A-16B, or columns 104 can be grown on wiring substrate 2902 in the same or similar way as columns 1804 are grown on wiring substrate 1702 in FIGS. 17A-18B. For example, wiring substrate 2902 in FIGS. 28-34 can thus effectively be replaced with wiring substrate 1502 of FIGS. 15A-16B or wiring substrate 1702 of FIGS. 17A-18B. As still another exemplary alternative to 2702 and 2704 in FIG. 27, columns 104 can be obtained at 2702 attached to wiring substrate 2902, for example, as shown in FIG. 31. In this case, 2704 of FIG. 27 need not be performed.

Returning to a discussion of process 2700 of FIG. 27, at 2706, columns 104 can be treated to enhance one or more properties of columns 104. For example, as illustrated in FIG. 20, contact ends 1904 can be treated—e.g., etched such as by reactive ion etching or sputter etching—to create structures 1912 protruding from contact ends 1904. As another example, electrically conductive material can be deposited on (e.g., on the outside of) and/or embedded within columns 104 as generally shown in and discussed above with respect to FIG. 21. As discussed above, the foregoing can enhance the electrical conductivity of columns 104. Optionally, columns 104 can be grown with or made to have a hollow portion like the hollow portion 2208 of column 2204 shown in FIGS. 22A and 22B, and the hollow portion can be filled with an electrically conductive material (e.g., like material 2210 in FIGS. 22A and 22B), which can alternatively or in addition enhance the electrical conductivity of columns 104.

FIG. 31 illustrate a non-limiting example in which conductive material is embedded on or within columns 104 (e.g., on and/or around individual carbon nanotubes and/or between individual carbon nanotubes that compose a columns 104) using atomic layer deposition or chemical vapor deposition or a similar technique as generally discussed above with respect to FIG. 21. The presence of conductive material on or embedded within columns 104 (e.g., on and/or around individual carbon nanotubes and/or between individual carbon nanotubes that compose a column 104) is indicated by the dark shading of columns 104 in FIG. 31. This can make columns 104 generally like column 104 shown in FIG. 21. Although not shown, contact ends 1904 of columns 104 in FIG. 31 can have protruding structures like structures 1912 shown in FIG. 20.

Figure 32:
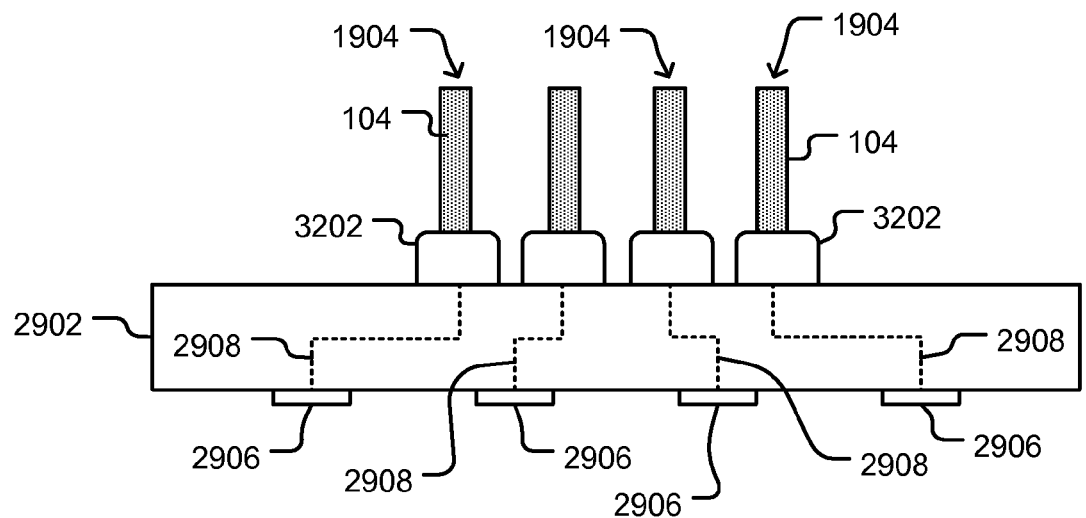

Referring again to process 2700 of FIG. 27, actions can be taken at 2708 to anchor the columns to the wiring substrate, and/or actions can be taken to electrically connect columns to the terminals of the wiring substrate at 2708. A non-limiting example is shown in FIG. 32, which shows anchoring structures 3202 provided or formed on wiring substrate 2902 and around columns 104. For example, anchoring structures 3202 can be like, and can be made like, anchoring structures 1606 in FIGS. 16A and 16B. Anchoring structures 3202 can be electrically conductive and can thus electrically connect, or enhance an electrical connection between, columns 104 and terminals 2904 on wiring substrate 2902. Alternatively, anchoring structures 3202 can be like anchoring structures 1806 show in FIGS. 18A and 18B, which as shown in FIGS. 18A and 18B, can connect to electrically conductive traces (e.g., like traces 1807 in FIGS. 18A and 18B) on wiring substrate 2902. For example, if, as discussed above, columns 104 are disposed in pits (e.g., like pits 1705 in FIGS. 17A and 17B) that are spaced away from terminals 2904 (e.g., like pits 1705 are spaced away from terminals 1704 in FIGS. 17A and 17B), such traces can electrically connect anchoring structures 3202—and thus columns 104—to terminals 2904 on wiring substrate 2902.

Referring again to process 2700 of FIG. 27, one or more spring properties of the columns can be tuned at 2710. For example, one or more spring properties of columns 104 can be tuned in accordance with the tuning techniques illustrated in and discussed above with respect to FIGS. 24 and 25. For example, once data relating various tuning force levels to particular spring properties are obtained at 2402 in FIG. 24 for columns like columns 104, a tuning force that will impart one or more desired spring properties to columns 104 can be determined at 2406 as generally discussed above with respect to FIG. 24, and the selected tuning force can be applied (e.g., as in 2408 of FIG. 24) to contact ends 1904 of columns 104 to impart to the columns 104 the desired spring properties. For example, as discussed above with respect to FIGS. 24 and 25, columns 104 can be tuned to have a particular spring constant value (or a spring constant value that is within a desired range of spring constant values) by applying a particular tuning force to the contact ends 1904 of the columns 104.

Figure 33:
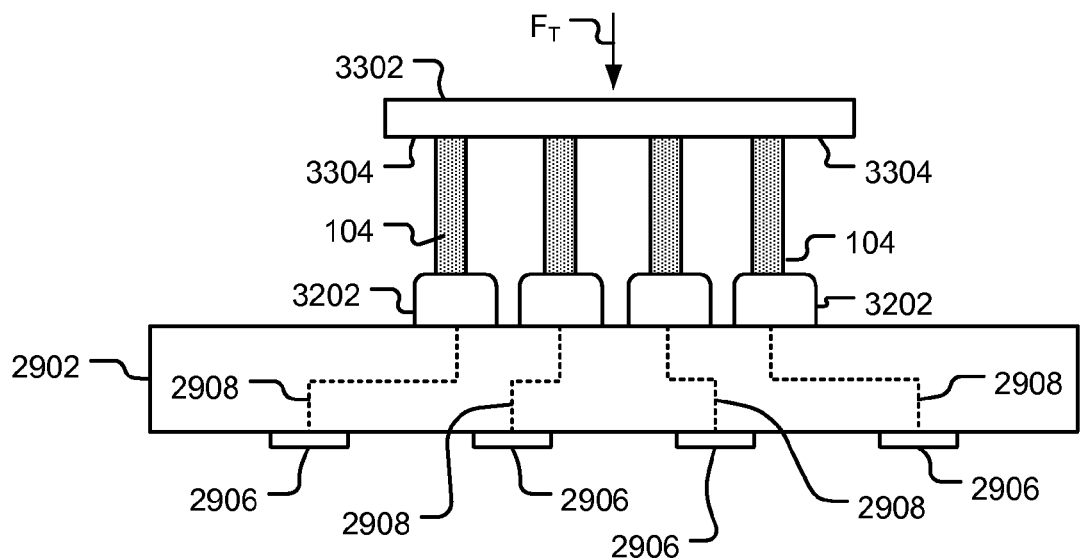

The tuning force can be applied to each column 104 individually. Alternatively, as shown in FIG. 33—which illustrates a non-limiting example according to some embodiments—a generally planar surface 3304 of a plate 3302 can be pressed against contact ends 1904 of columns 104 with the selected tuning force $F_T$, which can apply the tuning force $F_T$ simultaneously to contact ends 1904 of a plurality (including all or less than all) of columns 104. In addition to tuning spring properties of columns 104, use of the plate 3302 shown in FIG. 33 can also planarize the contact ends 1904 of columns 104. For example, after application of tuning force $F_T$ to plate 3302, contact ends 1904 of columns 104 can be located generally in a plane in space that corresponds to a plane of surface 2608.

Figure 34:
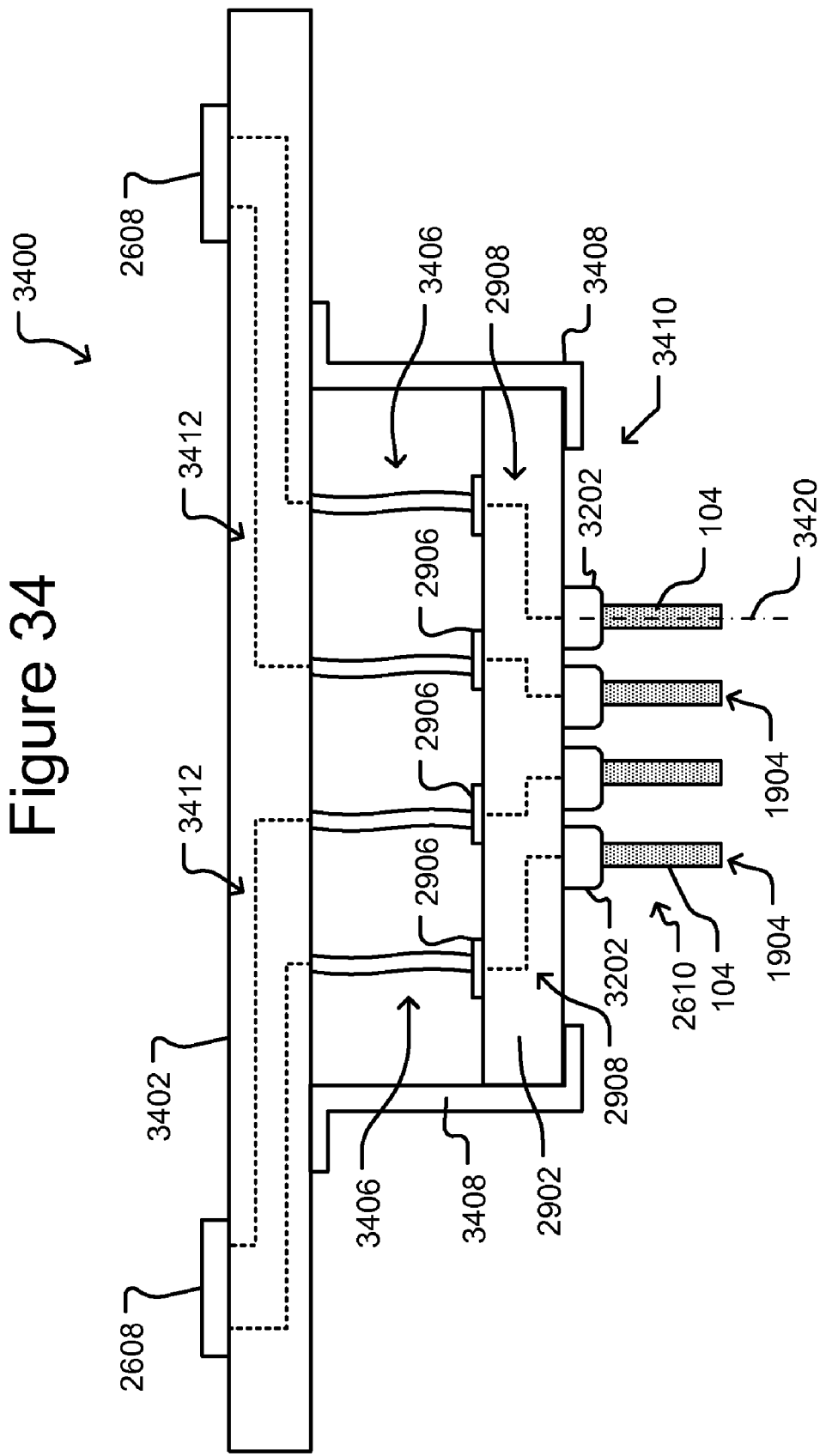

Referring again to process 2700 of FIG. 27, the wiring substrate can be combined at 2712 with one or more components to form contactor 2606. FIG. 34 shows a non-limiting example in which wiring substrate 2902 is combined with an interface substrate 3402 and electrical interconnectors 3406 to form a probe card assembly 3400, which can be a non-limiting example of the contactor 2606 of the test system 2600 in FIG. 26. As shown in FIG. 34, interface substrate 3402 can comprise a board or other substrate structure with electrical interface 2608 to communications channels 2604 (see FIG. 26), and interface substrate 3402 can comprise wiring 3412 (e.g., electrically conductive traces and/or vias on or in the interface substrate 3402) through interface substrate 3402 to electrical interconnectors 3406. Interface substrate 3402 can be, for example, a printed circuit board or other type of wiring board.

Electrical interconnectors 3406 can be any electrical connectors that can electrically connect ones of wiring 3412 and terminals 2906 of wiring substrate 2902. In some embodiments, electrical interconnectors 3406 can be flexible or compliant. Non-limiting examples of electrical connectors 3406 include electrical wires, electrically conductive springs, and solder. Other non-limiting examples of interconnectors 3406 include electrically conductive posts, balls, pogo-pins, and bump structures.

An interposer (e.g., like interposer 4300 shown in FIGS. 43A and 43B) is yet another non-limiting example of electrical interconnectors 3406. An interposer can, in some embodiments, comprise a wiring substrate (e.g., 4302 of FIGS. 43A and 43B) that can be disposed between interface substrate 3402 and wiring substrate 2902. A first set of electrically conductive spring contacts (e.g., like 104 extending from one side of 4302 in FIGS. 43A and 43B) can extend from the interposer wiring substrate (not shown) to wiring 3412, and a second set of electrically conductive spring contacts (e.g., like 104 extending from the other side of 4302 in FIGS. 43A and 43B) can extend from the interposer wiring substrate to terminals 2906 on wiring substrate 2902. The first set of electrically conductive spring contacts can be electrically connected (e.g., by 4308 in FIG. 43B) through the interposer wiring substrate to the second set of electrically conductive spring contacts.

Wiring substrate 2902—which together with terminals 2906 and probes 2610 comprising columns 104 can compose a probe head 3410—can be attached to the interface substrate 3402 by brackets 3408. Alternatively, wiring substrate 2902 can be attached to interface substrate 3402 by other means including without limitation screws, bolts, clamps, and/or other types of fasteners. In some embodiments, wiring substrate 2902 can be attached to another component of probe card assembly 3400 (e.g., a stiffener plate (not shown) or an attachment structure by which probe card assembly 3400 is attached to or mounted in or on a test housing (not shown)). In some embodiments, probe card assembly 3400 can comprise a plurality of probe heads like probe head 3410, and the position or orientation of one or more of the probe heads (e.g., like probe head 3410) can be independently adjustable. If electrical interconnectors 3406 are flexible, electrical interconnectors 3406 can maintain electrical connections between wiring 3412 and terminals 2906 even as a position or orientation of probe head 3410 (or multiple probe heads 3410 if probe card assembly 3400 has multiple probe heads 3410) is adjusted or changed with respect to interface substrate 3402.

As mentioned, probe card assembly 3400 can be an example of contactor 2606 and can thus be used as contactor 2606 in test system 2600. Probes 2610 of probe card assembly 3400 can make pressure based electrical connections with terminals 216 of DUT 2614 as, for example, chuck 2612 moves ones of terminals 2616 into contact with ones of probes 2610 (e.g., columns 104 in FIG. 34).

Probe card assembly 3400 in FIG. 34 is exemplary only, and many variations are possible. For example, as mentioned above, wiring substrate 1102 in FIGS. 11A and 11B can be substituted for wiring substrate 2902 in FIG. 34. As also mentioned above, columns 104 can be grown on wiring substrate 2902 rather than being transferred from substrate 102 to wiring substrate 2902. Thus, for example, 2702 and 2704 in process 2700 of FIG. 27 can be replaced with actions of growing columns 104 on terminals 2906 of wiring substrate 2902. For example, the process illustrated in FIGS. 15A-16B can be used to grow columns 104. Thus, in some embodiments, wiring substrate 2902 in probe card assembly 3400 of FIG. 34 can be replaced with wiring substrate 1502 with columns 1604 (in place of columns 104 in FIG. 34) as shown in FIGS. 16A and 16B. As another example, the process illustrated in FIGS. 17A-18B can be used to grow columns 104. Thus, in some embodiments, wiring substrate 2902 in probe card assembly 3400 of FIG. 34 can be replaced with wiring substrate 1702 with columns 1804 (in place of columns 104 in FIG. 34) as shown in FIGS. 18A and 18B.

Process 2700 of FIG. 27 is exemplary only and many variations are possible. For example, in addition to exemplary variations already mentioned, the order of 2702, 2704, 2708, 2710, and/or 2712 can be changed in some embodiments. For example, 2710 can be performed before 2704, 2706, and/or 2708. As another example, 2708 can be performed before 2706. As yet another example, 2712 can be performed before 2706, 2708, and/or 2710.

The probe card assembly 3400 shown in FIG. 34 is but one example of a contactor 2606 (see FIG. 26). Contactor 2606 can take other forms. For example, contactor 2606 can comprise a flexible membrane contactor. As yet another example, contactor 2606 can consist essentially of wiring substrate 2902. For example, after columns 104 are tuned and/or planarized as shown in FIG. 33, wiring substrate 2902 can be contactor 2606. For example, terminals 2906 can be electrical interface 2608 in FIG. 26, and columns 104 can be probes 2610. Many other variations are possible.

Figure 35:
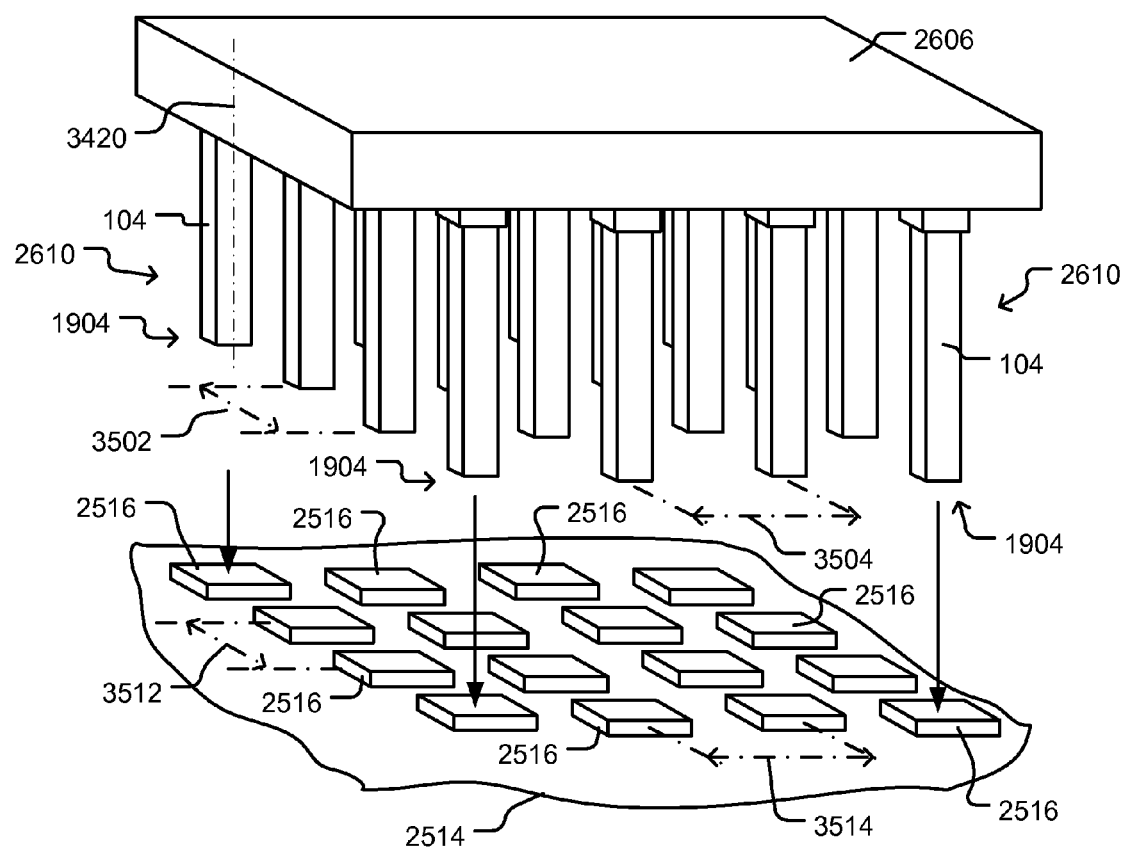
FIG. 35 shows a perspective view of the contactor of FIG. 26 with probes, which comprise columns of carbon nanotubes, in a pattern that corresponds to a pattern of terminals of the electronic device or devices to be tested according to some embodiments of the invention.

Regardless of the form or embodiment of contactor 2606, there are several possible advantages of columns 104 of vertically aligned carbon nanotubes as probes 2610 over conventional probes. FIG. 35, which shows a perspective view of wiring substrate 2606 with columns 104 as probes and a partial perspective view of DUT 2514 with terminals 2516 (which can be, for example, bond pads), illustrates examples of such advantages. For example, as shown, contact ends 1904 (which as mentioned above can correspond to end 106 or end 108 of columns 104) of columns 104 (which compose probes 2610) can be disposed in a pattern that corresponds to a pattern of ones of terminals 2516 on DUT 2514. A pitch 3512 and/or 3514 of terminals 2516 can be defined as a distance (corresponding to 3512 and/or 3514) between centers of adjacent terminals 2516 as shown in FIG. 35. A pitch 3502 and/or 3504 of columns 104 can similarly be defined as a distance (corresponding to 3502 and/or 3504) between centers of contact ends 1904 of adjacent columns 104 as also shown in FIG. 35. A pitch 3502 of columns 104 can be approximately equal (e.g., within an acceptable tolerance or margin of error) to a pitch 2512 of terminals 2516.

In some embodiments, each column 104 can move (e.g., compress, buckle, deform, etc.) substantially only generally along a vertical axis 3420 that is oriented along a length of the column 104 in response to contact with a terminal 2516, which can product a force on contact ends 1904 that can be generally parallel with vertical axis 3420 (which can be generally parallel with the lengths of columns 104). In some embodiments, vertical axis 3420 can also be generally perpendicular to the surface of wiring substrate 2902 from which columns 104 extend, which can also be generally perpendicular to the surface of DUT 2514 on which terminals 2516 are disposed. Vertical axis 3420 can also be generally parallel to a direction of a force against contact end 1904 of a probe 2610 arising from contact between the probe 2610 and a terminal 2516. Because movement of contact ends 1904 is substantially only along vertical axis 3420, a pitch 3502 and/or 2504 of columns 104 can be significantly smaller (or tighter) than probes (not shown) whose movement in response to contact with terminals (e.g., like terminals 2516) of a DUT (e.g., like DUT 2514) includes a substantial component that is not along vertical axis 3420. This is because any component of the movement of adjacent probes that is perpendicular to vertical axis 3420 can cause contact portions of the adjacent probes to move toward each other. A minimum pitch for such probes typically must be greater than the amount of movement of the contact portions of adjacent probes towards each other; otherwise, contact portions of adjacent probes could contact each other. In some embodiments, a pitch 3502 and/or 3504 at least as small (or tight) as twenty microns can be achieved for columns 104 shown in FIG. 35, which means that columns 104 shown in FIG. 35 can contact a DUT 2514 with terminals 2516 with a pitch 3512 and/or 3514 as small (or tight) as twenty microns. In some embodiments, a pitch 3502 and/or 3504 of less than twenty microns can be achieved for columns 104 shown in FIG. 35.

As will be discussed in more detail below with respect to FIG. 44, columns 104 can be attached to terminals 2516 of DUT 2514 rather than to contactor 2606. In such a case, probes 2610 on contactor 2606 (or probe card assembly 3400) can be replaced with flat terminals configured to contact columns 104 extending from terminals 2516. Otherwise, test system 2600 of FIG. 26 and test process 3600 of FIG. 36 (to be described below) can be and can operate generally the same as shown and described.

Figure 36:
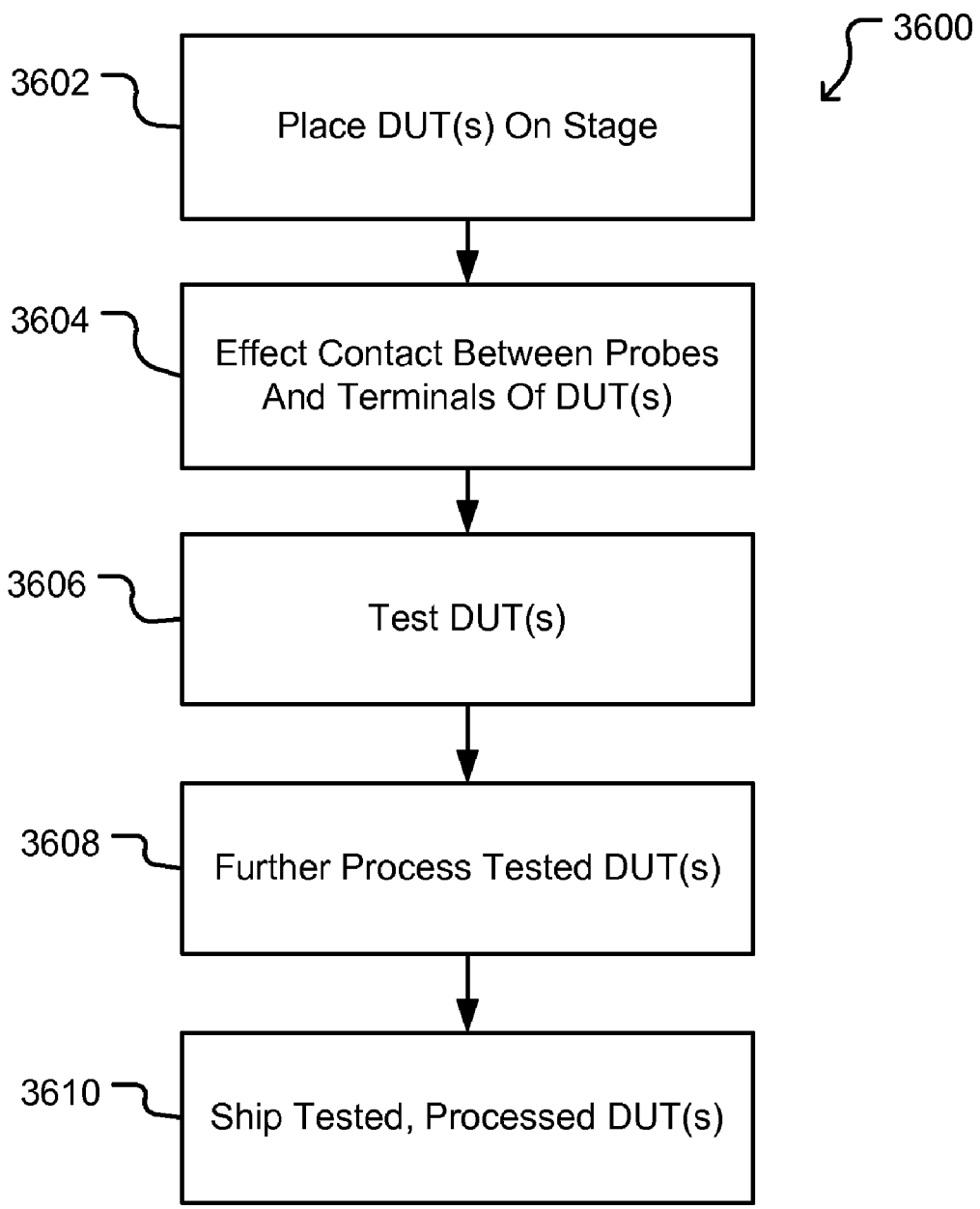
FIG. 36 illustrates an exemplary process for testing and further processing an electronic device or devices in a test system like the test system of FIG. 26 according to some embodiments of the invention.

FIG. 36 illustrates an exemplary process 3600 for testing DUTs (e.g., like DUT 2614) in a test system like test system 2600 of FIG. 26. As shown in FIG. 36, one or more DUTs can be placed on a stage at 3602. For example, one or more DUTs 2614 can be placed on stage 2612 of test system 2600 of FIG. 26. Referring again to process 3600 of FIG. 36, ones of probes 2610 (which as discussed above can comprise columns 104 as shown in FIGS. 34 and 35) and ones of terminals 2516 of DUT 2614 can be brought into contact at 3604. For example, stage 3602 can be moved to align ones of terminals 2516 with ones of probes 2610, and stage can then be moved to bring the aligned ones of terminals 2516 and probes 2610 into contact with each other. Alternatively or in addition, contactor 2606 can be moved. The foregoing contact between the ones of probes 2610 and terminals 2516 can establish temporary, pressured based electrical connections between the ones of probes 2610 and terminals 2516. This contact between the ones of the probes 2610 and the ones of the terminals 2516 can generate a force on probes 2610 (and thus columns 104) at contact end 1904 that is generally parallel with a length of columns 104, which can cause the columns 104 to deform elastically and in a direction that is generally parallel to the length of the column and the direction of the force.

Referring again to FIG. 36, DUT 2514 can be tested at 3606. For example, tester 2602 in FIG. 26 can send power and ground and test signals to circuitry integrated into DUT 2514 through communications channels 2604 and contactor 2606 to ones of the DUT terminals 2616 that probes 2610 are in contact with, and tester 2602 can sense response signals generated by DUT 2514 (e.g., by the circuitry integrated into DUT 2514) in response to the test signals by sensing the response signals through ones of probes 2610 that are in contact with DUT terminals 2616, contactor 2606, and communications channels 2604. Tester 2602 can then compare the sensed response signals to expected response signals. If the sensed response signals are the same as expected response signals, the tester 2602 can conclude that DUT 2514 functions correctly and passes the testing; otherwise, tester 2602 can conclude that DUT 2514 is defective. Referring again to process 3600 of FIG. 36, the DUTs 2514 that passed the testing at 3606 can be further processed at 3608. For example, if DUTs 2514 are semiconductor dies, the dies can be packaged or otherwise prepared at 3608 for shipping to end users of the dies at 3610.

Figure 37:
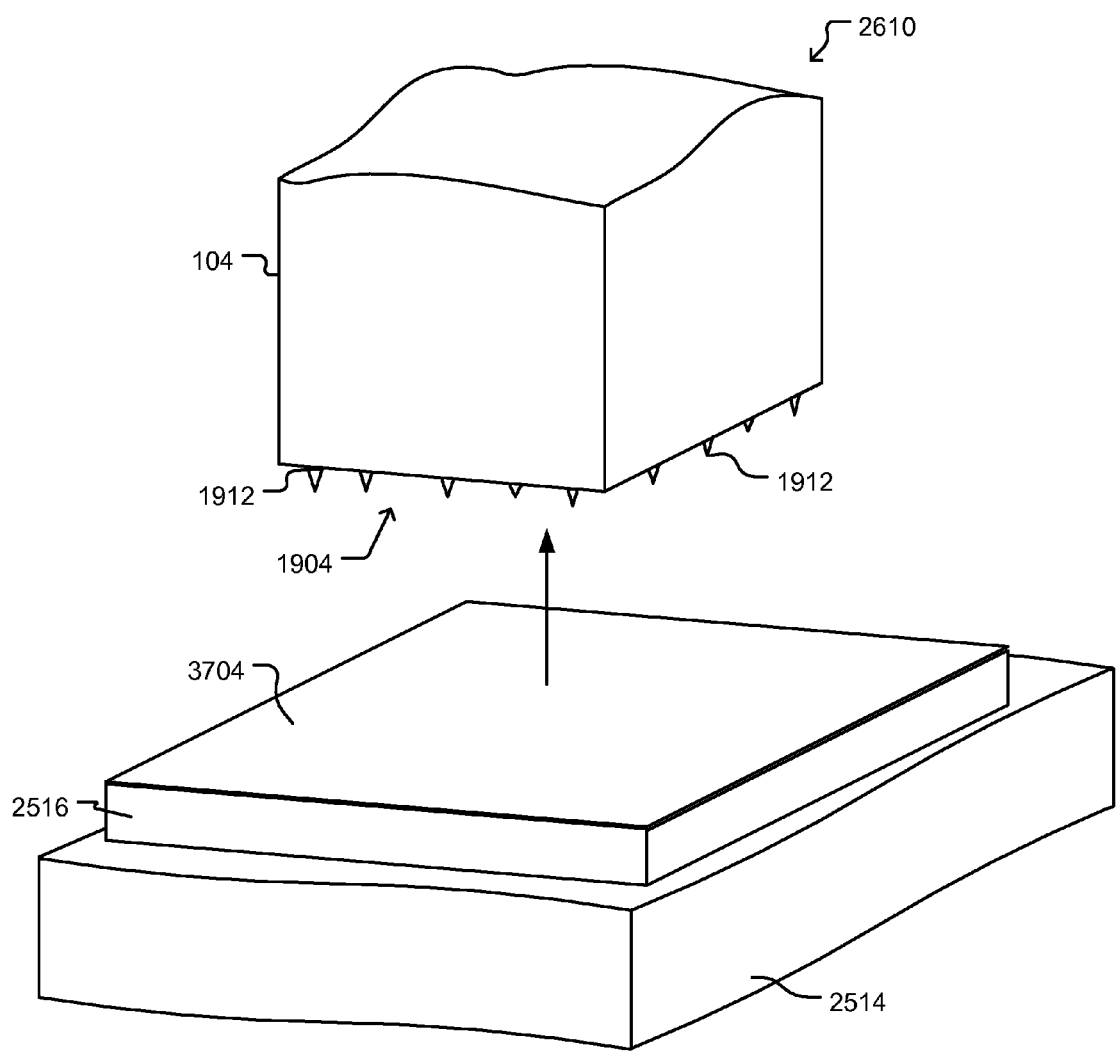
FIGS. 37 and 38 illustrate exemplary contact of a probe of the contactor with a terminal of an electronic device of FIG. 26 and a probe mark in the form of puncture marks made on the terminal by a probe treated as shown in FIG. 20 to have protruding structures at a contact end of the probe according to some embodiments of the invention.
Figure 38:
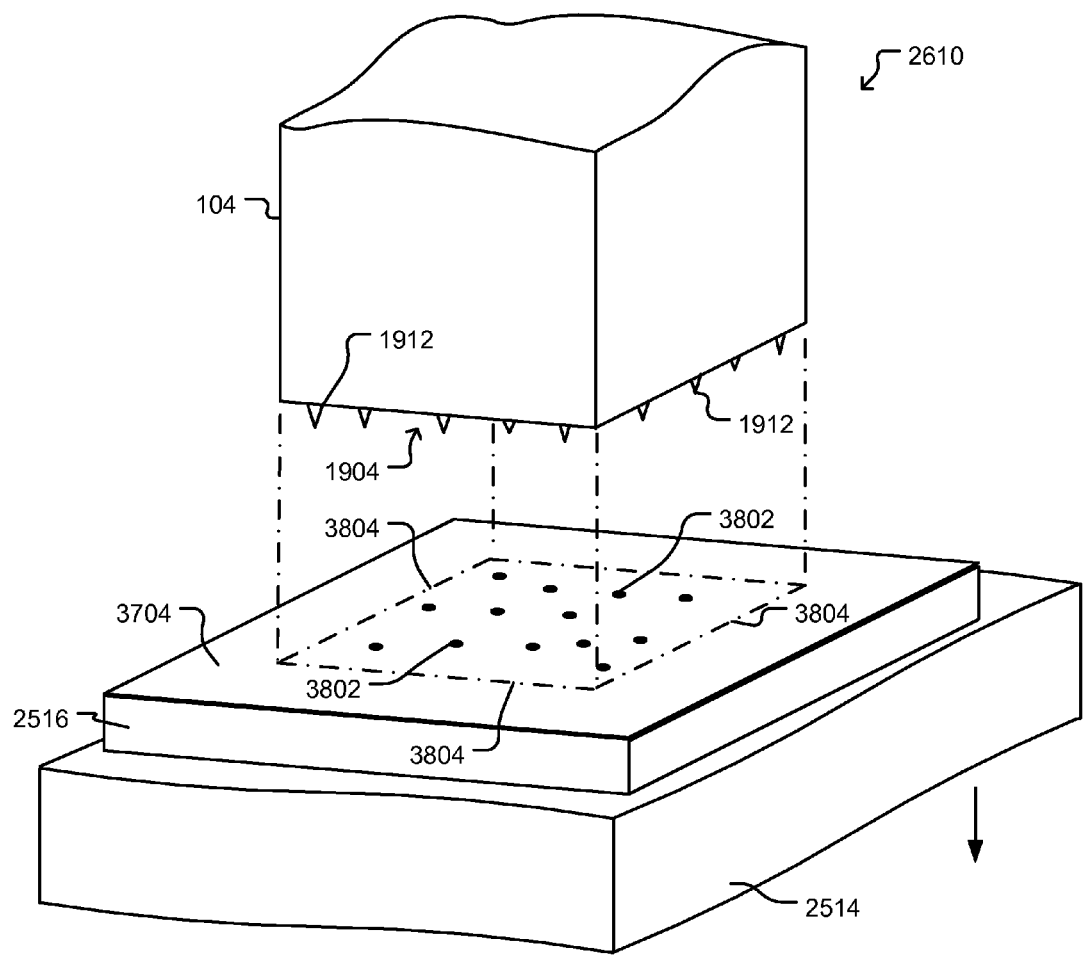

The contact between probes 2610 and terminals 2616 at 3604 can result in probe marks (sometimes referred to as "scrub marks") on terminals 2616. (Probe marks can also be referred to as contact marks.) Because probes 2610 comprise columns 104 of carbon nanotubes, probe marks left on DUT terminals 2516 by probes 2610 (see FIG. 26) can be unique and at least visibly distinct from scrub marks made by needle probes, cantilever type probes, or other types of probes. For example, FIG. 37 shows a partial view of a terminal 2516 of DUT 2514 being brought into contact with a probe 2610 (which is also shown in partial view) comprising a column 104, and FIG. 38 shows terminal 2516 being moved out of contact with probe 2610. As shown in FIG. 38, marks 3802 made on a surface 3704 of terminal 2516 by probe 2610 consist essentially of small punctures made in the surface 3704 by the protruding structures 1912 protruding from the contact end 1904 of probe 2610. Moreover, the marks 3802 are located in a limited area (illustrated in FIG. 38 by perimeter 3804) on the surface 3704 of terminal 2516. The limited area 3804 can correspond to the contact area of contact end 1904 of probe 2610. (The portion of contact end 1904 that faces terminal 2516 can be referred to as the face of contact end 1904. Limited area 3804 can correspond to an area of the face of contact end 1904.) For example, limited area 3804 can be seventy (or less) microns by seventy (or less) microns (which can correspond to an area of 4900 square microns), which as stated above, can be, in some embodiments, the approximate dimensions of the contact area of contact end 1904. Depending on the size of structures 1912, if present, the size of each puncture mark 3802 can typically be less than 25 square microns on the surface 3704 of terminal 2516 and typically penetrates less than 5 microns into terminal 2516 from the surface 3704. In various embodiments, each puncture mark 3802 can typically be less than 20, 15, or 10 square microns on the surface 3704 of terminal 2516 and typically penetrates less than 4, 3, or 2 microns into terminal 2516 from surface 3704. Depending on size and number of structures 1912 at the contact end 904 of each column 104, the total area on the surface 3704 of a terminal 2516 disturbed by puncture marks 3802 can be less than 30% of the total area of the surface 3704 of the terminal 3516. In various embodiments, the total area on the surface 3704 of a terminal 2516 disturbed by puncture marks 3802 can be less than 25%, 20%, 15%, 10%, or 5% of the total area of the surface 3704 of the terminal 3516. Moreover, in some embodiments, the percentage of the limited area bounded by perimeter 3804 disturbed (or occupied) by marks 3802 can be less than or equal to 40%, 30%, 20%, or 15%. In some embodiments, the percentage of the limited area bounded by perimeter 3804 disturbed (or occupied) by marks 3802 can be 40% or more or 15% or less.

Figure 39:
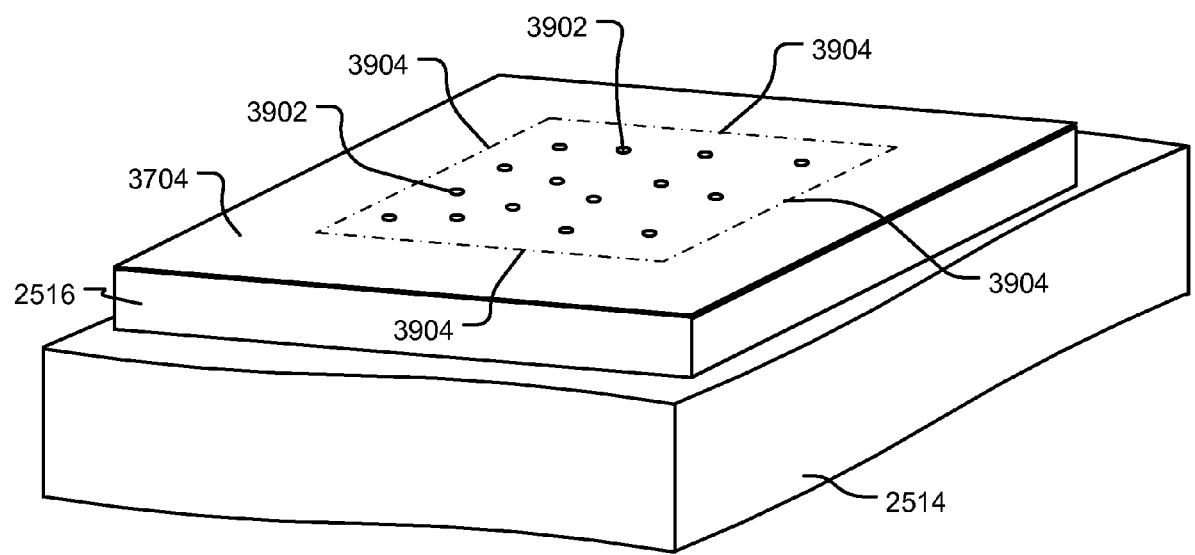
FIG. 39 illustrates an exemplary probe mark in the form of puncture marks left on the terminal by a probe like the probe of FIG. 23A according to some embodiments of the invention.

As mentioned, the columns 104 that compose probes 2610 need not have been treated (e.g., as shown in FIG. 20) to produce structures 1912. As shown in FIG. 39, indentations 3902 (e.g., spot depressions) made on a surface 3704 of terminal 2516 by probes 2610 comprising contact ends 1904 that were not treated to create protruding structures 1912 can consist essentially of indentations 3902 in the surface 3704. A contact end 1904 of a column 104 not treated to produce structures 1912—and thus lacking pointed or protruding-like protruding structures—can be, at least at a microscopic level, uneven. There can thus be slight protruding areas at the contact end 1904 comprising, for example, a cluster of ends of carbon nanotubes that protrude slightly from other ends of carbon nanotubes that form the contact end 1904. The foregoing can cause indentations 3902 in surface 3704 of terminal 2516. Indentations 3902 can be located in a limited area (illustrated in FIG. 39 by the area bounded by perimeter 3904) on the surface 3704 of terminal 2516. The limited area 3904 can correspond to the contact area (e.g., the contact face) of contact end 1904 of probe 2610. (The portion of contact end 1904 that faces terminal 2516 can be referred to as the face of contact end 1904. Limited area 3904 can correspond to an area of the face of contact end 1904.) For example, limited area 3904 can be seventy (or less) microns by seventy (or less) microns (which can correspond to an area of 4900 square microns), which as stated above, can be, in some embodiments, the approximate dimensions of the contact area of contact end 1904. The size of each indentation 3902 can typically be less than about 5 microns across the indentation 3902 on the surface 3704 of terminal 2516, and indentations 3902 typically penetrate less than 5 microns into terminal 2516 from the surface 3704. In various embodiments, each indentation 3902 can typically be less than 4, 3, or 2 microns across the indentation and can typically penetrate less than 4, 3, or 2 microns into terminal 2516 from surface 3704. In some embodiments, the total area on the surface 3704 of a terminal 2516 disturbed (or occupied) by indentations 3902 can be less than 30% of the total area of the surface 3704 of the terminal 3516. In various embodiments, the total area on the surface 3704 of a terminal 2516 disturbed by indentations 3902 can be less than 25%, 20%, 15%, 10%, or 5% of the total area of the surface 3704 of the terminal 3516. Moreover, in some embodiments, the percentage of the limited area bounded by perimeter 3904 disturbed (or occupied) by indentations 3902 can be less than or equal to 40%, 30%, 20%, or 15%. In some embodiments, the percentage of the limited area bounded by perimeter 3904 disturbed (or occupied) by indentations 3902 can be 40% or more or 15% or less.

Figure 40:
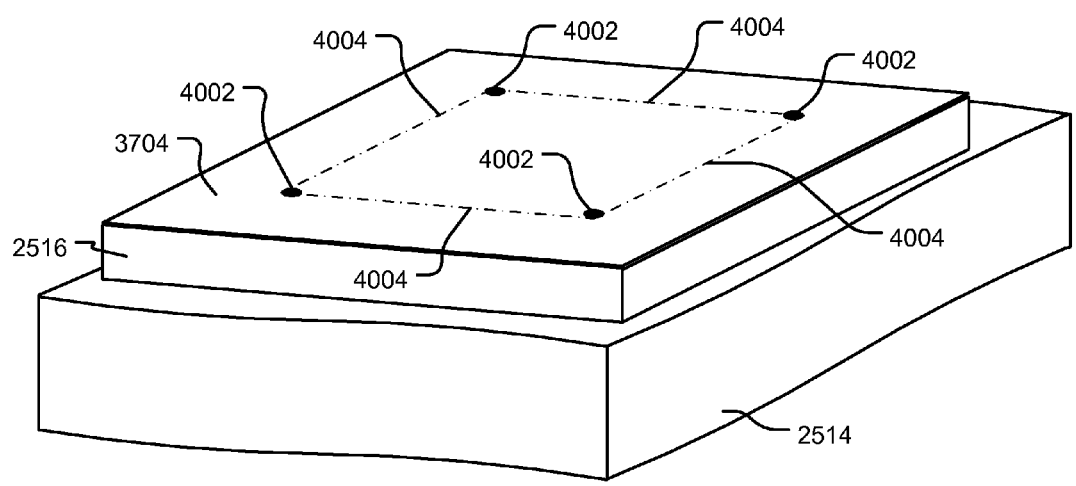
FIG. 40 illustrates an exemplary probe mark in the form of carbon nanotube imprints on the terminal by a probe that generally lacks the protruding structures illustrated in FIG. 20 at a contact end of the probe according to some embodiments of the invention.

As mentioned above, probe 2610 can alternatively comprise column 2304, which as shown in FIG. 23A can comprise peak structures 2312. For example, peak structures 2312 can be located at corners of contact end 2302 of column 2304. FIG. 40 illustrates surface 3704 of DUT terminal 2516 after a probe comprising a column 2304 and terminal 2516 are brought into contact (e.g., as at 3604 in FIG. 36). As shown in FIG. 40, marks 4002 made on a surface 3704 of terminal 2516 by a probe 2610 comprising column 2304 can consist essentially of small punctures made by peak structures 2312. As mentioned, peak structures 2312 can be located at corners of contact end 2302 of column 2304, and marks 4002 made by the peak structures 2312 can be located in corners of an area (illustrated in FIG. 40 by perimeter 4004). The limited area 4004 can correspond to the contact area of contact end 2302 of column 2304. (See FIG. 23A.) (The portion of contact end 1904 that faces terminal 2516 can be referred to as the face of contact end 1904. Limited area 4004 can correspond to an area of the face of contact end 1904.) For example, limited area 4004 can be seventy (or less) microns by seventy (or less) microns (which can correspond to an area of 4900 square microns), which as stated above, can be, in some embodiments, the approximate dimensions of the contact area of contact end 2304. As mentioned, column 2304 can have four peak structures 2312 as shown in FIG. 23A, or column 2304 can have more or fewer than four peak structures 2312. The surface 3704 of terminal 2516 shown in FIG. 40 can therefore have more or fewer marks 4002. Depending on the size of peak structures 2312, the size of each puncture mark 4002 can typically be less than 20 square microns on the surface 3704 of terminal 2516 and typically penetrates less than 5 microns into terminal 2516 from the surface 3704. In various embodiments, each puncture mark 4002 can typically be less than 15 square microns, 10 square microns, or 5 square microns on the surface 3704 of terminal 2516 and typically penetrates less than 4, 3, or 2 microns into terminal 2516 from surface 3704. Depending on size and number of peak structures 2312 at the contact end 2302 of each column 2304, the total area on the surface 3704 of a terminal 2516 disturbed by puncture marks 4002 can be less than 15% of the total area of the surface 3704 of the terminal 3516. In various embodiments, the total area on the surface 3704 of a terminal 2516 disturbed by puncture marks 4002 can be less than 10%, 5%, or 3% of the total area of the surface 3704 of the terminal 3516. Moreover, in some embodiments, the percentage of the limited area bounded by perimeter 4004 disturbed (or occupied) by marks 4002 can be less than or equal to 40%, 30%, 20%, or 15%. In some embodiments, the percentage of the limited area bounded by perimeter 4004 disturbed (or occupied) by marks 4002 can be 40% or more or 15% or less.

Figure 41A:
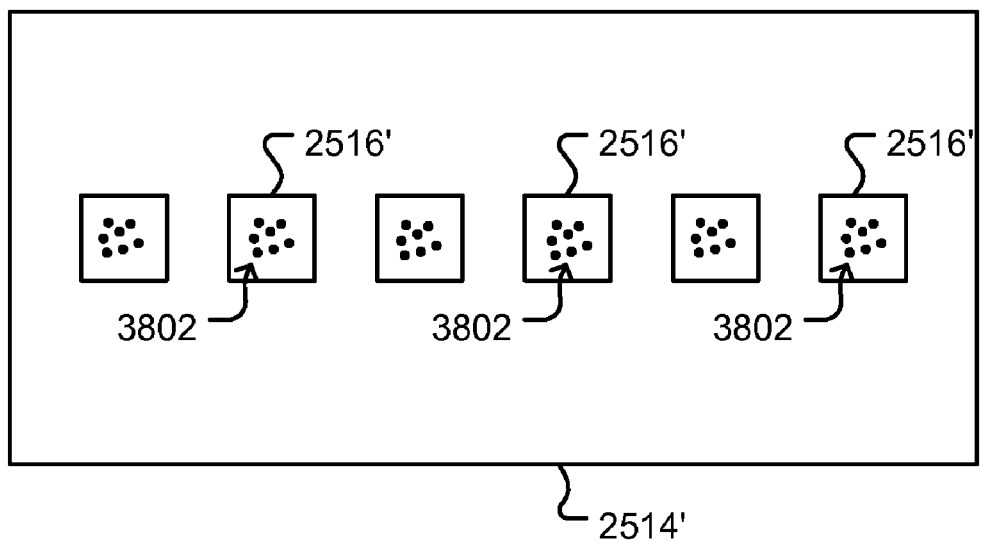
FIGS. 41A, 41B, and 41C illustrate exemplary semiconductor dies with probe marks on the terminals of the dies like probe marks shown in FIGS. 38-40.

FIG. 41A illustrates an exemplary semiconductor die 2514', which can be a non-limiting example of DUT 2514. As shown, die 2514' can have a plurality of terminals 2516', which can be, for example, bond pads. FIG. 41A illustrates terminals 2516' after terminals 2516' have been contacted by probes 2610 configured as in FIGS. 37 and 38 (i.e., probes 2610 comprise columns 104 treated to produce structures 1912 at a contact end 1904 of the columns 104 (see FIG. 20)) and tested as illustrated in process 3600 of FIG. 36. As shown in FIG. 41A, probe marks on terminals 2516' of die 2514' can consist essentially of (i.e., be generally limited to) puncture marks 3802 located within a perimeter 3904 that corresponds to a contact end 1904 of a probe 2610 as shown in FIG. 38. As discussed above with respect to FIG. 38, the puncture marks 3802 can be made by structures 1912 protruding from the contact ends 1904 of probes 2610. The puncture marks 3802 on terminals 2514' can be as described above with respect to FIG. 38.

Figure 41B:
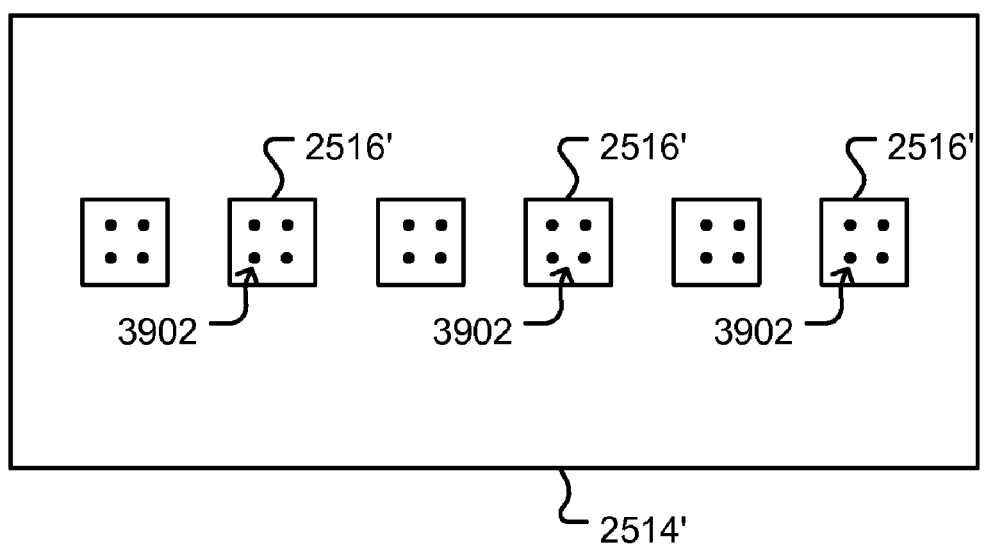

FIG. 41B illustrates die 2514' with terminals 2514' after terminals 2514' have been contacted by probes 2610 configured as discussed above with respect to FIG. 39 (i.e., probes 2610 comprise columns 104 whose contact ends 1904 were not treated to produce structures 1912 at a contact end 1904 of the columns 104 (see FIG. 20)) and tested as illustrated in process 3600 of FIG. 36. As shown in FIG. 41B, indentations 3902 on terminals 2516' of die 2514' can consist essentially of (i.e., be generally limited to) indentations 3902 located within a perimeter 3804 that corresponds to a contact end 1904 of a probe 2610 as shown in FIG. 39. As discussed above with respect to FIG. 39, the indentations 3902 can be made by ends of carbon nanotubes that compose the columns 104 that compose the probes 2610. The indentations 3902 on terminals 2514' can be as described above with respect to FIG. 39.

Figure 41C:
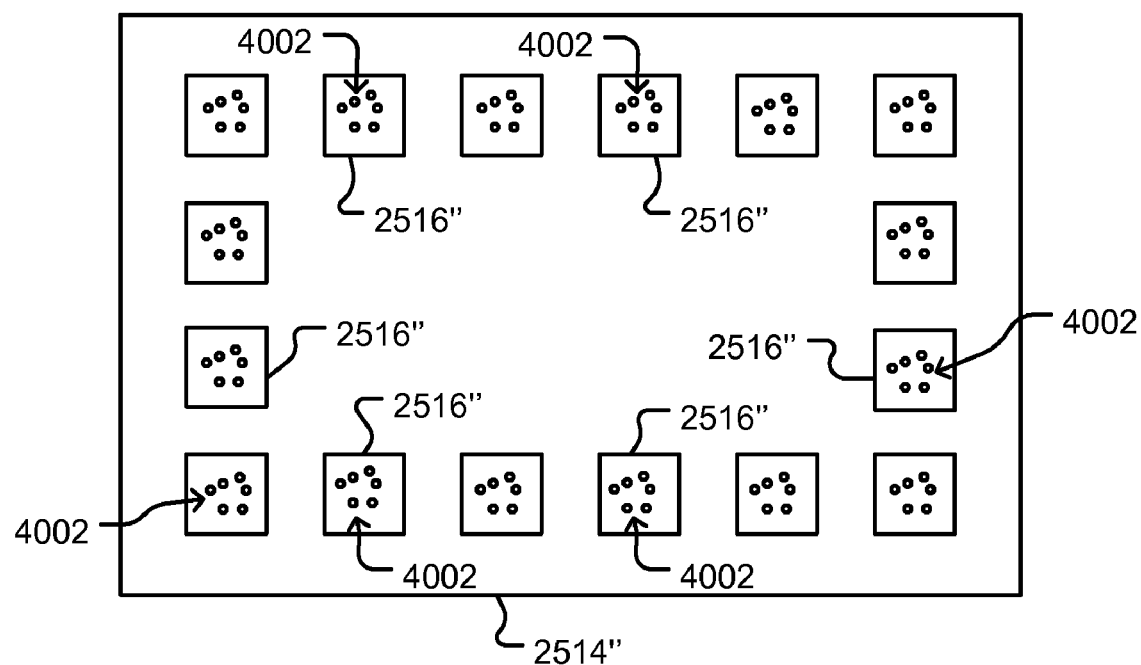

FIG. 41C illustrates another exemplary semiconductor die 2514", which can be another non-limiting example of DUT 2514. Like die 2514', die 2514" can have a plurality of terminals 2516", which can be, for example, bond pads. In this example, probes 2610 of contactor 2606 (see FIGS. 26 and 35) or probe card assembly 3400 in FIG. 34 can comprise columns 2304 in FIG. 23A. As shown, after die 2514" has been contacted by probes 2610 comprising columns 2304 and tested as illustrated in process 3600 of FIG. 36, probes marks on terminals 2516" of die 2514" can consist essentially of (i.e., be generally limited to) puncture marks 4002 located within along a perimeter 4004 that corresponds to a contact end 2302 of a probe 2610 (comprising a column 2304 as shown in FIG. 23A) as shown in FIG. 40.

The semiconductor dies 2514' and 2514" in FIGS. 40A-41C are exemplary only, and many variations are possible. For example, the number and layout of terminals 2516', 2516" on each die 2514', 2514" are exemplary only. Die 2516' can have a different number of terminals 2516', which can be laid out in a different pattern than shown in FIG. 40. Likewise, die 2516" can have a different number of terminals 2516", which can be laid out in a different pattern than shown in FIG. 41.

Figure 42:
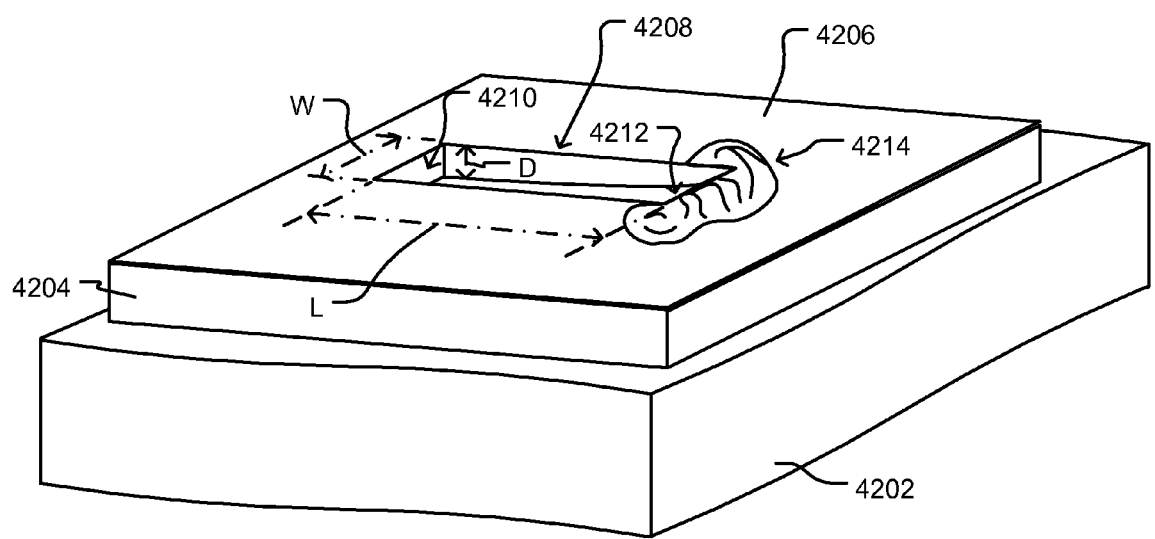
FIG. 42 illustrates an exemplary prior art probe mark made by a prior art probe that wipes across a terminal of a die.

FIG. 42 illustrates a typical probe mark 4208 made by a typical prior art probe (not shown) configured to contact a terminal 4204 of a die 4202 and then wipe across the terminal 4204. As shown, probe mark 4208 typically consists of a gauge or trench in the surface 4206 of the terminals 4204. The probe mark 4208 typically extends from a heel portion 4210 corresponds to initial contact with the prior art probe (not shown) to a toe portion 4212, which typically corresponds to the end of the prior art probe's (not shown) wiping motion across the terminal 4204. The probe mark 4208 is thus created as the prior art probe (not shown) contacts the heal portion 4210 and then wipes across the terminal 4204 to the toe portion 4212. As shown in FIG. 42, dimensions of the probe mark typically are as follows: a width W of the probe mark 2408 can correspond generally to a width of the portion of the prior art probe (not shown) that contacts terminal 4204; a length L of the probe mark 2408 can correspond generally to a length of the wiping motion of the prior art probe (not shown) across the terminal 4204; and a depth D of the probe mark 2408 from the surface 4206 into terminal 4204 can correspond generally to an over travel distance, which can be the distance the prior art probe (not shown) and/or terminal 4204 is moved toward the other after initial contact between the prior art probe (not shown) and terminals 4204. Some typical examples of W, D, and L include W of 20 microns, L of 20 microns, and D of 10 microns.

In addition, as shown in FIG. 42, a debris pile 4214 typically forms at the toe portion 4212 of the probe mark 4208. The debris pile 4214 can comprise, among other things, material of the terminal 4202 and/or material (e.g., an oxide film) on the surface 4206 of the terminal 4202 that is dug out terminal 4202 and/or scrapped off of the surface 4206 of terminal 4202 as the prior art probe (not shown) wipes from the heel portion 4210 of the probe mark 4208 to the toe portion 4212.

Although the invention is not so limited, the exemplary probe marks consisting essentially of puncture marks 3802 shown in FIG. 38, indentations 3902 in FIG. 39, or puncture marks 4002 shown in FIG. 40 can be more advantageous than the prior art probe mark shown in FIG. 42. This is because probe marks on a terminal (e.g., a bond pad) of a semiconductor die can cause several problems. First, probe marks can prevent a wire from being bonded to a terminal. (The terminals of a semiconductor device are often connected to conductors of a protective package by wires.) Second, even if a wire is successfully bonded to a terminal with a probe mark, the probe mark can decrease the effective life of the bond between the wire and the terminal. Third, a probe mark can weaken a terminal, causing the terminal to loosen or even detach from the semiconductor device. (See U.S. Pat. No. 5,506,499 to Puar ("Puar"), col. 2, lines 21-40 and col. 3, lines 7-25 for a discussion of the detrimental effects of probe marks.) The foregoing problems can be reduced by reducing the size of the probe marks and/or by reducing the level of discontinuity that the probe marks create with the surface of the terminal. Thus, for example, because puncture marks 3802 in surface 3704 of terminal 2516 shown in FIG. 38 are much smaller than the prior art probe mark 4208 shown in FIG. 42, puncture marks 3802 are less likely than the prior art probe mark 4208 to cause any of the problems discussed above with respect to probe marks. In addition, because discontinuities created by puncture marks 3802 on surface 3704 of terminal 2516 shown in FIG. 38 are much less than discontinuities created by probe mark 4208 and debris pile 4214 on the surface 4206 of terminal 4202 in FIG. 42, puncture marks 3802 are less likely than the prior art probe mark 4208 and debris pile 4214 to cause any of the problems discussed above with respect to probe marks. The indentations 3902 in FIG. 39 and the puncture marks 4002 shown in FIG. 40 likewise are much smaller and create less discontinuities on surface 3704 of terminal 2516 than the prior art probe mark 4208 and debris pile 4214 and therefore are less likely to cause any of the problems discussed above with respect to probe marks.

As should be apparent, probe mark 4208 is much larger than any one of the puncture marks 3802 in FIG. 38, the indentations 3902 in FIG. 39, or any one of the individual puncture marks 4002 in FIG. 40. Moreover, probe mark 4208 and debris pile 4214 disturb a larger percentage of the surface 4206 of terminal 4204 than puncture marks 3802 in FIG. 38 disturb of the surface 3704 of terminal 2516', the indentations 3902 in FIG. 39 disturb of the surface 3704 of terminal 2516', or puncture marks 4002 in FIG. 40 disturb of the surface 3704 of terminal 2516".

Figure 43A:
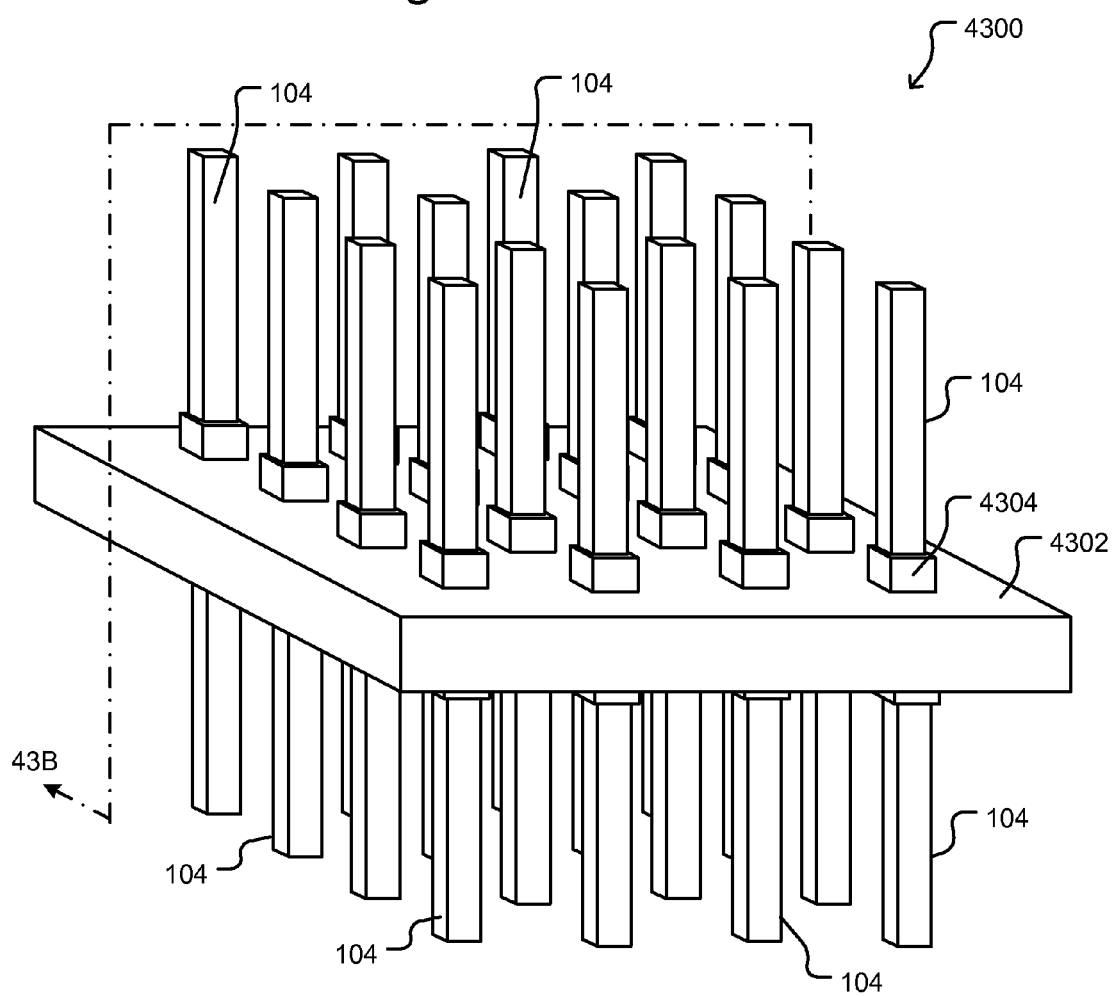

A contactor like contactor 2606 of FIG. 26 and a probe card assembly like probe card assembly 3400 of FIG. 34 are not the only applications for columns 104 of carbon nanotubes. FIGS. 43A and 43B (which show respectively a perspective view and a cross-sectional side view) illustrate another exemplary application in which columns 104 can comprise spring contact structures (e.g., interconnect structures) of an interposer 4300. Interposer 4300 can comprise a wiring substrate 4302 (e.g., a printed circuit board, a ceramic substrate, or other wiring substrate) to which columns 104 are attached. As shown, columns 104 (which can be non-limiting examples of first spring contact structures and second spring contact structures) can be attached to opposing sides (which can be examples of a first surface and a second surface) of the wiring substrate 4302. For example, as shown in FIG. 43B, some of columns 104 can be attached to terminals 4306 on one side of wiring substrate 4302, and others of columns 104 can be attached to terminals 4306 on an opposite side of wiring substrate. Wiring 4308 (e.g., traces and/or vias in or on wiring substrate 4302) can electrically connect terminals on the one side of wiring substrate 4302 with terminals 4306 on the opposite side of the wiring substrate 4302 and thereby also electrically connect columns 104 on the one side of wiring substrate 4302 with columns 104 on the opposite side of wiring substrate 4302. Wiring 4308 can be non-limiting examples of electrical connections.

Columns 104 can be grown using any technique or process described or mentioned herein. Moreover, columns 104 can be grown on a sacrificial substrate (e.g., substrate 202), for example, as shown in FIGS. 2-7 and 12-14, and transferred to wiring substrate 4302 (e.g., using any of the techniques illustrated in 8-11B or 12-14). Alternatively, columns 104 can be grown on terminals 4306 of wiring substrate 4302 using any applicable technique or process described or mentioned herein. For example, columns 104 can be grown on terminals 4306 in the same manner as columns 1604 are grown on terminals 1504 in FIGS. 15A-16B. As yet another alternative, columns 104 can be grown in pits (not shown) in wiring substrate 4302 in the same way that columns 1804 are grown in pits 1705 in FIGS. 17A-18B. Moreover, columns 104 can be treated using any one or more of the treatments illustrated in FIGS. 19-22B or otherwise described or mentioned herein, and columns 104 can be anchored to terminals 4306 and/or wiring substrate 4302 by anchoring structures 4304, which can be like anchoring structures 1606 in FIGS. 16A and 16B or anchoring structures 1806 in FIGS. 18A and 18B or using any anchoring technique described or mentioned herein. In some embodiments, columns 104 can be like columns 2204 or 2304.

Figure 44:
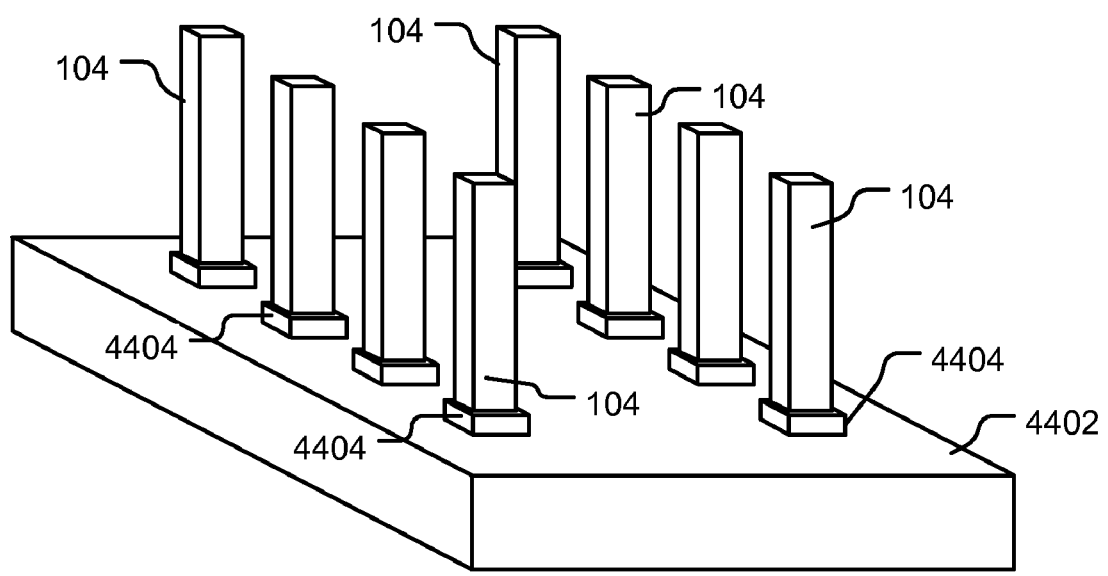
FIG. 44 illustrates an exemplary semiconductor die that includes spring contact structures that can comprise columns of carbon nanotubes according to some embodiments of the invention.

FIG. 44 illustrates another exemplary application in which columns 104 can comprise spring contact structures (e.g., interconnect structures) attached to terminals (e.g., bond pads) 4404 of a semiconductor die 4402, which can be a non-limiting example of a wiring substrate. Die 4402 can be any type of semiconductor die. For example, die 4402 can comprise memory or data storage circuitry, digital logic circuitry, processor circuitry, etc. As is known, terminals 4404 can be electrically connected to the circuitry integrated into die 4402 and can thus provide input and output for signals, power, and ground.

Columns 104 can be grown using any technique or process described or mentioned herein. Moreover, columns 104 can be grown on a sacrificial substrate (e.g., substrate 202), for example, as shown in FIGS. 2-7 and 12-14, and transferred to die 4402 (e.g., using any of the techniques illustrated in 8-11B or 12-14). Alternatively, columns 104 can be grown on terminals 4404 of die 4402 using any applicable technique or process described or mentioned herein. For example, columns 104 can be grown on terminals 4404 in the same manner as columns 1604 are grown on terminals 1504 in FIGS. 15A-16B. As yet another alternative, columns 104 can be grown in pits (not shown) in die 4402 in the same way that columns 1804 are grown in pits 1705 in FIGS. 17A-18B. Moreover, columns 104 can be treated using any one or more of the treatments illustrated in FIGS. 19-22B or otherwise described or mentioned herein, and columns 104 can be anchored to terminals 4404 and/or die 4402 by anchoring structures (not shown) which can be like anchoring structures 1606 in FIGS. 16A and 16B or anchoring structures 1806 in FIGS. 18A and 18B or using any anchoring technique described or mentioned herein. In some embodiments, columns 104 can be like columns 2204 or 2304.

Die 4404 can be a singulated die (i.e., singulated from the silicon wafer on which die 4404 was made), and die 4404 can be packaged or unpackaged. Alternatively, die 4404 can be unsingulated from the wafer on which it was made. For example, columns 104 can be attached to die 4402 while die 4402 is still part of the wafer on which die 4402 was made. In some embodiments, columns 104 can be attached to some or all of the dies (e.g., like die 4402) on a silicon wafer before the dies are singulated from the wafer. As mentioned above, such dies (before or after being singulated from the wafer) can be tested in a test system like test system 2600 of FIG. 26 and in accordance with a test process like process 3600 of FIG. 36. As discussed above, in such as a case, columns 104 can be attached to terminals 2616 of DUT 2614 and probes 2610 on contactor 2606 can be replaced with flat terminals configured to contact the columns 104 extending from terminals 2616 of DUT 2614. If probe card assembly 3400 is used as contactor 2606, probes 2610 can likewise be replaced with flat terminals.

Columns 104 (and thus columns 504, 704, 1404, 1604, 1804, 2204, 2304, and 2304') as well as probes 2610 can be non-limiting examples of spring contact structures, probes, spring probes, first spring contact structures, second spring contact structures, or test probes.

Although specific embodiments and applications of the invention have been described in this specification, there is no intention that the invention be limited these exemplary embodiments and applications or to the manner in which the exemplary embodiments and applications operate or are described herein. For example, although embodiments are illustrated herein in which columns 104 are attached to and/or electrically connected to terminals of a wiring substrate, columns 104 can be attached to other electrical elements on or in a wiring substrate. In fact, a terminal can be a non-limiting example of an electrical element. As another example, columns 104 (and thus columns 504, 704, 1404, 1604, 1804, 2204, 2304, and 2304') as well as probes 2610 can be non-limiting examples of spring contact structures, probes, spring probes, first spring contact structures, second spring contact structures, or test probes.

We claim:

1. A probe card assembly comprising:
   an electrical interface to a plurality of communications channels to a tester configured to control testing of electronic devices; and
   a plurality of electrically conductive spring probes electrically connected to the electrical interface and comprising contact ends disposed in a pattern that corresponds to a pattern of terminals of the electronic devices, each of the probes comprising a column of vertically aligned carbon nanotubes, the column comprising a spring mechanism that comprises distinct reversibly deformable regions,
   wherein the deformable regions each compress elastically and in a direction that is substantially parallel to a length of the column in response to a force applied in a direction that is substantially parallel to the length of the column to the contact end of the probe by contact with one of the electronic devices,
   wherein each of the probes is mechanically tuned such that the spring mechanism of the probe has a predetermined spring property, and
   wherein the predetermined spring property comprises a series sum of a spring property of each of the reversibly deformable regions.

2. The probe card assembly of claim 1, wherein each of the probes comprises electrically conductive material disposed on or between ones of the carbon nanotubes that compose the probe.

3. The probe card assembly of claim 2, wherein each of the probes comprises a plurality of structures protruding from the contact end of the probe.

4. The probe card assembly of claim 1, wherein the contact end of each of the probes comprises a plurality of structures protruding from the contact end.

5. The probe card assembly of claim 4, each of ones of the structures at the contact end of each of the probes comprises a plurality of end portions of ones of the carbon nanotubes that compose the probe.

6. The probe card assembly of claim 1 further comprising a wiring substrate, a base end of each of the probes adhered to the wiring substrate by an adhesive, each of the probes comprising a portion of the adhesive wicked into the probe between ones of the carbon nanotubes that compose the probe.

7. The probe card assembly of claim 6, wherein the adhesive is disposed within each of the probes along a length of at least half of the probe from the base end of the probe.

8. The probe card assembly of claim 1, wherein the deformable regions are generally perpendicular to the length of the column.

9. A probe card assembly comprising:
an electrical interface to a plurality of communications channels to a tester configured to control testing of electronic devices;
a plurality of electrically conductive spring probes electrically connected to the electrical interface and comprising contact ends disposed in a pattern that corresponds to a pattern of terminals of the electronic devices, each of the probes comprising a plurality of vertically aligned carbon nanotubes, each of the probes comprising a spring mechanism whereby the probe deforms, in response to a force applied to the contact end of the probe by contact with the electronic devices, elastically and in a direction that is generally parallel with a direction of the force, wherein each of the probes comprises electrically conductive material disposed on or between ones of the carbon nanotubes that compose the probe, and each of the probes further comprises a plurality of structures protruding from the contact end of the probe;
a wiring substrate to which the probes are attached; and
material disposed around a portion of the probes, wherein the material anchors the probes to the wiring substrate.

10. A probe card assembly comprising:
an electrical interface to a plurality of communications channels to a tester configured to control testing of electronic devices;
a plurality of electrically conductive spring probes electrically connected to the electrical interface and comprising contact ends disposed in a pattern that corresponds to a pattern of terminals of the electronic devices, each of the probes comprising a plurality of vertically aligned carbon nanotubes, each of the probes comprising a spring mechanism whereby the probe deforms, in response to a force applied to the contact end of the probe by contact with the electronic devices, elastically and in a direction that is generally parallel with a direction of the force;
a wiring substrate to which the probes are attached; and
material disposed around a portion of the probes, wherein the material anchors the probes to the wiring substrate.

11. The probe card assembly of claim 10, wherein the material electrically connects ones of the probes to ones of electrical terminals on the wiring substrate.

12. The probe card assembly of claim 11, wherein the probes are disposed on the electrical terminals.

13. The probe card assembly of claim 11, wherein the probes are disposed in pits etched in the wiring substrate and the electrical terminals are spaced apart from the probes.

14. A probe card assembly comprising:
an electrical interface to a plurality of communications channels to a tester configured to control testing of electronic devices; and
a plurality of electrically conductive spring probes electrically connected to the electrical interface and comprising contact ends disposed in a pattern that corresponds to a pattern of terminals of the electronic devices, each of the probes comprising a plurality of vertically aligned carbon nanotubes, each of the probes comprising a spring mechanism whereby the probe deforms, in response to a force applied to the contact end of the probe by contact with the electronic devices, elastically and in a direction that is generally parallel with a direction of the force,
wherein each of the probes is mechanically tuned to have a predetermined spring property, and
wherein the spring mechanism of each of the probes comprises a plurality of reversibly deformable regions disposed along a length of the probe, the predetermined spring property of the probe comprising a series sum of a spring property of each of the reversibly deformable regions.

15. A probe card assembly comprising:
an electrical interface to a plurality of communications channels to a tester configured to control testing of electronic devices; and
a plurality of electrically conductive spring probes electrically connected to the electrical interface and comprising contact ends disposed in a pattern that corresponds to a pattern of terminals of the electronic devices, each of the probes comprising a plurality of vertically aligned carbon nanotubes, each of the probes comprising a spring mechanism whereby the probe deforms, in response to a force applied to the contact end of the probe by contact with the electronic devices, elastically and in a direction that is generally parallel with a direction of the force,
wherein each of the probes is mechanically tuned to have a predetermined spring constant, and
wherein the spring mechanism of each of the probes comprises a plurality of reversibly deformable regions disposed along a length of the probe, the predetermined spring constant of the probe comprising a series sum of a spring constant of each of the reversibly deformable regions.

* * * * *